United States Patent [19]
Muragishi

[11] Patent Number: 5,436,184
[45] Date of Patent: Jul. 25, 1995

[54] THIN FILM TRANSISTOR AND MANUFACTURING METHOD THEREOF

[75] Inventor: Takeo Muragishi, Hyogo, Japan

[73] Assignee: Mitsubishi Denki Kabushiki Kaisha, Tokyo, Japan

[21] Appl. No.: 155,608

[22] Filed: Nov. 22, 1993

Related U.S. Application Data

[62] Division of Ser. No. 942,492, Sep. 9, 1992, Pat. No. 5,281,828.

[30] Foreign Application Priority Data

Sep. 20, 1991 [JP] Japan .................................. 3-242087
Jan. 29, 1992 [JP] Japan .................................. 4-14007

[51] Int. Cl.⁶ .......................................... H01L 21/265
[52] U.S. Cl. ........................................ 437/40; 437/41; 437/44; 437/45
[58] Field of Search .............. 437/40, 21, 44, 45, 437/974, 968, 915, 913, 29, 41, 42, 43

[56] References Cited

U.S. PATENT DOCUMENTS

| | | |
|---|---|---|
| 4,404,578 | 9/1983 | Takafuji et al. . |
| 4,479,297 | 10/1984 | Mizutani et al. .................. 437/21 |
| 4,582,395 | 4/1986 | Morozumi . |
| 4,619,034 | 10/1986 | Janning ............................... 437/21 |
| 4,633,284 | 12/1986 | Hansell et al. . |
| 5,116,771 | 5/1992 | Karulkar ............................. 437/40 |
| 5,153,142 | 10/1992 | Hsieh ................................... 437/21 |
| 5,162,892 | 11/1992 | Hayashi et al. . |
| 5,172,200 | 12/1992 | Muragishi et al. ................ 257/315 |
| 5,177,578 | 1/1993 | Kakinoki et al. .................. 257/64 |
| 5,294,555 | 3/1994 | Mano et al. ......................... 437/21 |
| 5,313,075 | 5/1994 | Zhang et al. ....................... 257/57 |

FOREIGN PATENT DOCUMENTS

| | | |
|---|---|---|
| 61-1900 | 1/1986 | Japan . |
| 61-100967 | 5/1986 | Japan .................................. 257/66 |
| 62-98669 | 5/1987 | Japan . |
| 2072146 | 10/1989 | Japan .................................. 257/66 |
| 1-295464 | 11/1989 | Japan . |
| 2-5572 | 1/1990 | Japan .................................. 257/66 |
| 2-27769 | 1/1990 | Japan . |
| 2-56966 | 2/1990 | Japan . |
| 2-77246 | 11/1990 | Japan ................................ 437/915 |
| 443549 | 6/1991 | Japan ................................ 365/165 |
| 3-154383 | 7/1991 | Japan ................................ 257/349 |

OTHER PUBLICATIONS

Denshi Joho Tsushin Gakkai Gijyutsu Kenkyu Hokoku, vol. 89, No. 67, pp. 1-6, 1989 IEEE Electronic Device Letters, vol. EDL-4, No. 8, pp. 272-274, 1983.

*Primary Examiner*—Kevin M. Picardat
*Attorney, Agent, or Firm*—Lowe, Price, LeBlanc & Becker

[57] ABSTRACT

A thin film transistor (TFT) capable of reducing the leakage current on the occasion when the transistor is OFF and lowering the resistance of an interconnection layer connected to source/drain regions and a method of manufacturing the same are disclosed. In the thin film transistor, the length in the channel width direction of a polycrystalline silicon film 15 in junction parts 15c of a pair of source/drain regions 15b and a channel region 15a is smaller than the length in the channel width direction of polycrystalline silicon film 15 in source/drain regions 15b. Accordingly, the leakage current generated in junction parts 15c on the occasion when the TFT is OFF is reduced. In addition, it is unnecessary to reduce the length in the channel width direction of source/drain regions 15b, so that the resistance of an interconnection layer connected to source/drain regions 15b is lowered as compared to the conventional one.

5 Claims, 56 Drawing Sheets

22: L>2␣

FIG. 30(a)
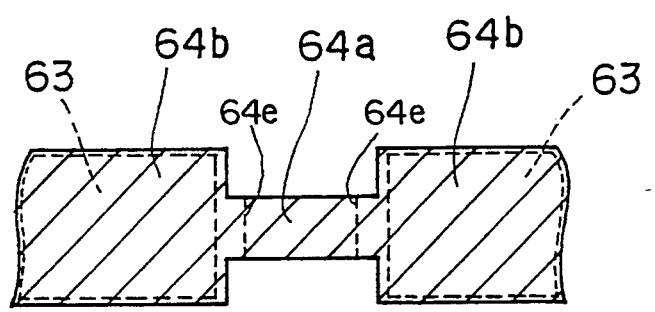
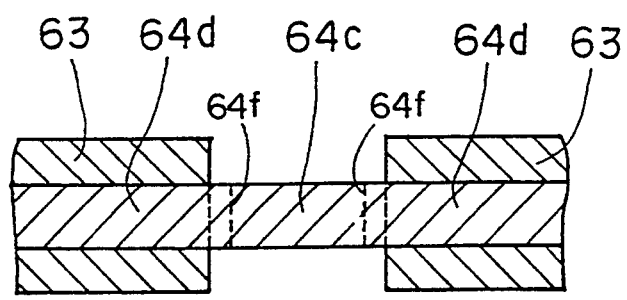
FIG. 30(b)

5,436,184

THIN FILM TRANSISTOR AND MANUFACTURING METHOD THEREOF

This application is a division of application Ser. No. 07/942,492, filed Sep. 9, 1992, now U.S. Pat. No. 5,281,828.

BACKGROUND OF THE INVENTION

1. Field of the Invention

The present invention relates to thin film transistors (TFTs) and manufacturing methods thereof, and, more particularly, to a MOS silicon thin film transistor and a manufacturing method thereof.

2. Description of the Background Art

So far, a static random access memory (hereinafter referred to as a SRAM) is known as a semiconductor memory device. FIG. 59 is a circuit diagram illustrating an example of a memory cell in a conventional SRAM. Referring to FIG. 59, a memory cell 180 includes a CMOS flip-flop connected between a power supply Vcc and ground Vss and NMOS field effect transistors Q5 and Q6 for accessing connected between a bit line 181 and the flip-flop and between a bit line 182 and the flip-flop, respectively.

The flip-flop includes first and second CMOS inverters which are cross-coupled. One of the inverters is implemented with a PMOS thin film transistor Q1 and an NMOS drive field effect transistor Q2, and the other is implemented with a PMOS thin film transistor Q3 and an NMOS drive field effect transistor Q4. Gates of transistors Q5 and Q6 are connected to a word line 183.

FIG. 60 is a plan view of a conventional semiconductor device (SRAM) having a thin film transistor (TFT). FIG. 61 is a sectional view of the semiconductor device illustrated in FIG. 60 taken along line 61—61. The sectional structure of the semiconductor device having a TFT illustrated in FIG. 61 is disclosed, for example, in IEEE Electron Device Letters (Vol. EDL-4, No. 8, P-272–274, 1983) and Denshi Joho Tsushin Gakkai Gijyutsu Kenkyu Hokoku (Vol. 89, No. 67, P-1–6, 1989) and so on.

Referring to FIGS. 60 and 61, a conventional semiconductor device having a TFT includes a silicon substrate 201, a P-well 202 formed on the surface of silicon substrate 201, element isolating regions 204 formed spaced a predetermined distance apart from each other in a predetermined region in P well 202, p-type impurity regions 203 formed beneath element isolating regions 204, respectively, low concentration impurity regions 209a formed spaced a predetermined distance apart from each other between adjacent element isolating regions 203, a high concentration impurity region 207a formed to be continuous with one end of low concentration impurity region 209a, a gate electrode 206a formed on semiconductor substrate 201 between adjacent high concentration impurity regions 207a with a gate oxide film 205a interposed therebetween, and sidewalls 208a formed on both sidewall parts of gate electrode 206a.

The conventional semiconductor device having a TFT further includes an impurity region 210 formed in another region isolated by an element isolating oxide film 204 on the surface of semiconductor substrate 201, an impurity region 218 formed spaced a predetermined distance apart from impurity region 210, high concentration impurity regions 209b formed to be continuous with impurity regions 210, 218, respectively, low concentration impurity regions 207b formed to be continuous with high concentration impurity regions 209b, respectively, a gate electrode 206b formed on semiconductor substrate 201 between impurity region 210 and impurity region 218 with a gate insulating film 205b interposed therebetween, and sidewalls 208b formed on both sidewall parts of gate electrode 206b.

The conventional semiconductor device having a TFT further includes a contact electrode 211 formed to be electrically in contact with impurity region 210, a polycrystalline silicon film 215 (215a, 215b) electrically connected to contact electrode 211 and formed to extend onto an interlayer insulating film 212, a gate electrode 213 formed under a channel region 215 in polycrystalline silicon film 215 with a gate oxide film 214 interposed therebetween, an interlayer insulating film 216 formed to cover the whole surface and having an opening on impurity region 218, a barrier metal layer 219 formed to be electrically connected to impurity region 218 in a contact part 217 and to extend onto interlayer insulating film 216, an aluminum interconnection 220 formed on barrier metal layer 219, and a passivation film (PSG film) 221 formed on aluminum interconnection 220.

An N-type MOS transistor is implemented with a pair of impurity regions 207a (209a), gate oxide film 205a, and gate electrode 206a. In addition, an N-type MOS transistor is implemented with impurity region 210, impurity region 218, gate oxide film 205b, and gate electrode 206b. A TFT transistor is implemented with gate electrode 213, gate oxide film 214, and polycrystalline silicon film 215. Specifically, channel region 215a and a pair of source/drain regions 215b of the TFT transistor are formed in polycrystalline silicon film 215.

FIGS. 62 to 72 are sectional views for describing a manufacturing process (a first step to an eleventh step) of the conventional semiconductor device having a TFT illustrated in FIG. 61. Now, referring to FIGS. 61 to 72, a manufacturing process of the conventional semiconductor device having a TFT will be described.

First, as illustrated in FIG. 63, a P-well 202 is formed on an N-type semiconductor substrate 201 in a state illustrated in FIG. 62. P-type impurity regions 203 and element isolating oxide films 204 are formed in predetermined regions on the surface of P-well 202.

Next, as illustrated in FIG. 64, a polycrystalline silicon film 206 is formed on the whole surface. Resists 222 are formed in predetermined regions on polycrystalline silicon film 206. Then, as illustrated in FIG. 65, polycrystalline silicon film 206 is etched using resist films 222 (See FIG. 64) as a mask to form gate electrodes 206a and 206b. Ion implantation is carried out on semiconductor substrate 201 using gate electrodes 206a, 206b as a mask to form low concentration impurity regions 207a, 207b. Sidewalls 208a, 208b are formed on both sidewall parts of gate electrodes 206a, 206b. Ion implantation is carried out on semiconductor substrate 201 using gate electrodes 206a, 206b and sidewalls 208a, 208b as a mask to form high concentration impurity regions 209a, 209b.

As described above, adjacent two N-type MOS transistors are formed.

Next, as illustrated in FIG. 66, an interlayer oxide film 212a is formed on the whole surface. A contact electrode 211 is formed to be electrically connected to one of high concentration impurity regions 209b through an opening in interlayer oxide film 212a. An impurity region 210 is formed by carrying out heat treatment.

Next, as illustrated in FIG. 67, an interlayer oxide film 212b is formed on the whole surface. A gate electrode 213 of a TFT is formed on interlayer oxide film 212b in a region above gate electrode 206a.

Next, as illustrated in FIG. 68, a gate oxide film 214 of the TFT is formed on the whole surface. A contact part is opened in interlayer insulating film 212b and gate oxide film 214 on contact electrode 211.

Next, as illustrated in FIG. 69, a polycrystalline silicon film 215 is formed to be electrically connected to contact part 211 and to extent onto gate electrode 213 with gate oxide film 214 interposed therebetween. N-type impurities are implanted into polycrystalline silicon film 215.

Next, as illustrated in FIG. 70, a resist 223 is formed on a channel region 215a in polycrystalline silicon film 215 (215a, 215b). P-type impurities (BF$_2$+) are ion-implanted into polycrystalline silicon film 215 (215b) using resist 223 as a mask. Source/drain regions 215b of the TFT are formed by doing this.

Next, as illustrated in FIG. 71, resist 223 (See FIG. 70) is removed, and then an interlayer insulating film 216 is formed on the whole surface. An opening 216a is formed in a region in interlayer insulating film 216 on high concentration impurity region 209b not connected with contact electrode 211. N-type impurities are implanted into the surface of semiconductor substrate 201 exposed in opening 216a. An impurity region 218 is formed by doing this.

Next, as illustrated in FIG. 72, a barrier metal layer 219 is formed in a contact part 217 to be electrically connected to impurity region 218 and to extend onto interlayer insulating film 216. Aluminum interconnection 220 is formed on barrier metal layer 219 using a sputtering process.

Finally, as illustrated in FIG. 61, a passivation film (PSG film) 221 is formed on aluminum interconnection 220.

The conventional semiconductor device having a TFT was completed as described above.

As described above, channel region 215a and source/drain regions 215b of the TFT are formed in polycrystalline silicon film 215 in the conventional semiconductor device having a TFT.

FIG. 73 is an enlarged plan view of the TFT part illustrated in FIG. 61. FIG. 74 is a sectional view of the TFT part illustrated in FIG. 73. Referring to FIGS. 73 and 74, the leakage current is larger on the occasion when it is OFF is larger as the surface area of a junction part 215c of channel region 215a and source/drain region 215b in the channel width direction is larger in the conventional TFT.

Specifically, the junction boundary of junction part 215c has a crystal structure in which a plurality of silicon crystals are combined. If the surface area of the plurality of silicon crystals combined on the junction boundary becomes large, the leakage current is also increased on the occasion when the transistor is OFF.

So far, it is proposed to reduce the thickness of the whole of polycrystalline silicon film 215 (215a, 215b, 215c) as an approach for this.

However, if the thickness of polycrystalline silicon film 215 (215a, 215b, 215c) is reduced, the implantation energy must be made extremely low in order to prevent penetration of impurities when impurities are ion-implanted into source/drain regions 215b. Therefore, there was a problem that uniformity of the implantation amount of ions is degraded. In addition, there was also a problem that a long time is required for the implantation process if implantation is carried out with low energy.

In addition, in a case where source/drain region 215b is extended and used as an interconnection layer, there was disadvantage that the resistance of the interconnection layer is made high by reducing the thickness of polycrystalline silicon film 215 (215a, 215b, 215c). As a result, there was a problem that it is not possible to realize speeding up of the transistor.

Specifically, so far, there were problems that a long time is required when impurities are introduced into source/drain regions 215 if the thickness of polycrystalline silicon film 215 is reduced in order to reduce the leakage current on the occasion when the TFT transistor is OFF, the resistance of the interconnection layer connected to source/drain region 215b becomes high, and so on. As a result, it was difficult to reduce the leakage current and lower the resistance of an interconnection layer connected to the source/drain region in the conventional TFT (Thin Film Transistor).

SUMMARY OF THE INVENTION

An object of the present invention is to reduce the leakage current in a thin film transistor on the occasion when it is OFF.

Another object of the present invention is to lower the resistance of an interconnection layer connected to a source/drain region in a thin film transistor.

Still another object of the present invention is to carry out ion implantation into source/drain regions easily and in a short time in a method of manufacturing a thin film transistor.

A further object of the present invention is to make the thickness of a semiconductor layer in a channel region smaller than the thickness of a semiconductor layer in source/drain regions easily in a method of manufacturing a thin film transistor.

According to an aspect of the present invention, a thin film transistor includes a channel region formed in a predetermined region in a thin semiconductor layer to be opposite a gate electrode with a gate insulating film interposed therebetween, and a pair of source/drain regions formed in the thin semiconductor layer with the channel region interposed therebetween, and the length, in the channel width direction, of the semiconductor layer in the junction parts of the pair of source/drain regions and the channel region is smaller than the length, in the channel width direction, of the semiconductor layer in the source/drain regions.

In operation, since the length, in the channel width direction, of the semiconductor layer in the junction parts of the pair of source/drain regions and the channel region is smaller than the length, in the channel width direction, of the semiconductor layer in the source/drain regions, the surface area of the plurality of silicon crystals in the junction parts of the source/drain regions and the channel region is also reduced as a whole. Accordingly, it is possible to reduce the leakage current generated in the junction parts of the source/drain regions and the channel region as compared to the conventional one. Since it is unnecessary to reduce the length, in the channel width direction, of the semiconductor layer in the source/drain regions, it is also possible to lower the resistance of the interconnection layer connected to the source/drain region as compared to the conventional one.

According to another aspect of the present invention, a thin film transistor includes a channel region formed in a predetermined region in a thin semiconductor layer of polycrystalline silicon to be opposite a gate electrode with a gate insulating film interposed therebetween and a pair of source/drain regions formed in the thin semiconductor layer with the channel region interposed therebetween, and the semiconductor layer includes hydrogen introduced from the outside into the vicinity of grain boundary and combined to silicon in the semiconductor layer.

In operation, since the thin semiconductor layer of polycrystalline silicon includes hydrogen which is introduced from the outside into the vicinity of the grain boundary and combined to silicon in the semiconductor layer, the leakage current is reduced by the hydrogen. In addition, if hydrogen is combined to silicon in the semiconductor layer of polycrystalline silicon, the semiconductor layer comes to have a crystal structure more approximate to the silicon substrate. This causes the current to be increased on the occasion when the TFT is ON as compared to the conventional one.

According to still another aspect of the present invention, a method of manufacturing a thin film transistor includes the steps of forming a gate electrode on a semiconductor substrate with a first insulating layer interposed therebetween, forming a gate insulating film on the gate electrode, forming a semiconductor layer on the gate insulating film and the first insulating layer, forming a second insulating layer on the semiconductor layer except for a part corresponding to a channel region in the semiconductor layer, and thermally oxidizing the exposed surface of the semiconductor layer using the second insulating layer as a mask to reduce the thickness of the semiconductor layer in the channel region.

In operation, the second insulating layer is formed on the semiconductor layer, except for the part corresponding to the channel region in the semiconductor layer, and the exposed surface of the semiconductor layer is thermally oxidized using the second insulating layer as a mask to reduce the thickness of the semiconductor layer in the channel region, so that the thickness of the semiconductor layer in the channel region is easily made smaller than the thickness of the semiconductor layer in the source/drain regions.

According to a further aspect of the present invention, a method of manufacturing a thin film transistor includes the steps of forming a semiconductor layer of polycrystalline silicon on a semiconductor substrate with an insulating layer interposed therebetween, ion-implanting nitrogen ions into a part corresponding to a channel region in the semiconductor layer, making silicon in the semiconductor layer and the introduced nitride ions react with each other by heat treatment to form a silicon nitride film for reducing the thickness of the semiconductor layer to be the channel region, forming a gate insulating film on the channel region in the semiconductor layer, and forming a gate electrode on the gate insulating film.

In operation, nitrogen ions are ion-implanted into the part corresponding to the channel region in the semiconductor layer, and the introduced nitrogen ions and silicon in the semiconductor layer are made to react with each other by heat treatment for forming the silicon nitride film, so that the thickness of the semiconductor layer in the channel region is easily made smaller than the thickness of the semiconductor layer in the source/drain regions.

According to a still further aspect of the present invention, a method of manufacturing a thin film transistor includes the steps of forming a semiconductor layer of polycrystalline silicon on a semiconductor substrate with an insulating layer interposed therebetween, ion-implanting oxygen ions into a part corresponding to a channel region in the semiconductor layer, making silicon in the semiconductor layer and the introduced oxygen ions react with each other by heat treatment to form a silicon oxide film for reducing the thickness of the semiconductor layer to be the channel region, forming a gate insulating film on the channel region in the semiconductor layer, and forming a gate electrode on the gate insulating film.

In operation, oxygen ions are ion-implanted into the part corresponding to the channel region in the semiconductor layer, and silicon in the semiconductor layer and the introduced oxygen ions are made to react with each other by heat treatment for forming the silicon oxide film for reducing the thickness of the semiconductor layer to be the channel region, so that the thickness of the semiconductor layer in the channel region is easily made smaller than the thickness of the semiconductor layer in the source/drain regions.

According to still a further aspect of the present invention, a method of manufacturing a thin film transistor includes the steps of forming a semiconductor layer of polycrystalline silicon which constitutes a source region, a channel region, and a drain region of a thin film transistor, and introducing hydrogen from the outside into the vicinity of the grain boundary of polycrystalline silicon to form combination of silicon and hydrogen.

In operation, hydrogen is introduced from the outside into the vicinity of the grain boundary of the semiconductor layer of polycrystalline silicon which constitutes the source region, the channel region, and the drain region to form combination of silicon and hydrogen, so that the leakage current generated in the junction regions of the source/drain regions and the channel region is reduced as compared to the conventional one.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 30(a) and 30(b) are plan views of the semiconductor device illustrated in FIG. 29.

DESCRIPTION OF THE PREFERRED EMBODIMENTS

Embodiments of the present invention will be described the following with reference to the drawings.

Figure 1:
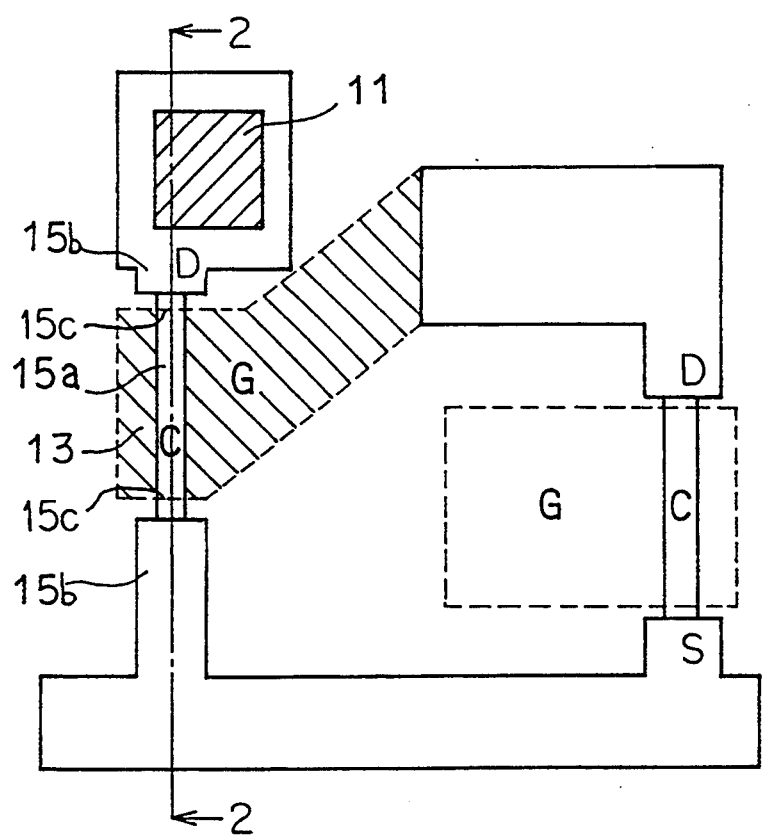
FIG. 1 is a plan view illustrating a semiconductor device having a thin film transistor (TFT) according to an embodiment of the present invention.
Figure 2:
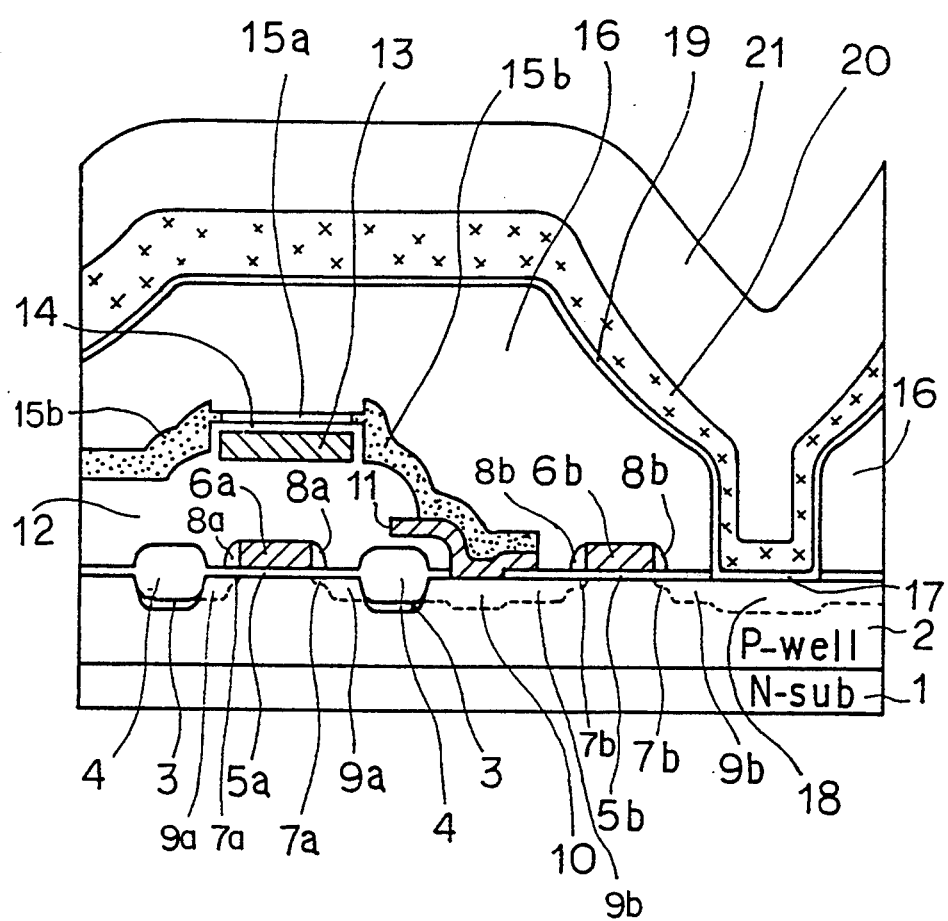
FIG. 2 is a sectional view of the semiconductor device illustrated in FIG. 1 taken along line 2—2.
Figure 3:
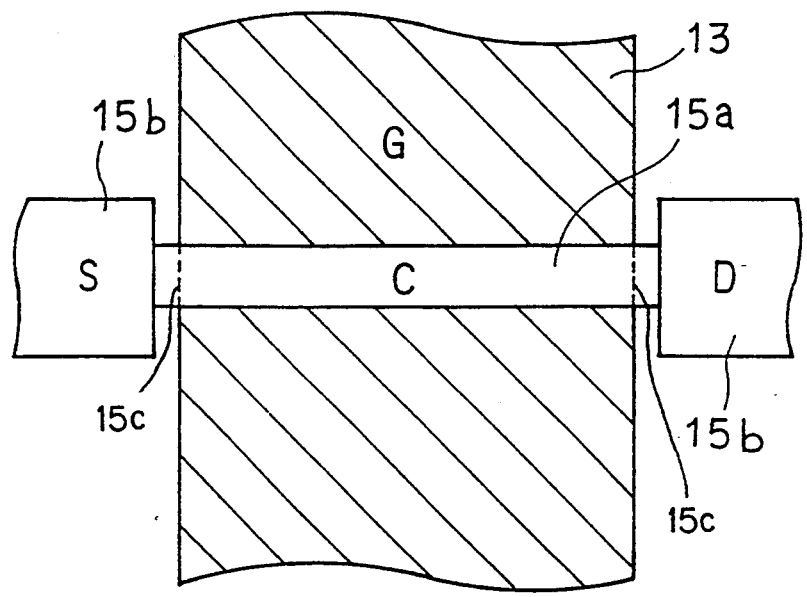
FIG. 3 is an enlarged plan view of the TFT part illustrated in FIG. 2.
Figure 4:
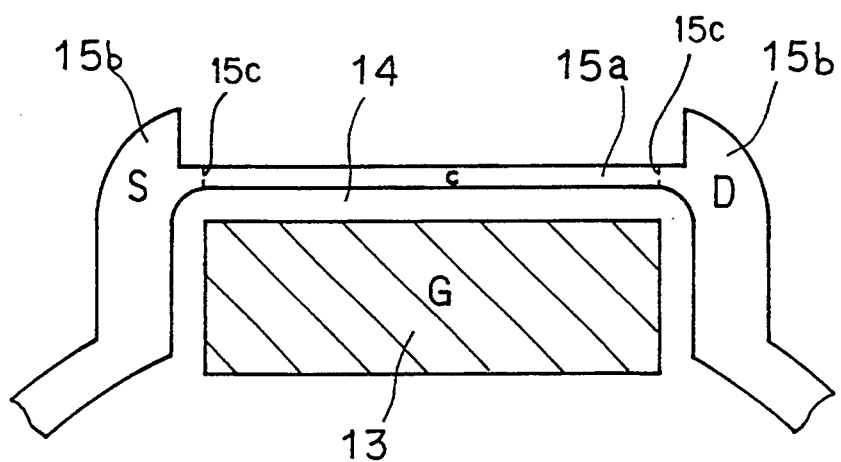
FIG. 4 is a sectional view of the TFT part illustrated in FIG. 3.
Figure 5:
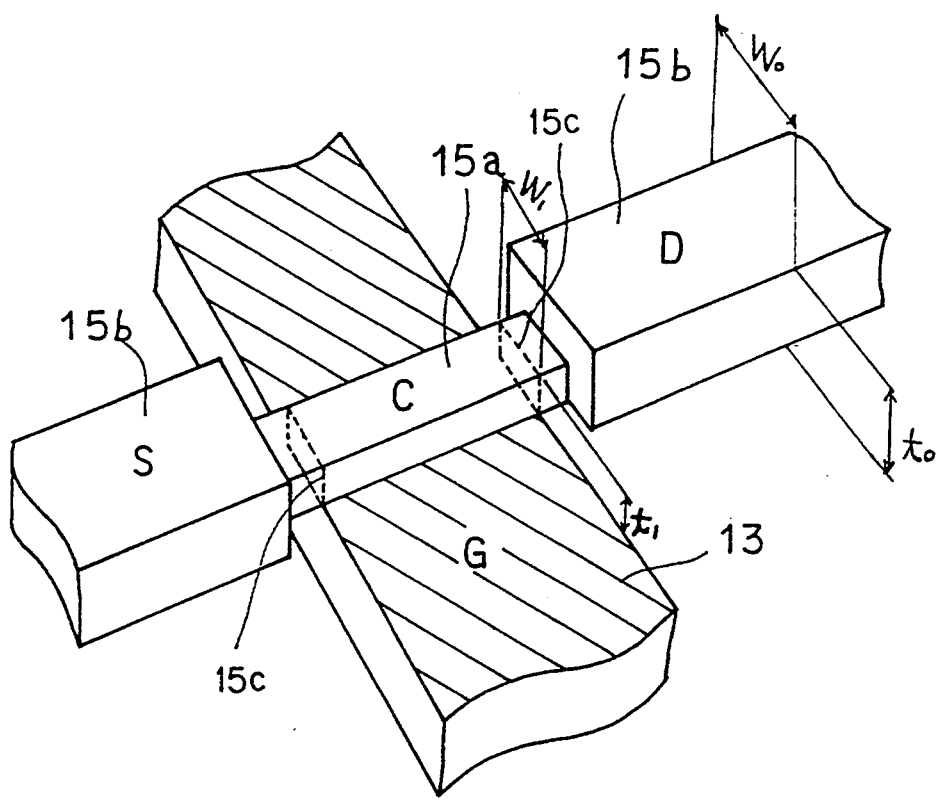
FIG. 5 is a perspective view of the TFT part illustrated in FIG. 2.

Referring to FIGS. 1 and 2, a semiconductor device having a TFT according to a first embodiment of the present invention will be described.

A semiconductor device having a TFT according to this embodiment includes an N-type semiconductor substrate 1, a P-well 2 formed with a predetermined depth on a main surface of semiconductor substrate 1, element isolating oxide films 4 formed spaced a predetermined distance apart from each other on the main surface of semiconductor substrate 1, p-type impurity regions 3 formed beneath element isolating oxide films 4, respectively, high concentration impurity regions 9a formed spaced a predetermined distance apart from each other between element isolating oxide films 4, low concentration impurity regions 7a formed to be continuous with high concentration impurity regions 9a, respectively a gate electrode 6a formed on semiconductor substrate 1 between adjacent low concentration impurity regions 7a with a gate oxide film 5a interposed therebetween, and sidewalls 8a formed on both sidewall parts of gate electrode 6a.

The semiconductor device having a TFT according to this embodiment further includes high concentration impurity regions 9b formed spaced a predetermined distance apart from each other in another region isolated by element isolating oxide film 4, low concentration impurity regions 7b formed to be continuous with high concentration impurity regions 9b, respectively, a gate electrode 6b formed on semiconductor substrate 1 between adjacent low concentration impurity regions 7b with la gate oxide film 5b interposed therebetween, and sidewalls 8b formed on both sidewall parts of gate electrode 6b.

The semiconductor device having a TFT according to this embodiment further includes a contact electrode 11 formed to be electrically connected onto an impurity region 10 formed to be continuous with high concentration impurity region 9b, a polycrystalline silicon film 15 (15a, 15b, 15c) formed to be electrically connected to contact electrode 11 and to extend onto an interlayer insulating film 12, a gate electrode 13 formed under a channel region 15a in polycrystalline silicon film 15 (15a, 15b, 15c) with a gate oxide film 14 interposed therebetween, a barrier metal layer 19 formed to be electrically connected to an impurity region 18 and to extend onto an interlayer insulating film 16, aluminum interconnection (Al—Si—Cu interconnection) formed to overlie barrier metal layer 19, and a passivation film (PSG film) formed to cover the whole surface.

An N-type MOS transistor is implemented with a pair of high concentration impurity regions 9a, a pair of low concentration impurity regions 7a, gate oxide film 5a, and gate electrode 6a. In addition, an N-type MOS transistor is implemented with a pair of high concentration impurity regions 9b, a pair of low concentration impurity regions 7b, gate oxide film 5b, and gate electrode 6b. An MOS-type TFT transistor is implemented with channel region 15a and source/drain regions 15b in polycrystalline silicon film 15, gate oxide film 14, and gate electrode 13.

Now, according to this embodiment, the thickness and the length in the channel width direction of channel regions 15a are smaller than the thickness and the length in the channel width direction of source/drain regions 15b, respectively, in the TFT. Specifically, the thickness of source/drain regions 15b is about 300 to about 1000 Å, and the thickness of channel region 15a is about 50 to about 200 Å.

Referring to FIGS. 2 to 5, according to this embodiment, the length $W_1$ in the channel width direction and the thickness $t_1$ of junction parts 15c are reduced as compared to the conventional ones by making the length $W_1$ in the channel width direction and the thickness ($t_1$) of junction parts 15c of channel region 15a and source/drain regions 15b in the TFT smaller than those ($W_0$, $t_0$) of source/drain regions 15b. As a result, it is possible to effectively reduce the leakage current in junction parts 15c on the occasion when the TFT is OFF. At the same time, it is possible to lower resistance of an interconnection layer connected to the source/drain region as compared to the conventional one, since the length $W_0$ in the channel width direction and the thickness $t_0$ of source/drain region 15b can be made larger. As a result, improvement in the operation speed of the TFT can be also expected.

Referring to FIG. 1 and FIGS. 6 to 17, a manufacturing process of the semiconductor device having a TFT according to this embodiment will be described in the following.

Figure 6:
FIG. 6 is a sectional view for describing a first step of a manufacturing process of the semiconductor device illustrated in FIG. 2.
Figure 7:
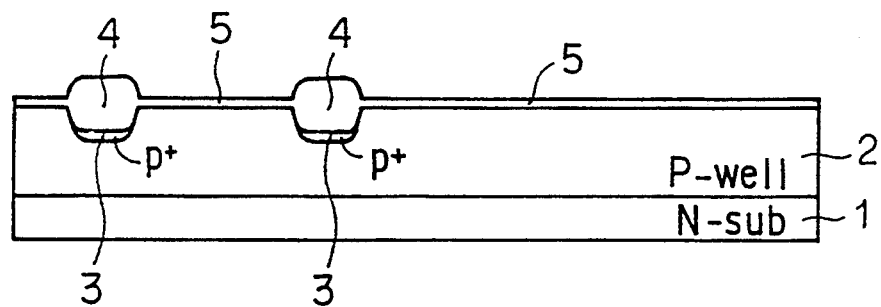
FIG. 7 is a sectional view for describing a second step of the manufacturing process of the semiconductor device illustrated in FIG. 2.
Figure 8:
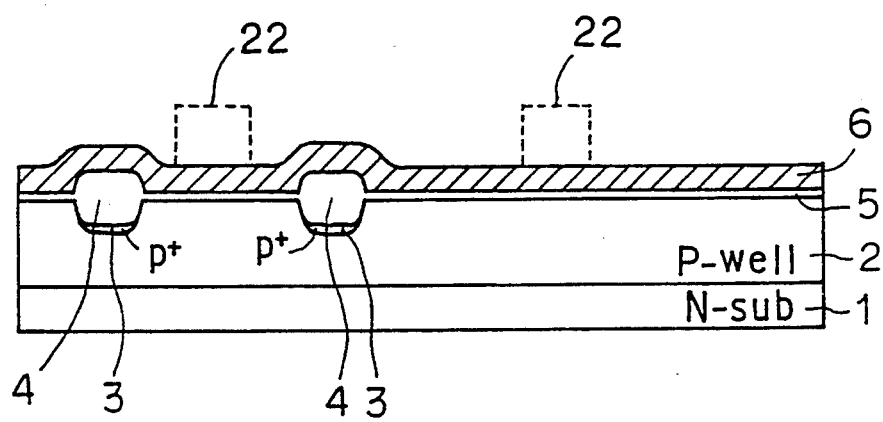
FIG. 8 is a sectional view for describing a third step of the manufacturing process of the semiconductor device illustrated in FIG. 2.

First, as illustrated in FIG. 7, a P-well 2 is formed with a predetermined depth on an N-type semiconductor substrate 1 in a state illustrated in FIG. 6. p-type impurity regions 3 are formed spaced a predetermined distance apart from each other on a main surface of semiconductor substrate 1, and element isolating oxide films 4 are formed spaced a predetermined distance apart from each other on the main surface of semiconductor substrate 1. A polycrystalline silicon film 6 with N-type impurities introduced therein is formed on the whole surface. Resists 22 are formed in predetermined regions on polycrystalline silicon film 6.

Figure 9:
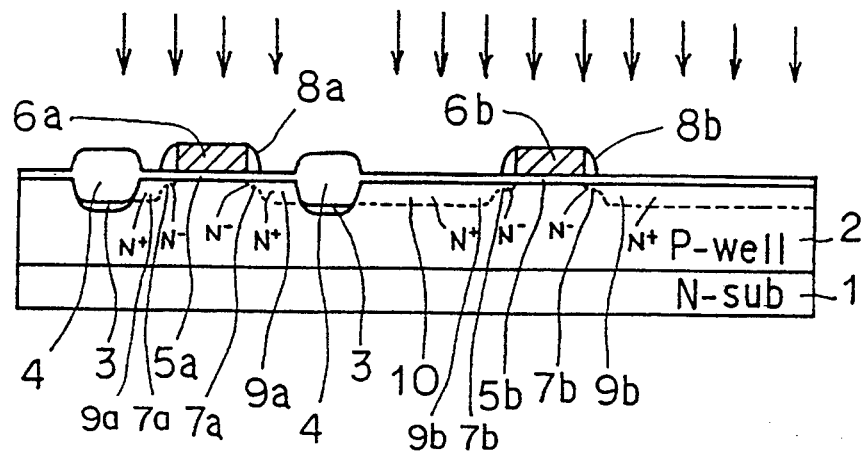
FIG. 9 is a sectional view for describing a fourth step of the manufacturing process of the semiconductor device illustrated in FIG. 2.

Next, as illustrated in FIG. 9, polycrystalline silicon film 6 is etched using resists 22 (See FIG. 8) as a mask to form gate electrodes 6a and 6b. Low concentration impurity regions 7a, 7b are formed by ion-implanting N-type impurities into semiconductor substrate 1 using gate electrodes 6a, 6b as a mask. Sidewalls 8a are formed on both sidewall parts of gate electrodes 6a, 6b. N-type impurities are ion-implanted into semiconductor substrate 1 using gate electrodes 6a, 6b and sidewalls 8a, 8b as a mask to form high concentration impurity regions 9a, 9b.

Figure 10:
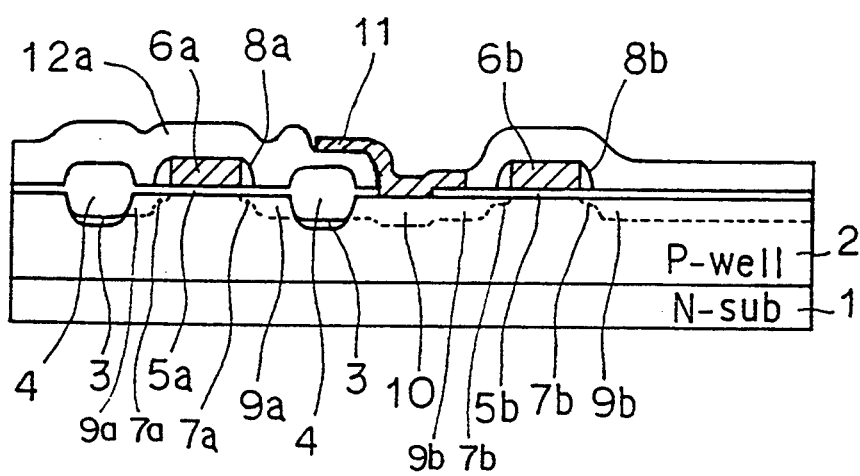
FIG. 10 is a sectional view for describing a fifth step of the manufacturing process of the semiconductor device illustrated in FIG. 2.

Next, as illustrated in FIG. 10, an interlayer insulating film 12a is formed on the whole surface. An opening is provided in interlayer insulating film 12a on one of high concentration impurity regions 9b. A contact electrode 11 is formed to be electrically connected to high concentration impurity region 9b in the opening. An impurity region 10 is formed by carrying out heat treatment.

Figure 11:
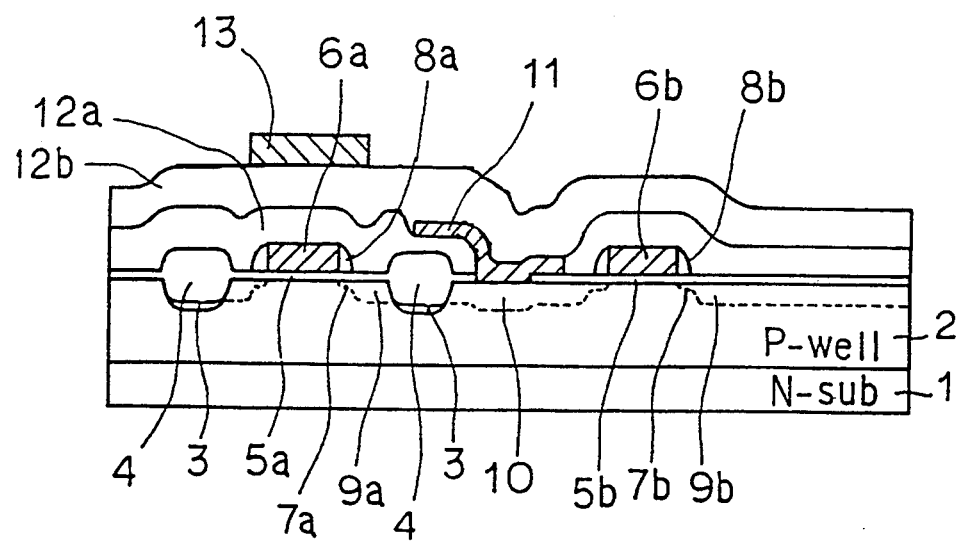
FIG. 11 is a sectional view for describing a sixth step of the manufacturing process of the semiconductor device illustrated in FIG. 2.

Next, as illustrated in FIG. 11, an interlayer insulating film 12b is formed on the whole surface. A gate electrode 13 of a TFT is formed in a region on interlayer insulating film 12b above gate electrode 6a.

Figure 12:
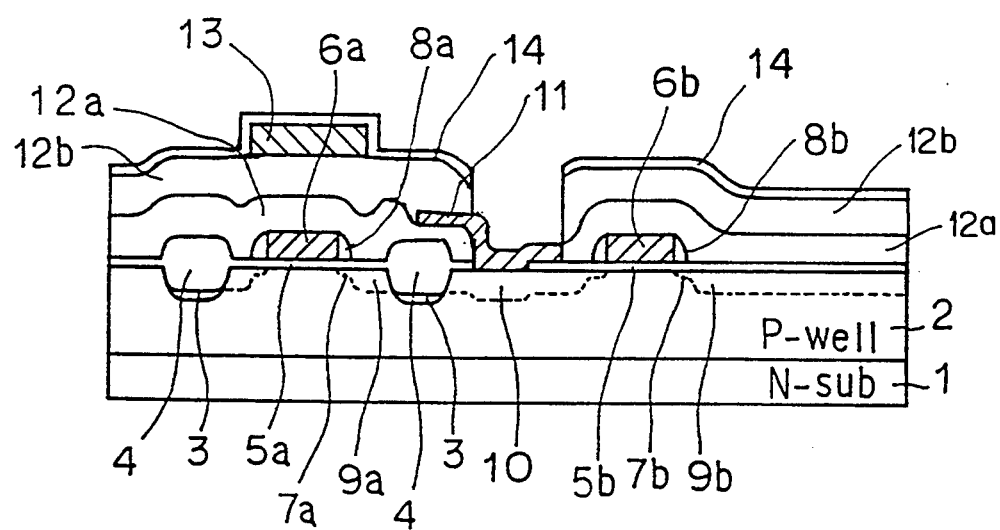
FIG. 12 is a sectional view for describing a seventh step of the manufacturing process of the semiconductor device illustrated in FIG. 2.

Next, as illustrated in FIG. 12, a gate oxide film 14 is formed to cover gate electrode 13. An opening is formed in interlayer insulating film 12a and gate oxide film 14 on contact electrode 11.

Next, as illustrated in FIG. 13, a polycrystalline silicon film 15 doped with N-type impurities is formed to be electrically connected to contact electrode 11 and to extend onto the interlayer insulating film 12.

Figure 13A:
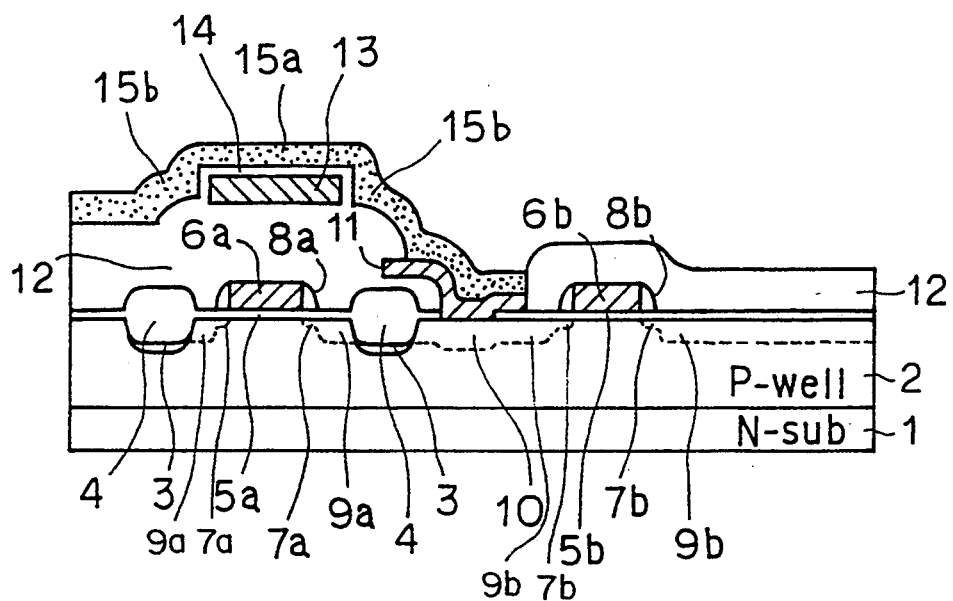
FIG. 13(a) and FIG. 13(b) are sectional view and a plan view, respectively, for describing an eighth step of the manufacturing process of the semiconductor device illustrated in FIG. 2.
Figure 13B:
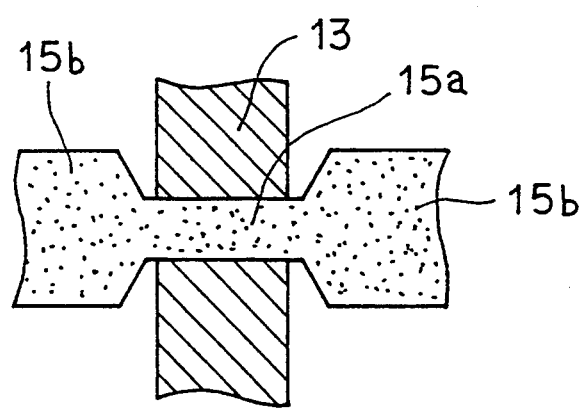

As illustrated in FIG. 13(b), polycrystalline silicon film 15 (15a, 15b) is patterned so that the length in the channel width direction of channel region 15a is smaller than the length in the channel direction of source/drain regions 15b.

Figure 14:
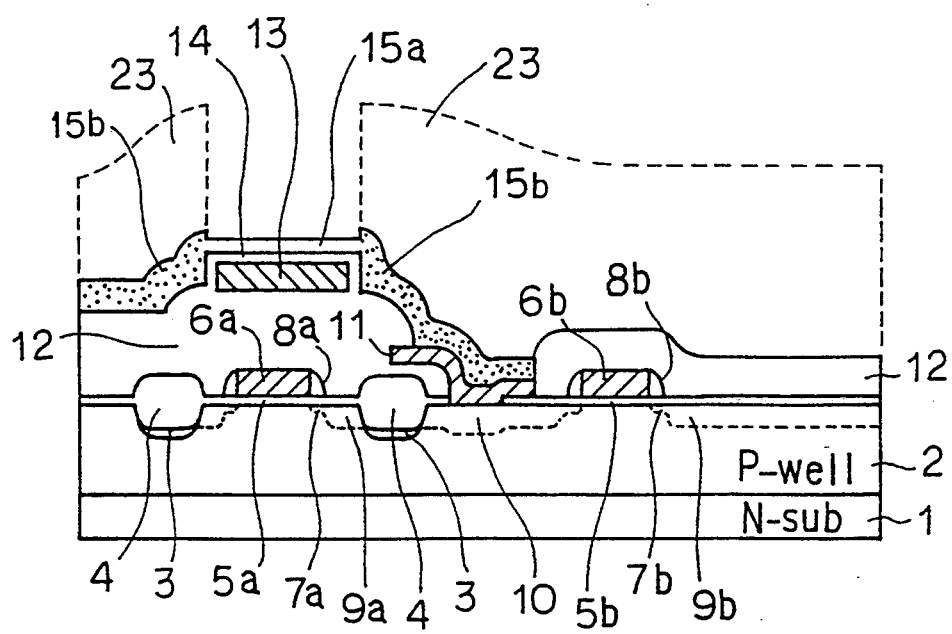
FIG. 14 is a sectional view for describing a ninth step of the manufacturing process of the semiconductor device illustrated in FIG. 2.

Next, as illustrated in FIG. 14, resists 23 are formed on source/drain regions 15b in polycrystalline silicon film 15 (15a, 15b). Polycrystalline silicon film 15 (15a, 15b) in channel region 15a is etched using resists 23 as a mask. It is possible to make the thickness of polysilicon film 15 corresponding to channel region 15a smaller than the thickness of polycrystalline silicon film 15 corresponding to source/drain regions 15b by doing this.

Figure 15:
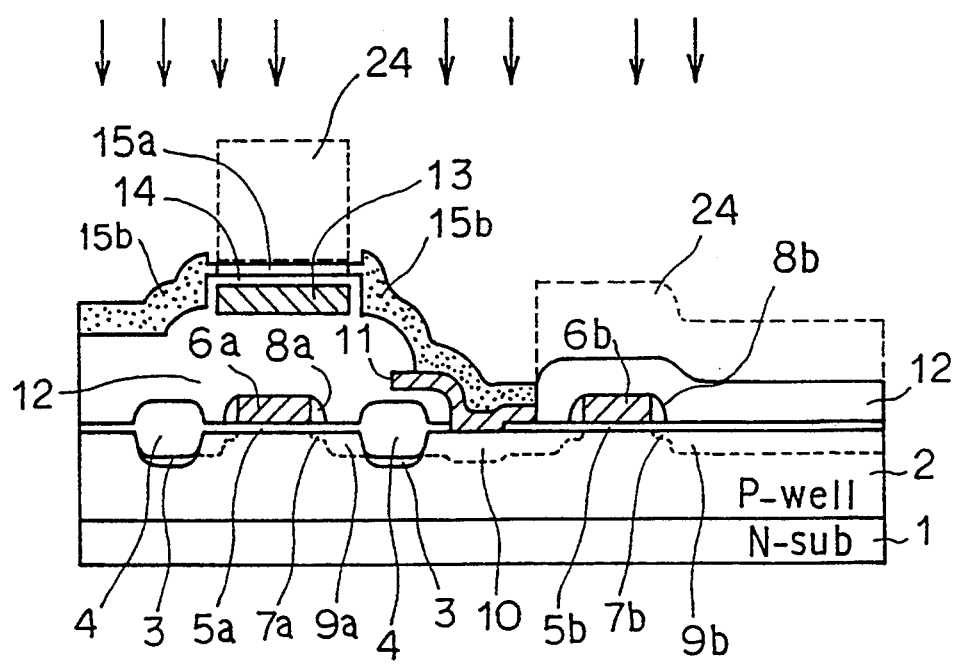
FIG. 15 is a sectional view for describing a tenth step of the manufacturing process of the semiconductor device illustrated in FIG. 2.

Next, as illustrated in FIG. 15, resists 23 (See FIG. 14) are removed, and then a resist 24 is formed on channel region 15a. P-type impurities are ion-implanted into source/drain regions 15b in polycrystalline silicon film 15 (15a, 15b) using resist 24 as a mask. Source/drain regions 15b are formed by doing this.

Figure 16:
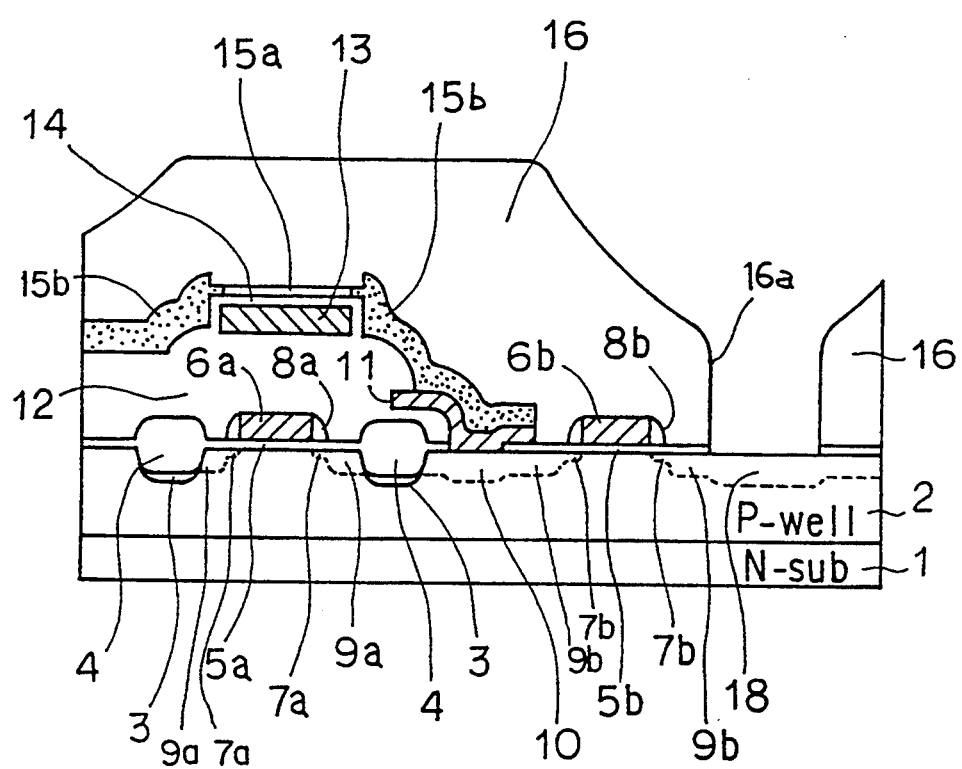
FIG. 16 is a sectional view for describing an eleventh step of the manufacturing process of the semiconductor device illustrated in FIG. 2.

Next, as illustrated in FIG. 16, an interlayer insulating film 16 is formed to cover the whole surface. Then, heat treatment is carried out by a reflow process. A contact hole 16a is formed in a region of interlayer insulating film 16 on high concentration impurity region 9b to which contact electrode 11 is not connected. N-type impurities are ion-implanted into the exposed semiconductor substrate 1 in contact hole 16a to form an impurity diffused region 18.

Figure 17:
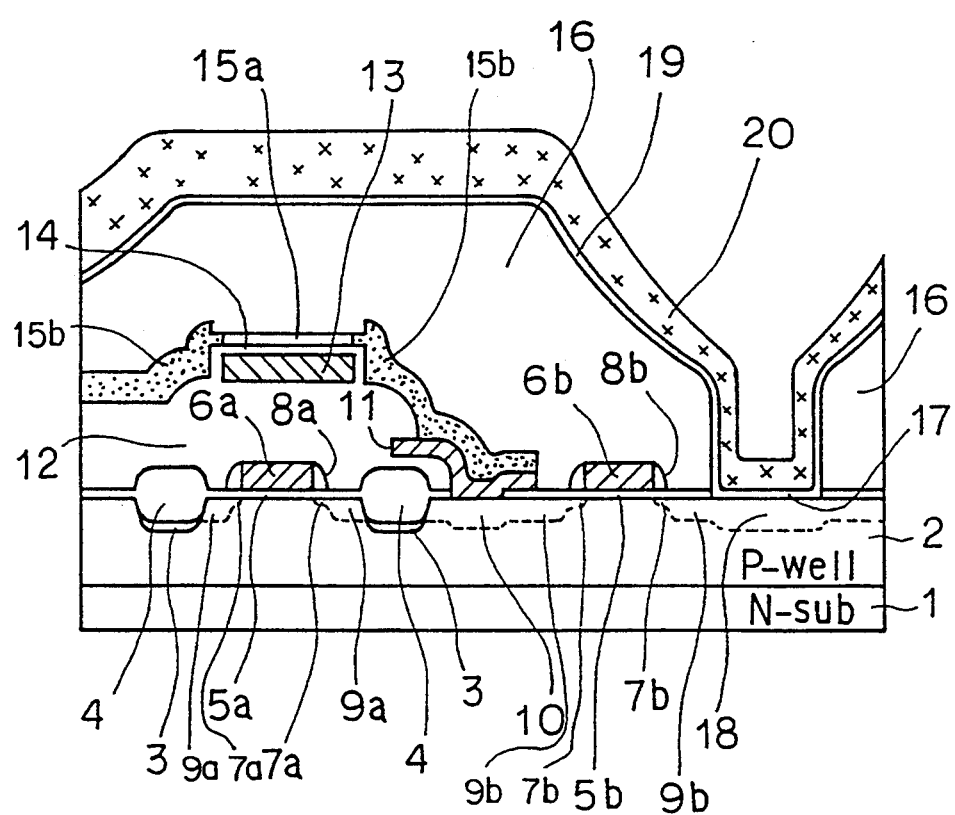
FIG. 17 is a sectional view for describing a twelfth step of the manufacturing process of the semiconductor device illustrated in FIG. 2.

Next, as illustrated in FIG. 17, a barrier metal layer 19 is formed in a contact part 17 to be electrically connected to impurity diffused region 18 and to extend onto interlayer insulating film 16. Aluminum interconnection 20 having a composition of Al—Si—Cu is formed by a sputtering process to overlie barrier metal layer 19.

Finally, as illustrated in FIG. 2, a passivation film (PSG film) 21 is formed on the whole surface. As described above, the semiconductor device having a TFT according to this embodiment is formed.

Figure 18:
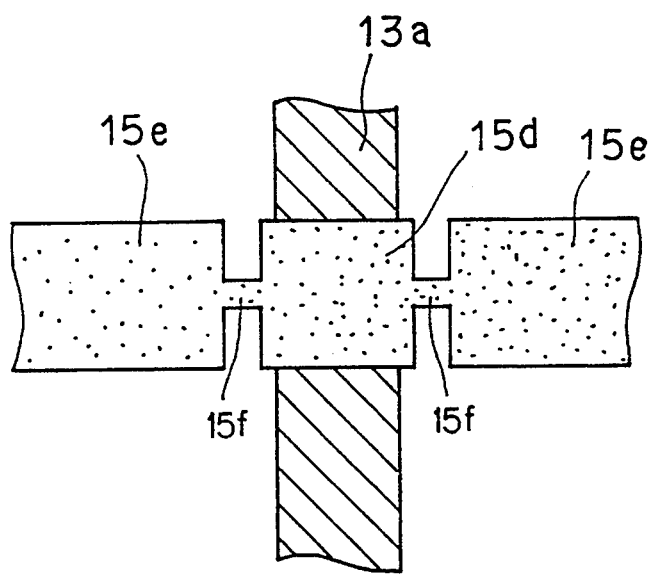
FIG. 18 is a plan view of a thin film transistor (TFT) according to a second embodiment of the present invention.

Referring to FIG. 18, a semiconductor device according to a second embodiment of the present invention will be described. In the second embodiment, polycrystalline silicon film 15 (15d, 15e) may be patterned to have a planar structure as illustrated in FIG. 18 in the process described with reference to FIGS. 13(a), (b).

Specifically, the length in the channel width direction of only junction regions 15f of a channel region 15d formed opposite to a gate electrode 13a and source/drain regions 15e may be made smaller. It is possible to obtain the same effects as those of the TFT according to the first embodiment illustrated in FIGS. 1 to 5 by such implementation.

Figure 19:
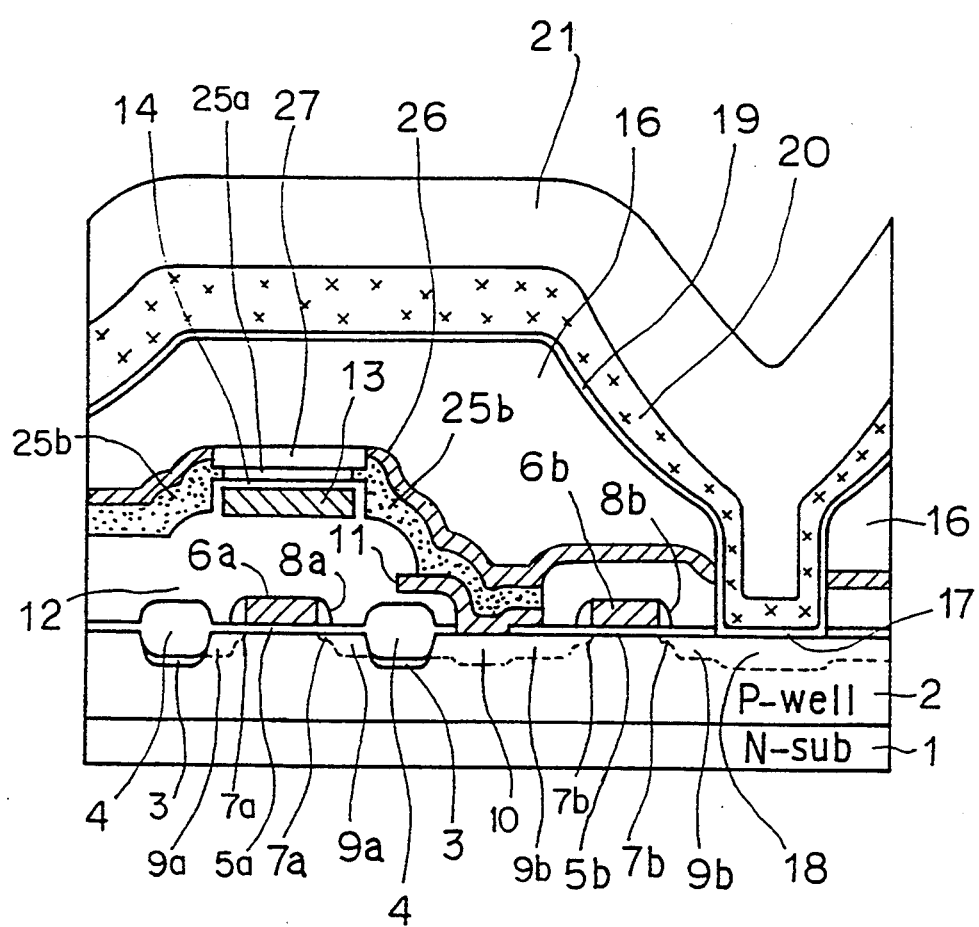
FIG. 19 is a sectional view of a semiconductor device having a TFT according to a third embodiment of the present invention.

Referring to FIG. 19, a semiconductor device having a thin film transistor according to a third embodiment has a channel region 25a implemented with a polycrystalline silicon film 25 (25a, 25b) formed on a gate electrode 13 constituting a TFT with a gate oxide film 14 interposed therebetween. A pair of source/drain regions 25b are formed with channel region 25a interposed therebetween. A silicon nitride film 26 is formed on source/drain regions 25b. A thermally oxidized film 27 is formed on channel region 25a.

As described above, according to the third embodiment, it is possible to make the thickness of channel region 25a smaller than the thickness of source/drain regions 25b by forming thermally oxidized film 27 on channel region 25a. By doing this, it is possible to reduce the leakage current on the occasion when the TFT is OFF and to lower the resistance of an interconnection layer connected to source/drain region 25b.

Referring to FIGS. 19 to 22, a manufacturing process of the semiconductor device according to the third embodiment will be described in the following.

Figure 20:
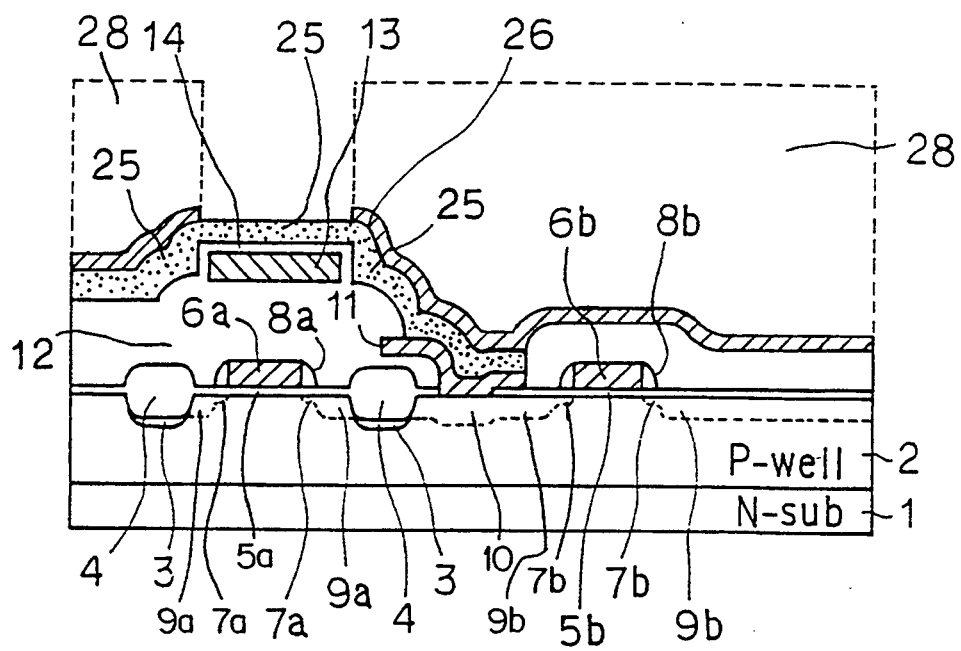
FIG. 20 is a sectional view for describing a first step of a manufacturing process of the semiconductor device illustrated in FIG. 19.

The process up to the step illustrated in FIG. 20 is the same as the manufacturing process of the semiconductor device according to the first embodiment illustrated in FIGS. 6 to 13.

Next, as illustrated in FIG. 20, a silicon nitride film 26 is formed on a polycrystalline silicon film 25 (corresponding to 15 illustrated in FIG. 13) using a low pressure CVD process. Resists 28 are formed on silicon nitride film 26. A part of silicon nitride film 26 corresponding to a channel region is removed using resists 28 as a mask.

Figure 21:
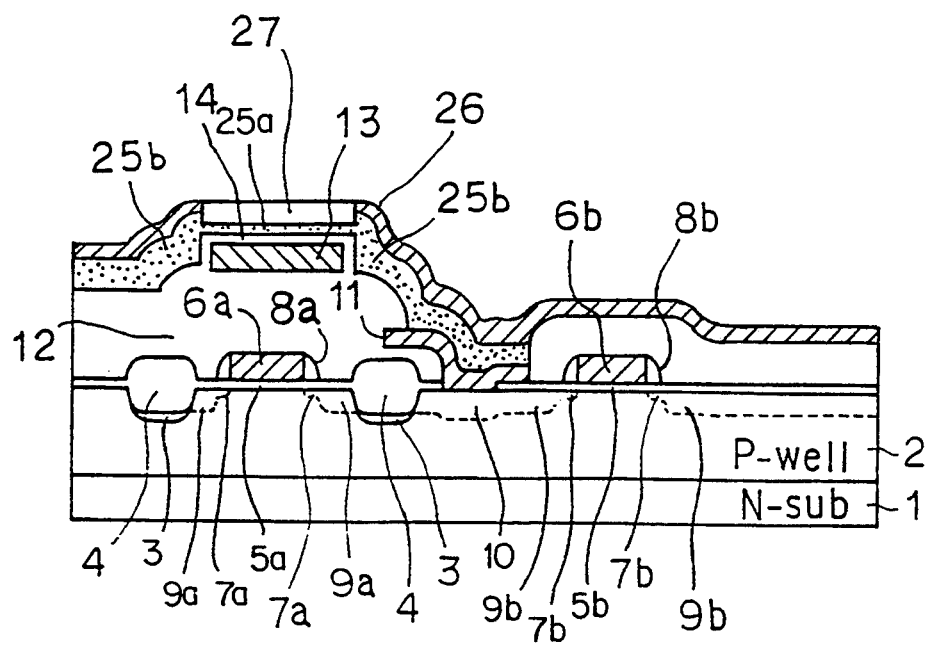
FIG. 21 is a sectional view for describing a second step of the manufacturing process of the semiconductor device illustrated in FIG. 19.

Next, as illustrated in FIG. 21, resists 28 (See FIG. 20) are removed, and then thermal oxidation is carried out using silicon nitride films 26 as a mask. By doing this, a thermally oxidized film 27 is formed on a channel region 25a. It is possible to make the thickness of channel region 25a smaller by forming thermally oxidized film 27. Specifically, if the thickness of polycrystalline silicon film 25 (25a, 25b) is made to be about 300 to about 1000 Å, the thickness of channel region 25a is about 50 to about 200 Å.

Figure 22:
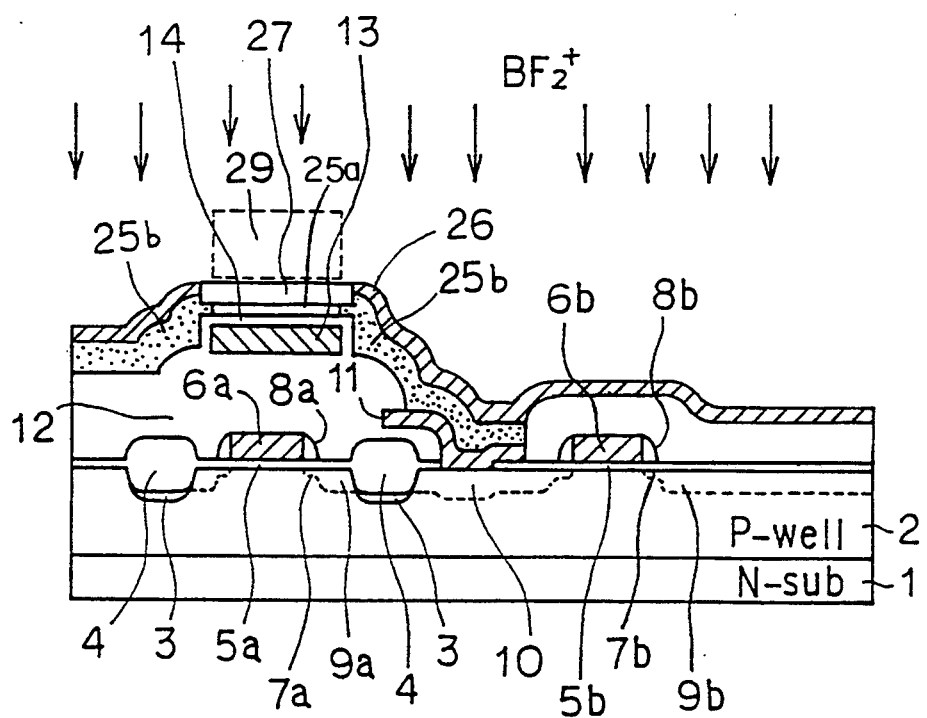
FIG. 22 is a sectional view for describing a third step of the manufacturing process of the semiconductor device illustrated in FIG. 19.

Next, as illustrated in FIG. 22, a resist 29 is formed on thermally oxidized film 27. P-type impurities (BF$_2$+) are ion-implanted into source/drain regions 25b using resist 29 as a mask.

Ion implantation into source/drain regions 25b is carried out through silicon nitride films 26, so that it is possible to make the implantation energy of ion implantation higher as compared to the conventional one. As a result, it is possible to reduce the time required for the implantation process of ion implantation. This also reduces the time required for the whole manufacturing process.

Figure 23:
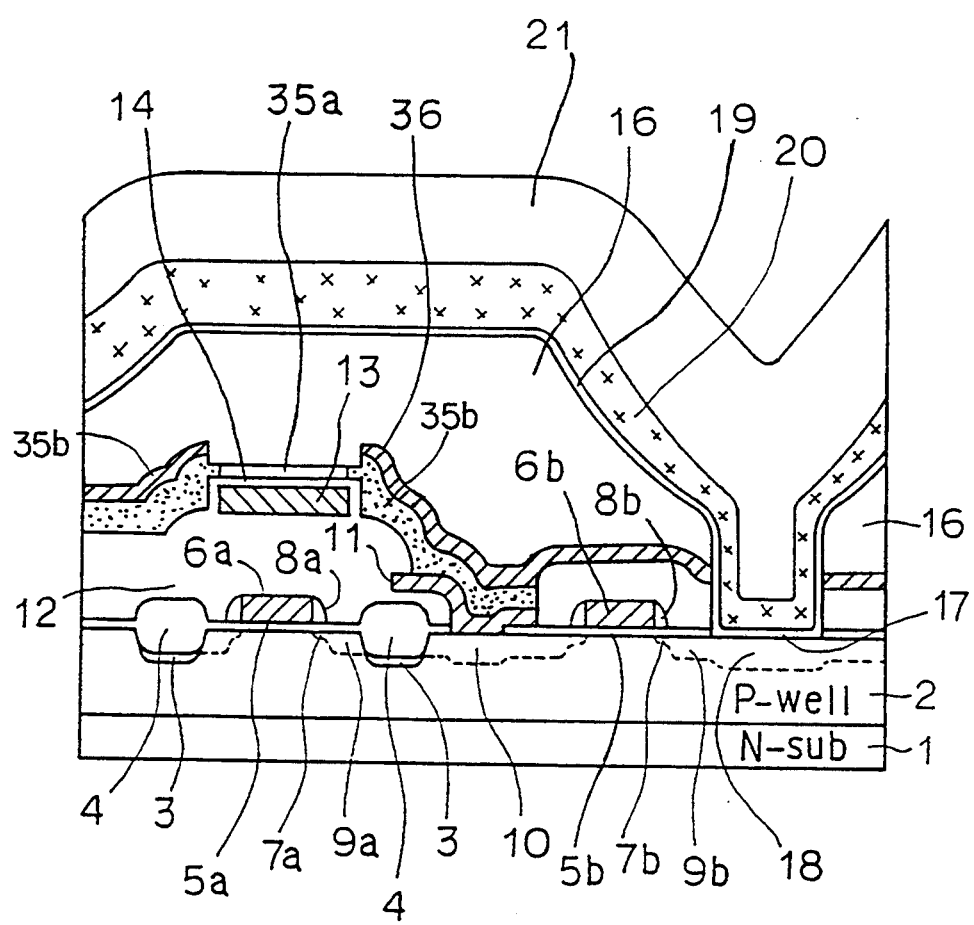
FIG. 23 is a sectional view of a semiconductor device having a TFT according to a fourth embodiment of the present invention.

Referring to FIG. 23, according to a fourth embodiment, a polycrystalline silicon film 35 (35a, 35b) is formed on a gate electrode 13 included in a TFT with a gate oxide film 14 interposed therebetween. A channel region 35a of the TFT is formed in a region of polycrystalline silicon film 35 (35a, 35b) above gate electrode 13. A pair of source/drain regions 35b are formed with channel region 35a interposed therebetween. Silicon oxide films 36 are formed on source/drain regions 35b. The thickness of channel region 35a is made to be smaller than the thickness of source/drain regions 35b. The thickness of channel region 35a is about 50 about 200 Å.

Figure 24:
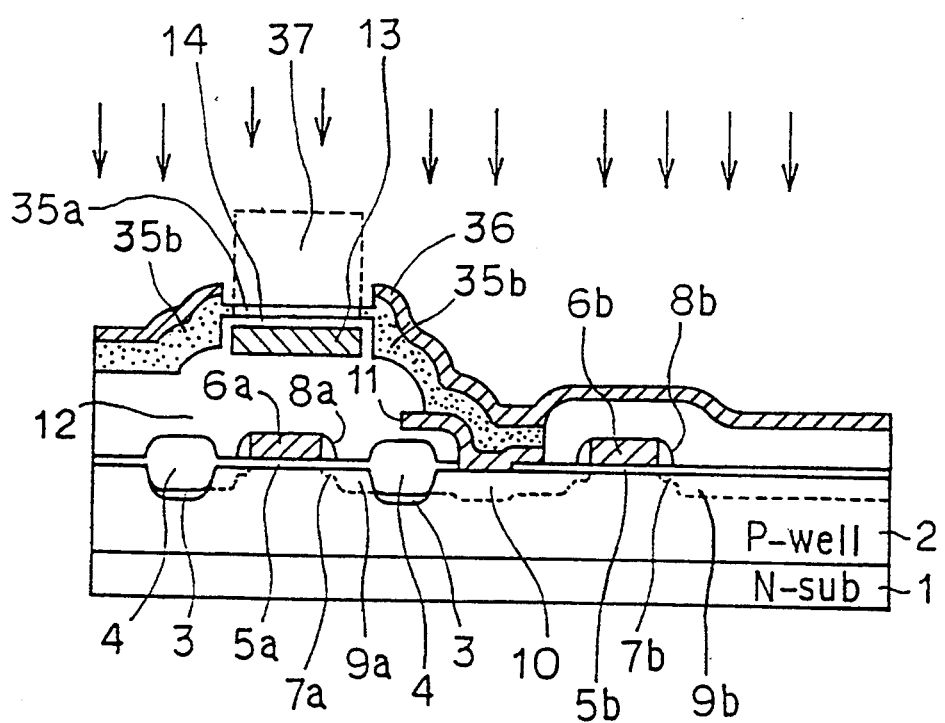
FIG. 24 is a sectional view for describing a manufacturing process of the semiconductor device illustrated in FIG. 23.

Referring to FIG. 24, according to a manufacturing process of the semiconductor device of the fourth embodiment, a polycrystalline silicon film (not shown) is formed with an uniform thickness on a gate electrode 13 with a gate oxide film 14 interposed therebetween. Then, silicon oxide films 36 are formed on parts corresponding to source/drain regions 35b in a polycrystalline silicon film. The polycrystalline silicon film corresponding to a channel region is etched using silicon oxide films 36 as a mask to reduce the thickness of a channel region 35a. Then, a resist 37 is formed on channel region 35a. P-type impurities are ion-implanted into the polycrystalline silicon film corresponding to source/drain regions 35b using resist 37 as a mask. On the occasion of ion implantation, the implantation energy is weakened by silicon oxide films 36. Accordingly, it is possible to make the implantation energy in ion implantation into source/drain regions 35b higher as compared to the conventional one. As a result, it is possible to reduce the implantation time.

Figure 25:
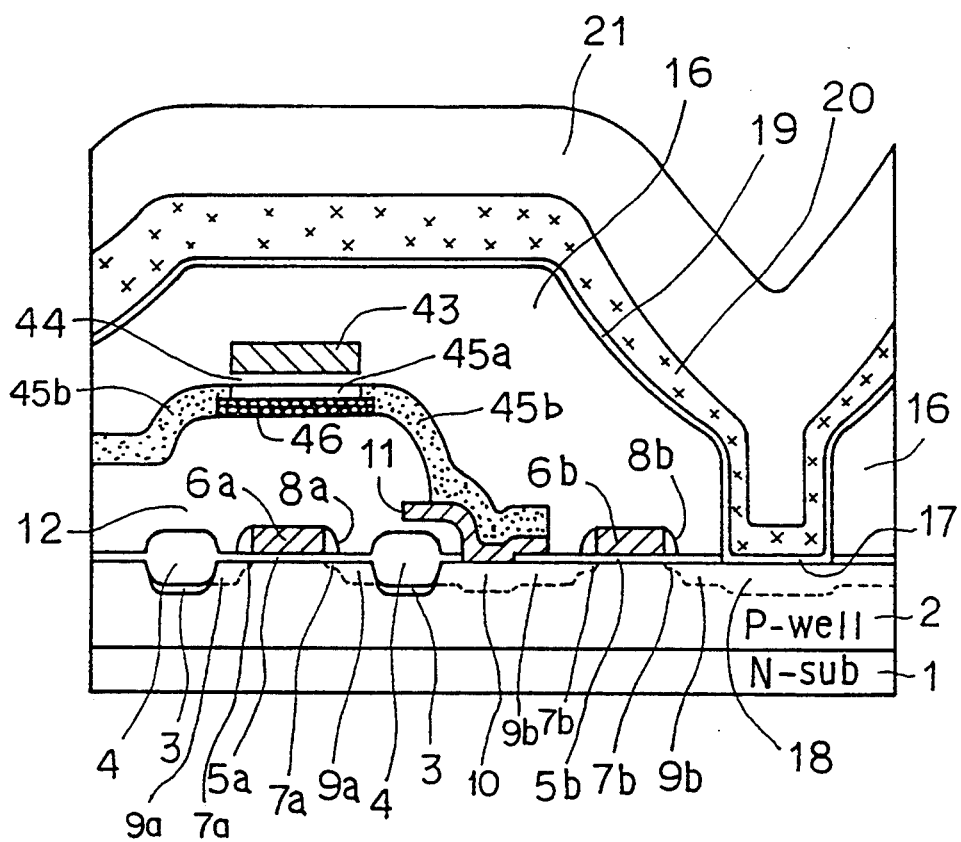
FIG. 25 is a sectional view of a semiconductor device having a TFT according to a fifth embodiment of the present invention.

Referring to FIG. 25, according to a fifth embodiment, a polycrystalline silicon film 45 (45a, 45b) is formed to extend onto an interlayer insulating film 12. Polycrystalline silicon film 45 (45a, 45b) includes a channel region 45a and a pair of source/drain regions 45b formed with channel region 45a interposed therebetween, which constitute a TFT. A Si—N film is formed beneath channel region 45a. A gate electrode 43 of the TFT is formed on channel region 45a with a gate oxide film 44 interposed therebetween.

As described above, in the fifth embodiment, a structure in which the thickness of channel region 45a is made small in a case where gate electrode 43 is positioned above channel region 45a is shown.

Figure 26:
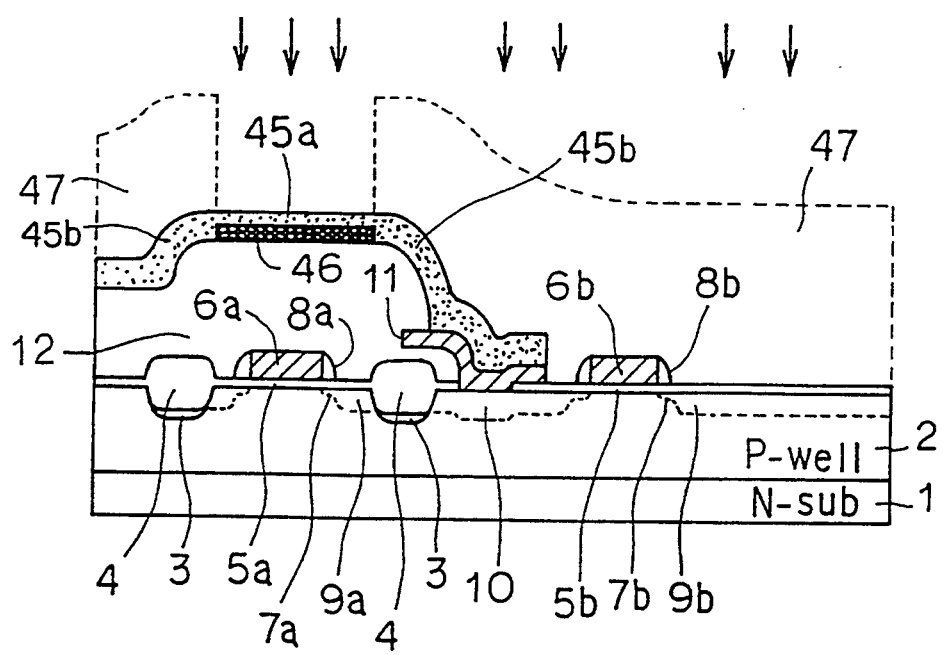
FIG. 26 is a sectional view for describing a first step of a manufacturing process of the semiconductor device illustrated in FIG. 25.
Figure 27:
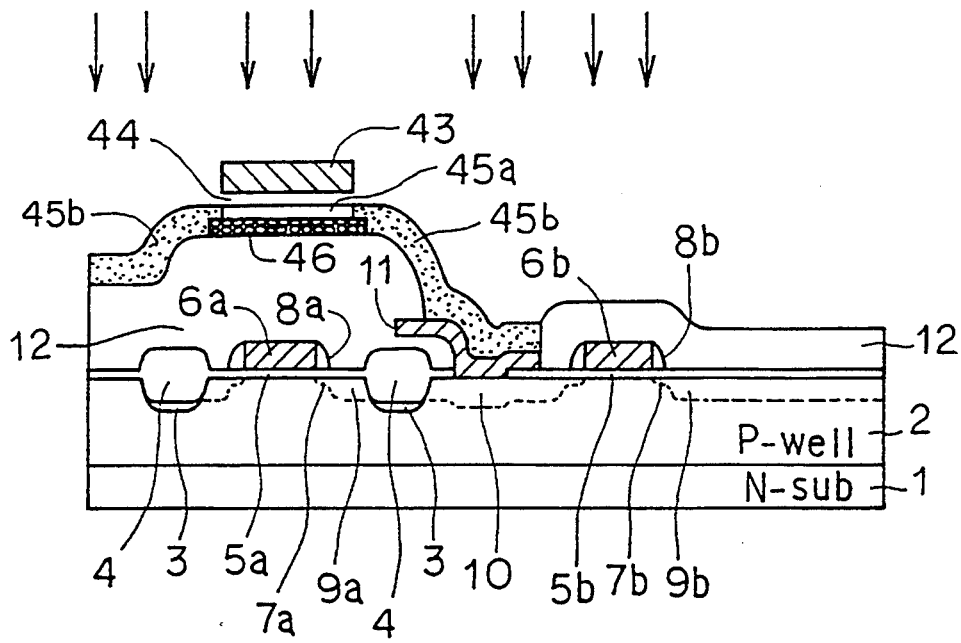
FIG. 27 is a sectional view for describing a second step of the manufacturing process of the semiconductor device illustrated in FIG. 25.

Referring to FIGS. 25 to 27, a manufacturing process of the semiconductor device according to the fifth embodiment will be described.

The process up to the step of forming polycrystalline silicon film 45 is the same as the manufacturing process of the semiconductor device according to the first embodiment illustrated in FIGS. 6 to 13. The thickness of polycrystalline silicon film 45 is about 300 to about 1000 Å.

Next, as illustrated in FIG. 26, resists 47 are formed on polycrystalline silicon film 45 except for channel region 45a. Nitrogen ions are ion-implanted into the exposed polycrystalline silicon film 45 using resists 47 as a mask.

The condition of ion implantation of nitrogen ions is that the implantation energy is approximately 20 KeV in a case where the thickness of polycrystalline silicon film 45 is 500 Å, and it is approximately 40 KeV in a case where thickness of polycrystalline silicon film 45 is 1000 Å. It is conditioned that the implantation amount is at least $1\times10^{18}/cm^2$ ($5\times10^{18}/cm^2$), and the beam current is approximately 20 mA.

After ion-implanting nitrogen ions under such a condition, lamp annealing (heat treatment) is carried out to reduce the implantation damage of ion implantation and to crystalize nitrogen ions. By doing this, it is possible to form a Si—N film 46 beneath channel region 45a. The condition of lamp annealing is that the time is 30 seconds at the temperature of 1050° to 1150° C.

Next, as illustrated in FIG. 27, a gate oxide film 44 and a gate electrode layer (not shown) thereon are formed by a CVD process. A gate electrode 43 of a TFT is formed by a photolithography technique and an etching technique. Impurities are implanted in a self-alignment manner into source/drain regions 45b using gate electrode 43 as a mask. When an offset is provided to source/drain regions 45b, sidewalls are formed on both sidewall parts of gate electrode 43, and ion implantation is carried out.

As described above, according to this embodiment, it is possible to reduce the thickness of the polycrystalline silicon film corresponding to channel region 45a by implanting nitrogen ions into a region of the polycrystalline silicon film corresponding to channel region 45a. In addition, ion implantation has good controllability, so that it is possible to form Si—N film 46 having any thickness.

Figure 28:
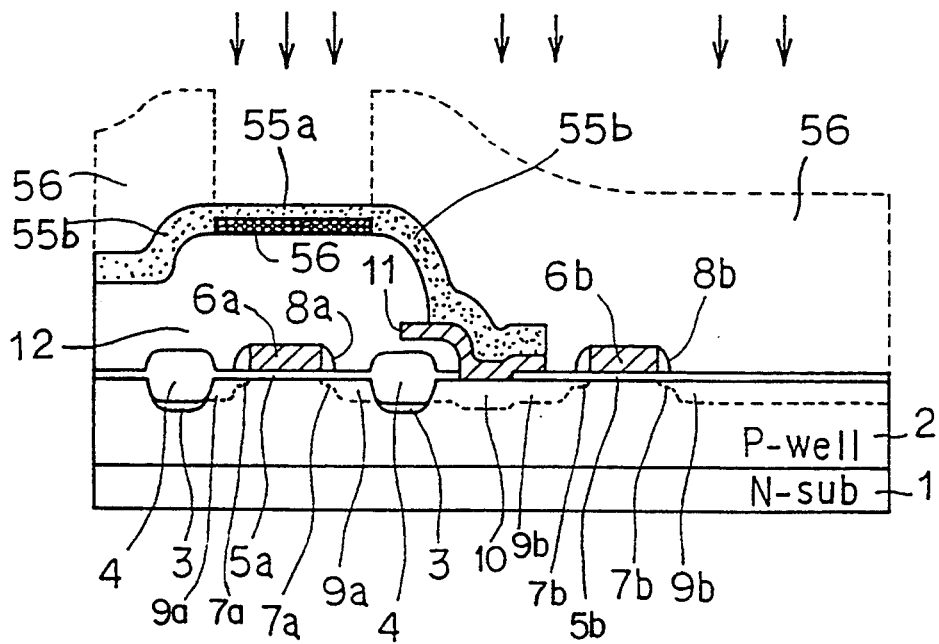
FIG. 28 is a sectional view for describing a manufacturing process of a semiconductor device having a TFT according to a sixth embodiment of the present invention.

Referring to FIG. 28, according to a sixth embodiment, oxygen ions are implanted instead of nitrogen ions in the step of implanting nitrogen ions described in the fifth embodiment. It is also possible to reduce the thickness of the polycrystalline silicon film corresponding to a channel region 55a by implanting oxygen ions. Specifically, a silicon oxide film 56 is formed beneath channel region 55a by implanting oxygen ions into channel region 55a and carrying out lamp annealing. The conditions of implantation of oxygen ions and lamp annealing are the same as those of implantation of nitrogen ions in the fifth embodiment.

Figure 29:
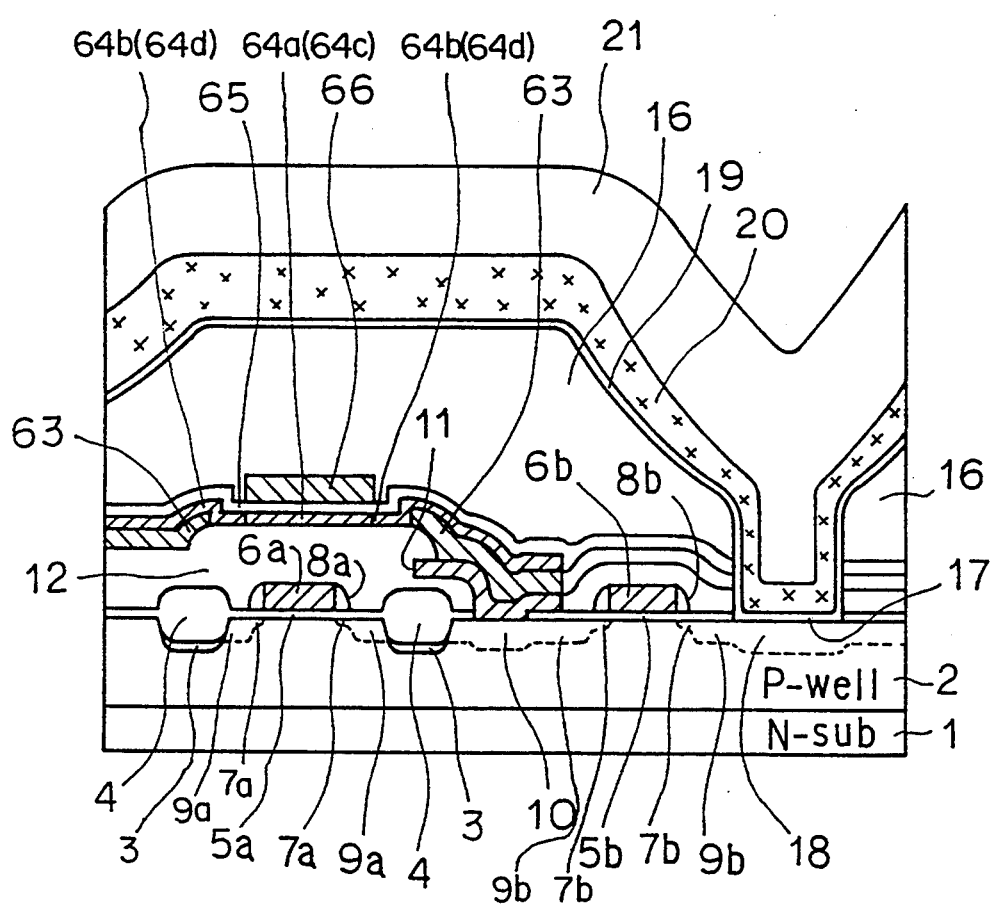
FIG. 29 is a sectional view of a semiconductor device having a TFT according to a seventh embodiment of the present invention.

Referring to FIG. 29, a semiconductor device having a TFT according to a seventh embodiment has first polycrystalline silicon films 63 formed in a predetermined regions on an interlayer insulating film 12. A second polycrystalline silicon film 64 (64a, 64b, 64c, 64d) is formed on first polycrystalline silicon films 63 and interlayer insulating film 12. A gate electrode 66 is formed on the second polycrystalline silicon film formed on interlayer insulating film 12 with a gate oxide film 65 interposed therebetween. First polycrystalline silicon films 63 and parts of second polycrystalline silicon film 64 on first polycrystalline silicon films 63 constitute source/drain regions of a TFT. A channel region 64a of the TFT is formed in a region of second polycrystalline silicon film 64 under a gate electrode 66. Referring to FIGS. 29 and 30, according to an embodiment illustrated in FIG. 30(a), the length in the channel width direction of second polycrystalline silicon film 64 (64a, 64b) in channel region 64a is different from that of source/drain regions 64b. Specifically, the length in the channel width direction of second polycrystalline silicon film 64 in junction boundary 64e between channel region 64a and source/drain regions 64b is made smaller than the length in the channel width direction of source/drain regions 64b. In addition, according to the embodiment illustrated in FIG. 30(b), the length in the channel width direction of second polycrystalline silicon film 64 (64c, 64d) in channel region 64c is the same as that in source/drain regions 64d. Furthermore, the length in the channel width direction of first polycrystalline silicon films 63 formed beneath source/drain regions 64d of second polycrystalline silicon film 64 is made to be longer than the length in the channel width direction of source/drain regions 64d of second polycrystalline silicon film 64. Accordingly, the length in the channel width direction of a junction boundary 64f between channel region 64c and source/drain regions 64d becomes smaller than the length in the channel width direction of source/drain regions (63, 64d).

As described above, according to the seventh embodiment, the thickness of channel region 64a is reduced, and the length in the channel width direction of channel region 64a is made smaller as compared to that of the source/drain regions by implementing the source/drain region included in the TFT with a two-layer structure of first polycrystalline silicon films 63 and second polycrystalline silicon film 64. Accordingly, it is also possible to reduce the leakage current on the occasion when the TFT is OFF and to lower the resistance of an interconnection layer connected to the source/drain region in the seventh embodiment.

Referring to FIGS. 29 to 33, a manufacturing process of the semiconductor device according to the seventh embodiment will be described.

The process up to the step of forming a first polycrystalline silicon film 63 is the same as the manufacturing process of the semiconductor device according to the first embodiment illustrated in FIGS. 6 to 13.

Figure 31:
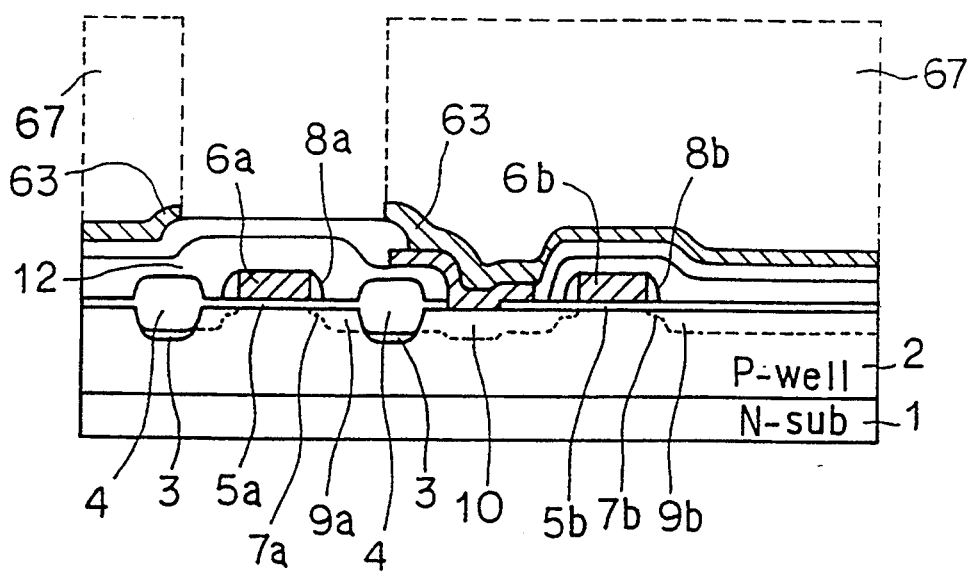
FIG. 31 is a sectional view for describing a first step of a manufacturing process of the semiconductor device illustrated in FIG. 29.

Next, as illustrated in FIG. 31, resists 67 are formed in predetermined regions on first polycrystalline silicon film 63. First polycrystalline silicon film 63 is etched using resists 67 as a mask to remove first polycrystalline silicon film 63 in a region where a channel region is to be formed later. Polycrystalline silicon films 63 are formed to have a thickness of 300 to 1000 Å.

Figure 32:
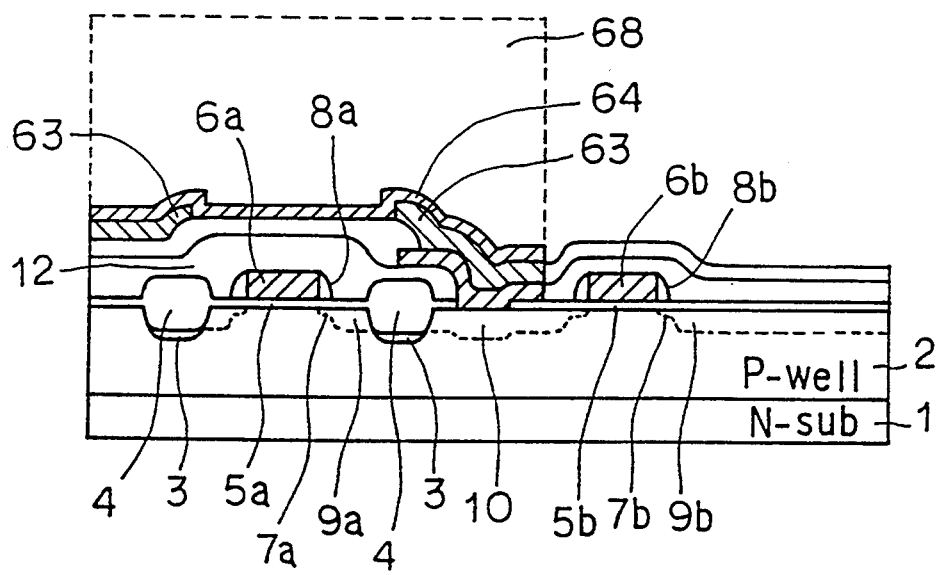
FIG. 32 is a sectional view for describing a second step of the manufacturing process of the semiconductor device illustrated in FIG. 29.

Next, as illustrated in FIG. 32, resists 67 (See FIG. 31) are removed, and then a second polycrystalline silicon film 64 is formed on first polycrystalline silicon films 63 and an interlayer insulating film 12 where a channel region is to be formed. The thickness of second polycrystalline silicon film 64 is approximately 100 Å. Then, a resist 68 is formed in a region where a TFT is to be formed. First polycrystalline silicon films 63 and second polycrystalline silicon film 64 except for the region where the TFT is to be formed are removed by etching using resist 68 as a mask.

Figure 33:
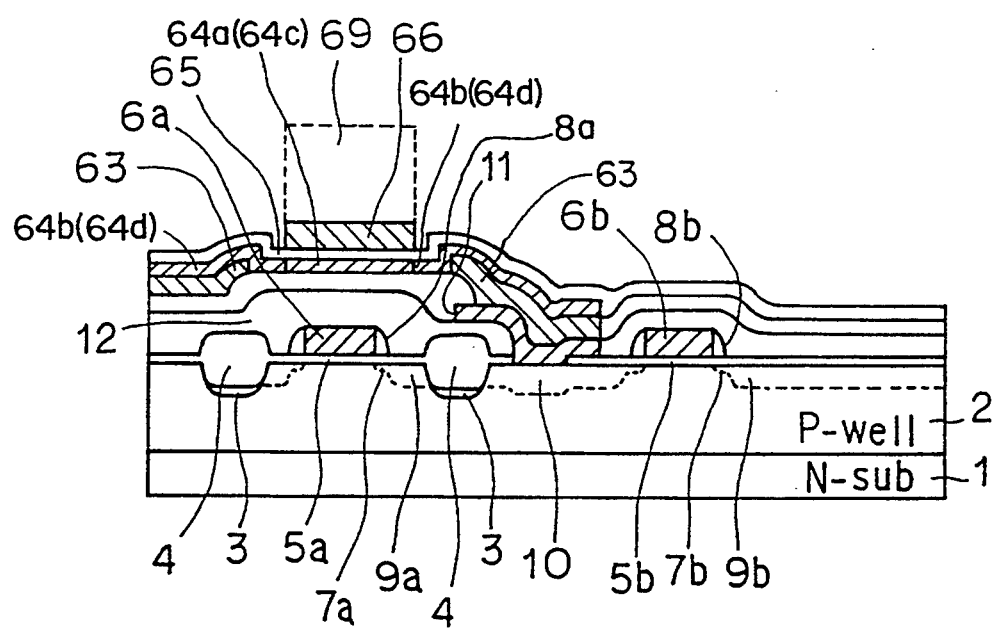
FIG. 33 is a sectional view for describing a third step of the manufacturing process of the semiconductor device illustrated in FIG. 29.

Next, as illustrated in FIG. 33, resist 68 (See FIG. 32) is removed, and then a gate oxide film 65 is formed. A polycrystalline silicon film (not shown) is formed on gate oxide film 65. A resist 69 is formed in a predetermined region on the polycrystalline silicon film (not shown). Etching is carried out using resist 69 as a mask to form a gate electrode 66.

As described above, the TFT including first polycrystalline silicon films 63, second polycrystalline silicon film 64, gate oxide film 65, and gate electrode 66 is formed. In the source/drain regions, first polycrystalline silicon films 63 overlies second polycrystalline silicon film 64 (64b, 64d). Therefore, impurities in first polycrystalline silicon films 63 are diffused into second polycrystalline silicon film 64 (64b, 64d) by thermal diffusion. As a result, this embodiment has an effect that ion implantation into second polycrystalline silicon film 64 in the source/drain regions is unnecessary. The condition of heat treatment on the occasion when impurities in first polycrystalline silicon films 63 are thermally diffused into second polycrystalline silicon film 64 is that it is carried out under a temperature condition not damaging the device in the lower layer.

Figure 34:
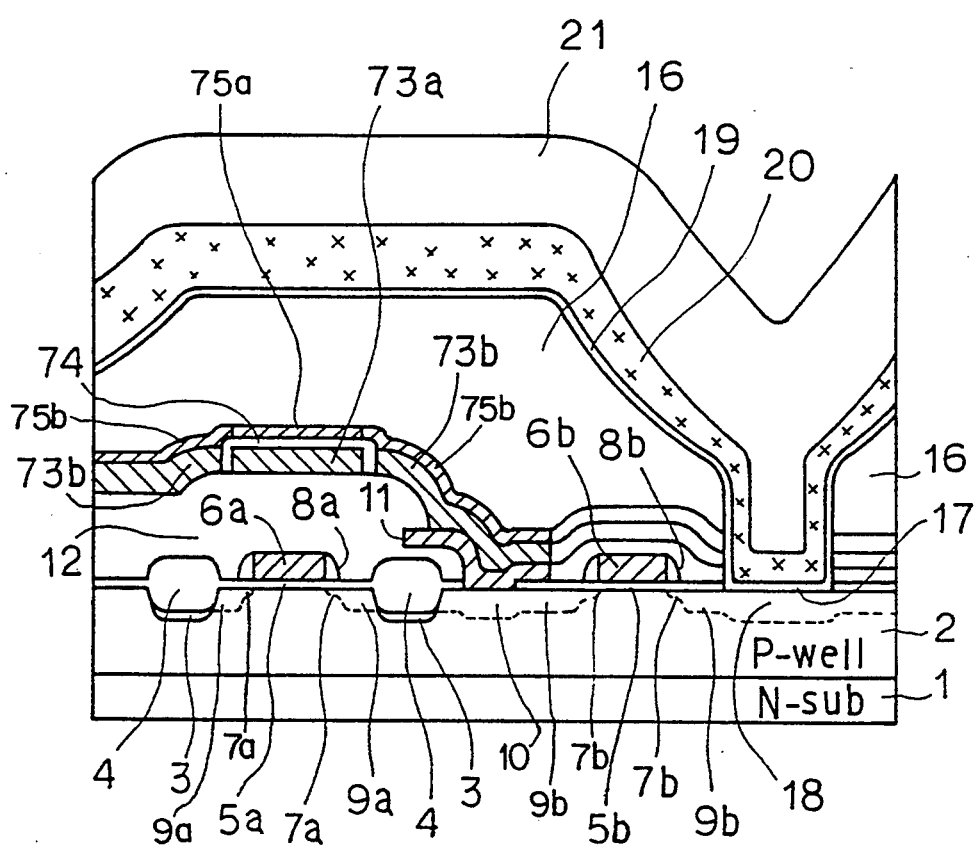
FIG. 34 is a sectional view of a semiconductor device having a TFT according to an eighth embodiment of the present invention.

Referring to FIG. 34, a semiconductor device according to an eighth embodiment has a gate electrode 73a included in a TFT formed in a region on an interlayer insulating film 12 above a gate electrode 6a. A gate oxide film 74 is formed to cover gate electrode 73a. First polycrystalline silicon films 73b are formed on interlayer insulating film 12 each spaced a predetermined distance apart from gate electrode 73a. A second polycrystalline silicon films 75 (75a, 75b) is formed on first polycrystalline silicon film 73b and to cover gate oxide film 74. Source/drain regions of the TFT are implemented with first polycrystalline silicon films 73b and a region in second polycrystalline silicon films 75 (75b) formed on first polycrystalline silicon films 73b. A channel region of the TFT is formed in a region of second polycrystalline silicon film 75 (75a) above gate electrode 73a. According to the eighth embodiment, the source/drain regions of the TFT are implemented with a two-layer structure of first polycrystalline silicon films 73b and second polycrystalline silicon film 75 (75b) as in the seventh embodiment. It is possible to make the thickness of channel region 75a in second polycrystalline silicon film 75 smaller than the thickness of the source/drain regions implemented with first polycrystalline silicon films 73b and second polycrystalline silicon film 75 (75b) with such a structure. Accordingly, it is possible to reduce the leakage current on the occasion when the TFT is OFF and to lower the resistance of an interconnection layer connected to the source/drain region of the TFT.

Referring to FIGS. 34 to 37, a manufacturing process of the TFT part of the semiconductor device according to the eighth embodiment will be described.

The process up to the step of forming a contact electrode 11 is the same as the manufacturing process of the semiconductor device according to the first embodiment illustrated in FIGS. 6 to 10.

Figure 35:
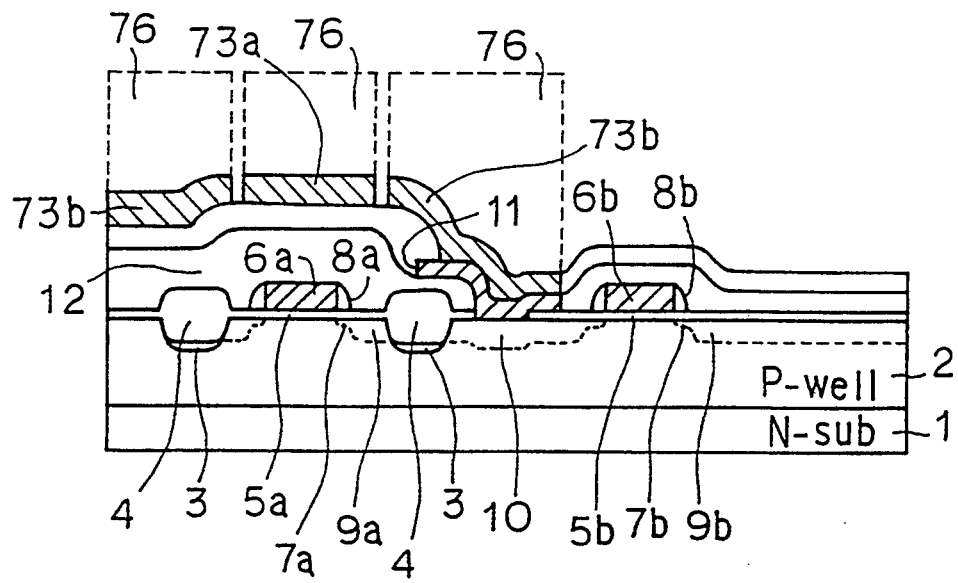
FIG. 35 is a sectional view for describing a first step of a manufacturing process of the semiconductor device illustrated in FIG. 34.

Next, as illustrated in FIG. 35, an interlayer insulating film 12b (not shown) is formed on an interlayer insulating film 12a (See FIG. 10) and a contact electrode 11. An insulating film 12 includes the insulating film 12a and 12b. A contact hole is formed in a part of interlayer insulating film 12b (not shown) on contact electrode 11. A first polycrystalline silicon film (not shown) is formed on interlayer insulating film 12b and on contact electrode 11. Resists 76 are formed in predetermined regions on first polycrystalline silicon film (not shown). Etching is carried out using resists 76 as a mask to form a gate electrode 73a formed of the first polycrystalline silicon film. First polycrystalline silicon films 73b constituting source/drain regions remain spaced a predetermined distance apart from each other on both sides of gate electrode 73a.

Figure 36:
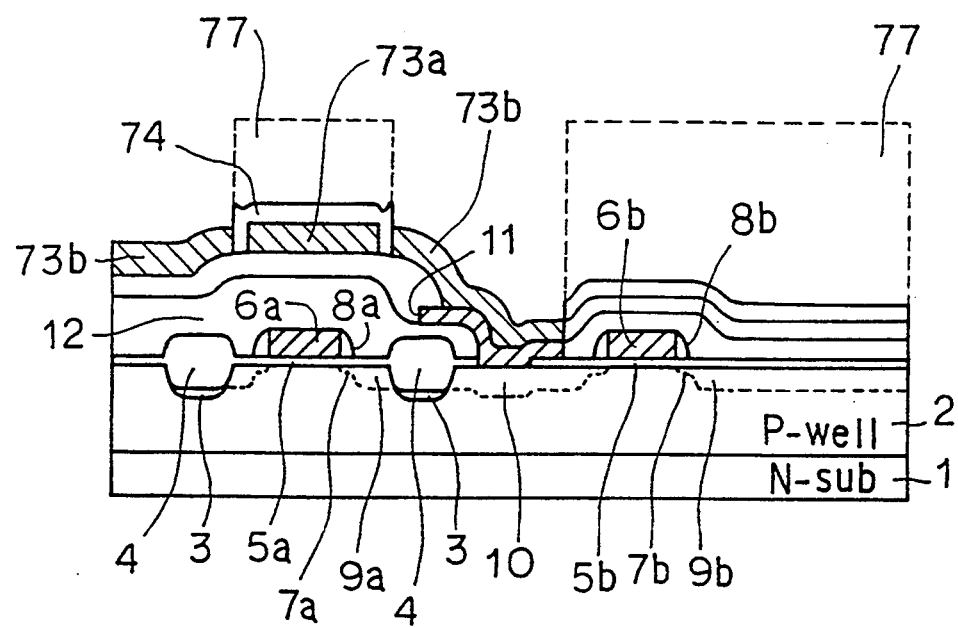
FIG. 36 is a sectional view for describing a second step of the manufacturing process of the semiconductor device illustrated in FIG. 34.

Next, as illustrated in FIG. 36, resists 76 (See FIG. 35) are removed, and then a gate oxide film 74 is formed to cover gate electrode 73a and first polycrystalline silicon films 73b. At this time, gate oxide film 74 is interposed between gate electrode 73a and first polycrystalline silicon films 73b. Resists 77 are formed on gate oxide film 74 on gate electrode 73a. Gate oxide film 74 is etched using resists 77 as a mask to leave gate oxide film 74 to cover gate electrode 73a.

Figure 37:
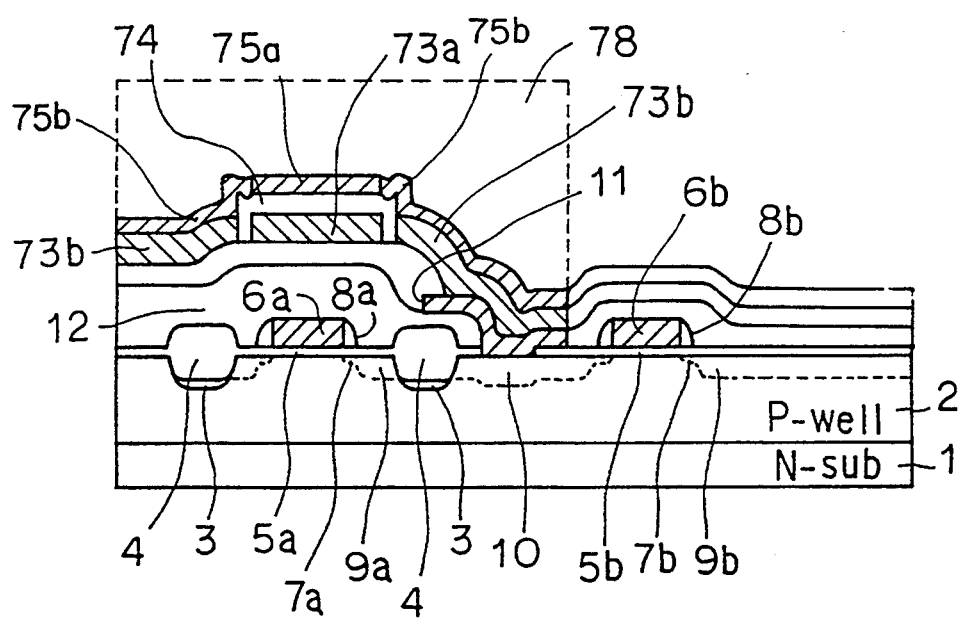
FIG. 37 is a sectional view for describing a third step of the manufacturing process of the semiconductor device illustrated in FIG. 34.

Next, as illustrated in FIG. 37, resists 77 (See FIG. 36) are removed, and then a second polycrystalline silicon film 75 (75a, 75b) is formed by a CVD process to cover gate oxide film 74 and first polycrystalline silicon films 73b. The thickness of second polycrystalline silicon film 75 (75a, 75b) is approximately 100 Å. A resist 78 is formed on second polycrystalline silicon film 75 in a region where TFT is to be formed. Second polycrystalline silicon film 75 is etched using resist 78 to remove second polycrystalline silicon film 75 except for the part where the TFT is to be formed.

According to the eighth embodiment, impurities in first polycrystalline silicon film 73b are diffused into second polycrystalline silicon film 75 (75b) by thermal diffusion, so that it is also possible to make it unnecessary to carry out ion implantation into parts of second polycrystalline silicon film 75 (75b) corresponding to the source/drain regions.

Figure 38:
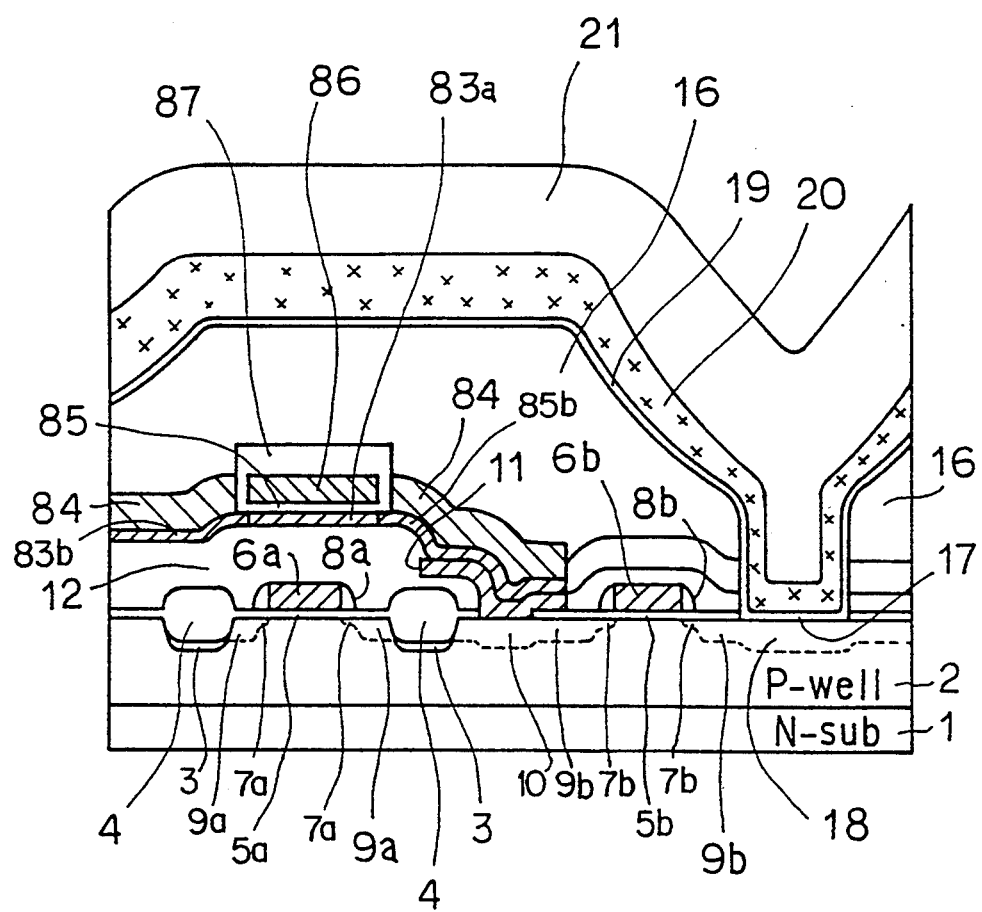
FIG. 38 is a sectional view of a semiconductor device having a TFT according to a ninth embodiment of the present invention.

Referring to FIGS. 38, according to a ninth embodiment, a first polycrystalline silicon film 83 (83a, 83b) is formed on an interlayer insulating film 12. A gate electrode 86 is formed on a part of first polycrystalline silicon film 83 corresponding to a channel region 83a with a gate oxide film 85 interposed therebetween. An oxide film 87 is formed to cover gate electrode 86. Second polycrystalline silicon films 84 are formed on source/drain regions 83b in first polycrystalline silicon film 83. Source/drain regions of a TFT are implemented with second polycrystalline silicon film 84 and source/drain regions 83b in first polycrystalline silicon film 83. Channel region 83a of the TFT is implemented with a region in first polycrystalline silicon film 83 under gate electrode 86.

As described above, according to the ninth embodiment, it is also possible to make the thickness of channel region 83a smaller than the thickness of the source/drain regions by forming the source/drain regions of the TFT with a two-layer structure.

Referring to FIGS. 38 to 41, a manufacturing process of the semiconductor device according to the ninth embodiment will be described.

The process up to the step of forming a contact electrode 11 is the same as the manufacturing process of the semiconductor device according to the first embodiment illustrated in FIGS. 6 to 10.

Figure 39:
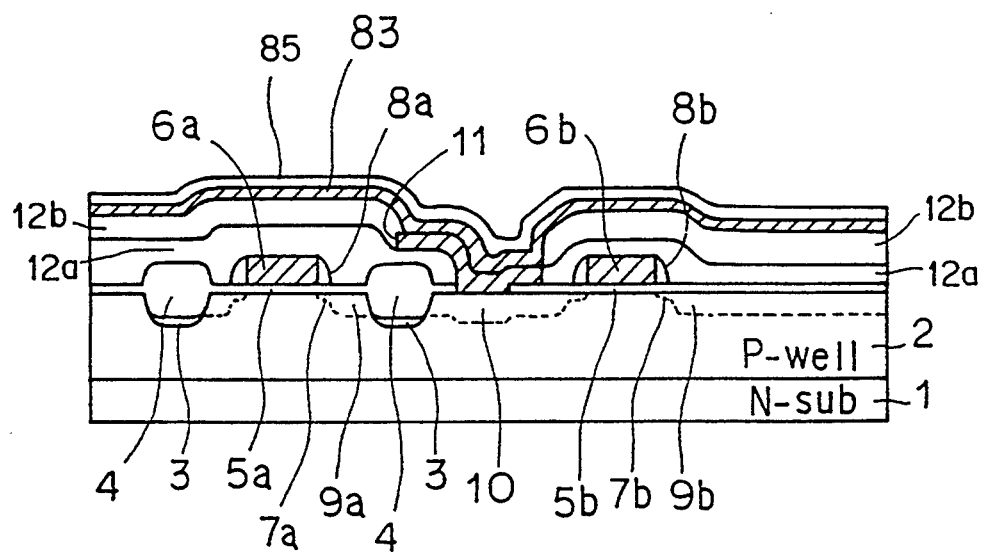
FIG. 39 is a sectional view for describing a first step of a manufacturing process of the semiconductor device illustrated in FIG. 38.

Next, as illustrated in FIG. 39, an interlayer insulating film 12b is formed on an interlayer insulating film 12a and a contact electrode 11. A contact hole is formed in a region in interlayer insulating film 12b on contact electrode 11. A first polycrystalline silicon film 83 is formed by a CVD process in the contact hole to be electrically in contact with contact electrode 11 and to extend onto interlayer insulating film 12b. The thickness of first polycrystalline silicon film 83 is about 50 to about 200 Å. A gate oxide film 85 is formed on first polycrystalline silicon film 83 by a CVD process.

Figure 40:
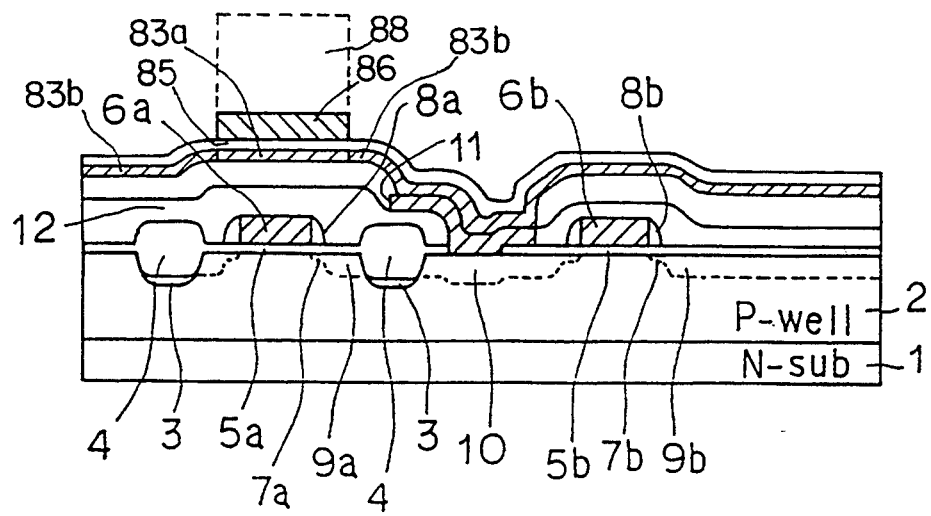
FIG. 40 is a sectional view for describing a second step of the manufacturing process of the semiconductor device illustrated in FIG. 38.

Next, as illustrated in FIG. 40, a gate electrode 86 is formed in a region on gate oxide film 85 on a channel region 83a by photolithography and etching techniques. Specifically, resists 88 are formed on a predetermined region in a polycrystalline silicon film (not shown) for forming gate electrode 86, and the polycrystalline silicon film (not shown) is etched using resists 88 as a mask. By doing this, gate electrode 86 is formed.

Figure 41:
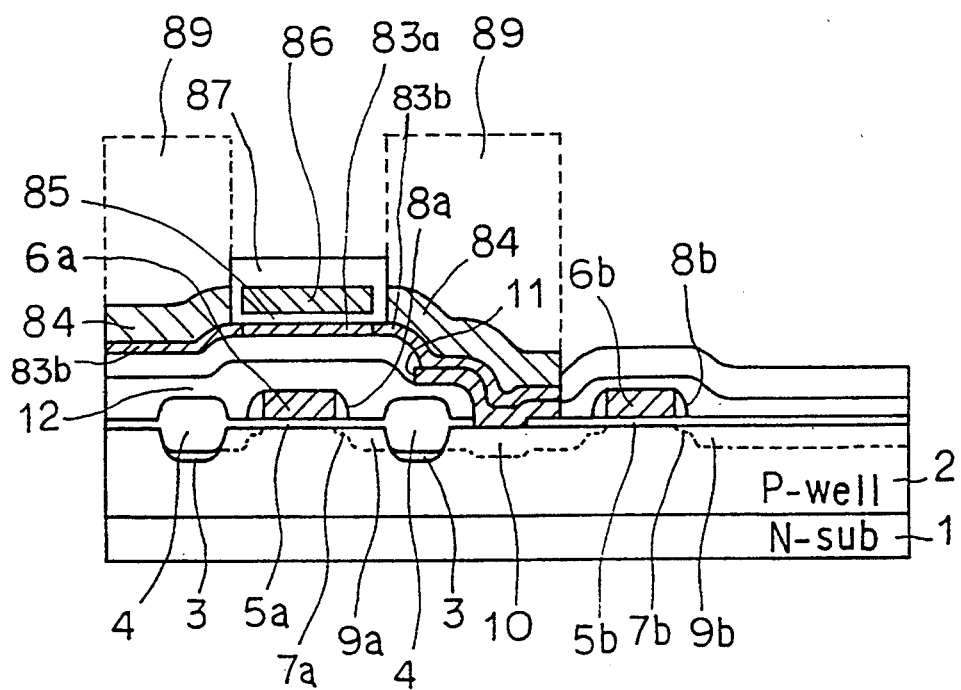
FIG. 41 is a sectional view for describing a third step of the manufacturing process of the semiconductor device illustrated in FIG. 38.

Next, as illustrated in FIG. 41, resist 88 (See FIG. 40) is removed, and then an oxide film 87 is formed to cover gate electrode 86. Specifically, oxide film 87 is formed on the whole surface, and then oxide film 87 (not shown) formed in source/drain regions is removed by photolithography and etching techniques. By doing this, oxide film 87 having a structure surrounding gate electrode 86 is formed. A second polycrystalline silicon film 84 is formed on the whole surface by a CVD process. Second polycrystalline silicon film 84 on channel region 83a is removed by photolithography and etching techniques. Specifically, resists 89 are formed on parts of polycrystalline silicon film 84 corresponding to the source/drain regions. Second polycrystalline silicon film 84 is etched using resists 89 as a mask to remove second polycrystalline silicon film 84 on channel region 83a. Resists 89 are removed, and then impurities are ion-implanted into first polycrystalline silicon films 83 and second polycrystalline silicon films 84 constituting the source/drain regions by an ion implantation process.

As described above, the TFT part according to the ninth embodiment illustrated in FIG. 38 is formed.

Figure 42:
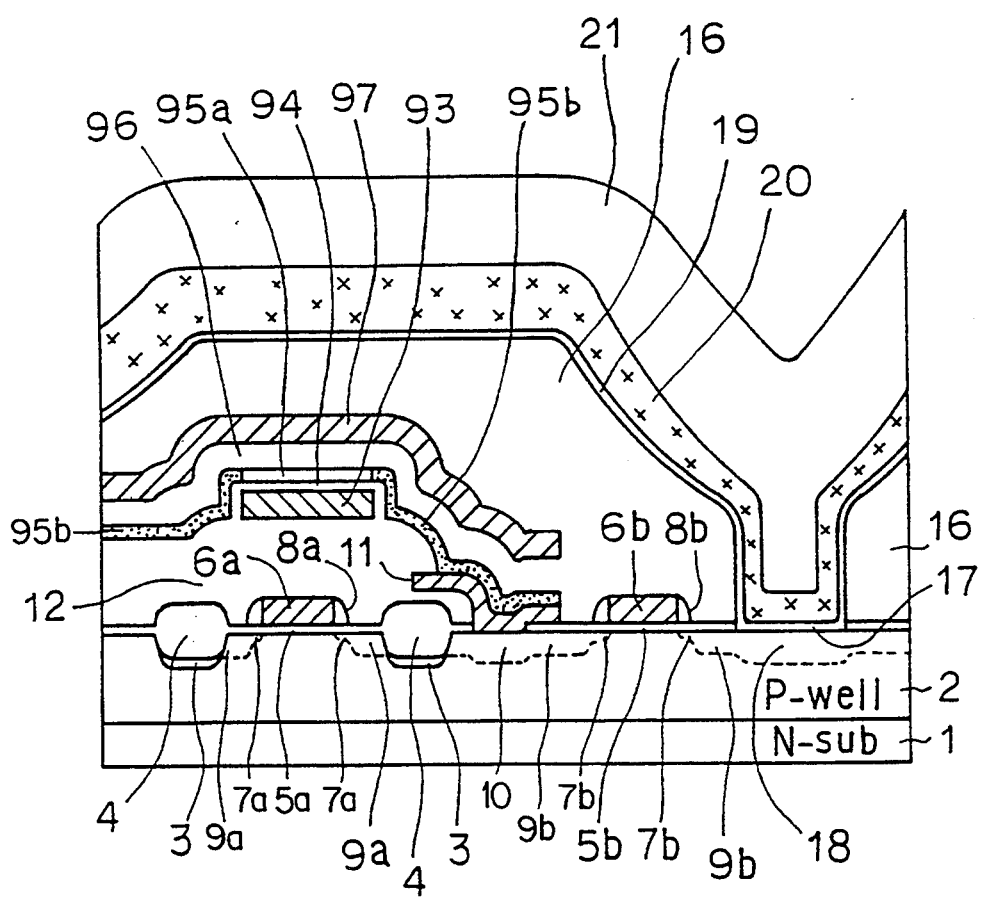
FIG. 42 is a sectional view of a semiconductor device having a TFT according to a tenth embodiment of the present invention.

Referring to FIG. 42, in a semiconductor device having a TFT according to a tenth embodiment, a channel region 95a is formed on a gate electrode 93 included in a TFT with a gate oxide film 94 interposed therebetween. A pair of source/drain regions 95b are formed with channel region 95a interposed therebetween. An interlayer insulating film 96 is formed to cover channel region 95a and source/drain regions 95b. A plasma nitride film 97 is formed by a plasma CVD process to cover interlayer insulating film 96.

Figure 61:
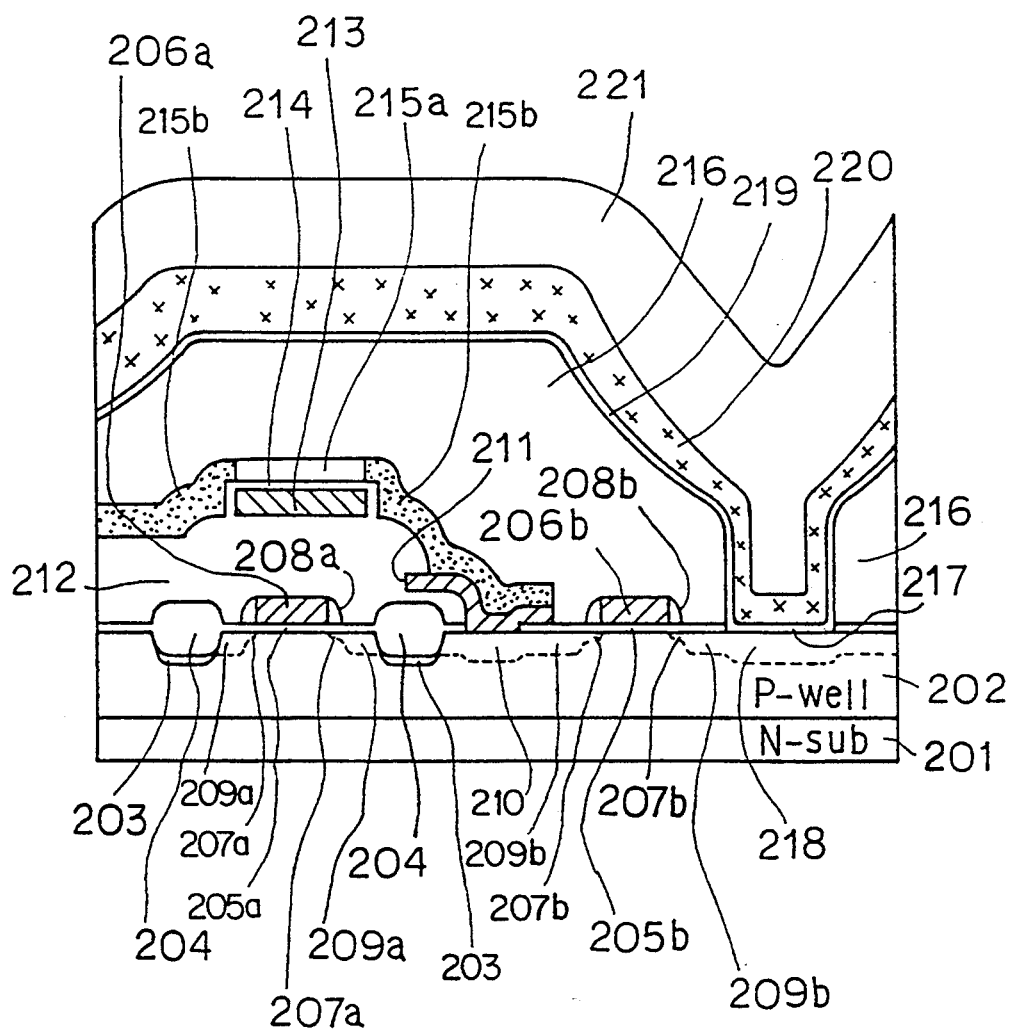
FIG. 61 is a sectional view of the semiconductor device illustrated in FIG. 60 taken along line 61—61.
Figure 62:
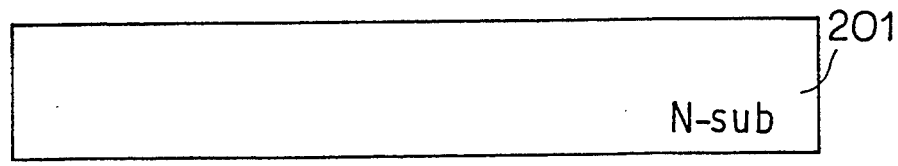
FIG. 62 is a sectional view for describing a first step of a manufacturing process of the semiconductor device illustrated in FIG. 61.
Figure 63:
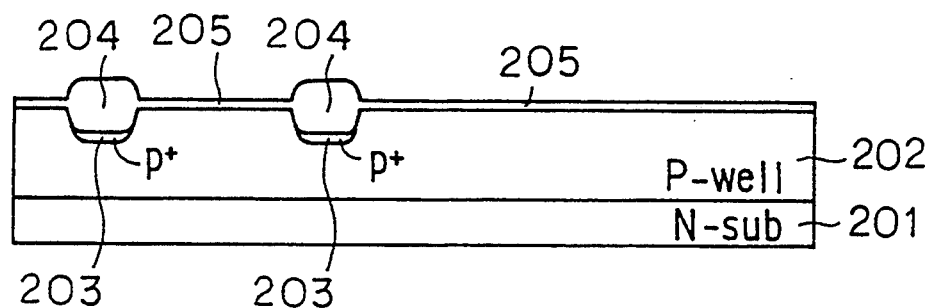
FIG. 63 is a sectional view for describing a second step of the manufacturing process of the semiconductor device illustrated in FIG. 61.
Figure 64:
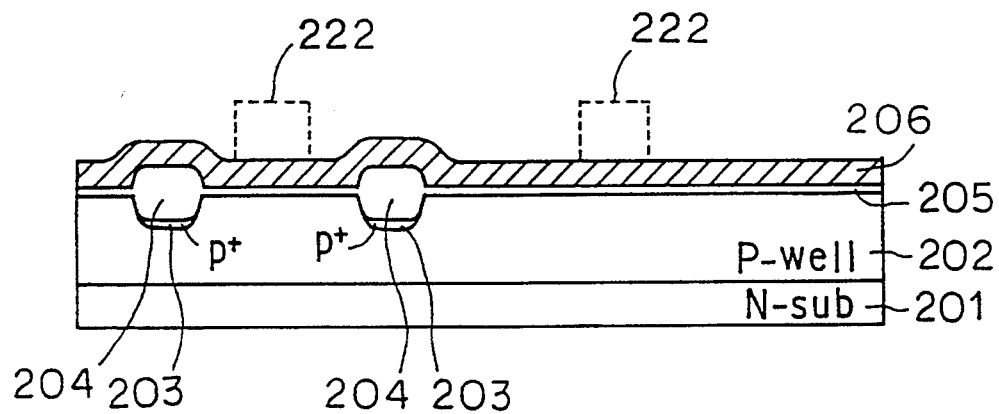
FIG. 64 is a sectional view for describing a third step of the manufacturing process of the semiconductor device illustrated in FIG. 61.
Figure 65:
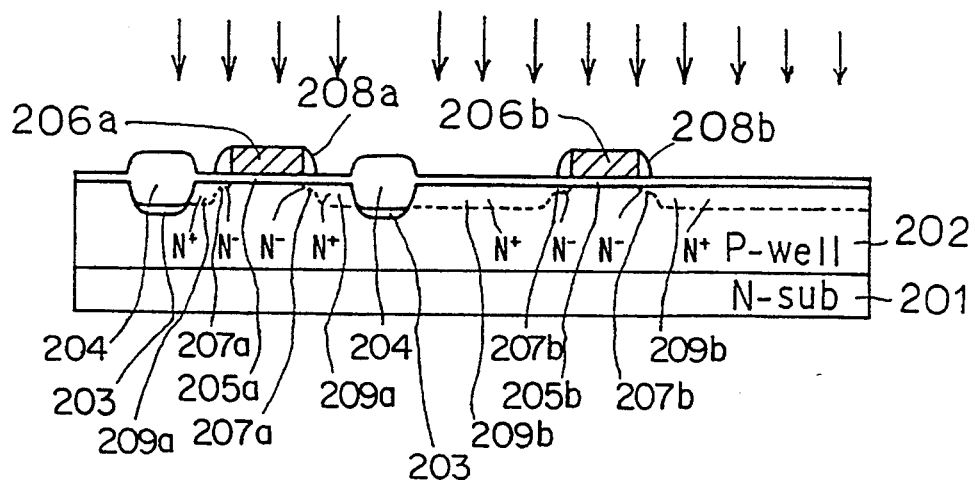
FIG. 65 is a sectional view for describing a fourth step of the manufacturing process of the semiconductor device illustrated in FIG. 61.
Figure 66:
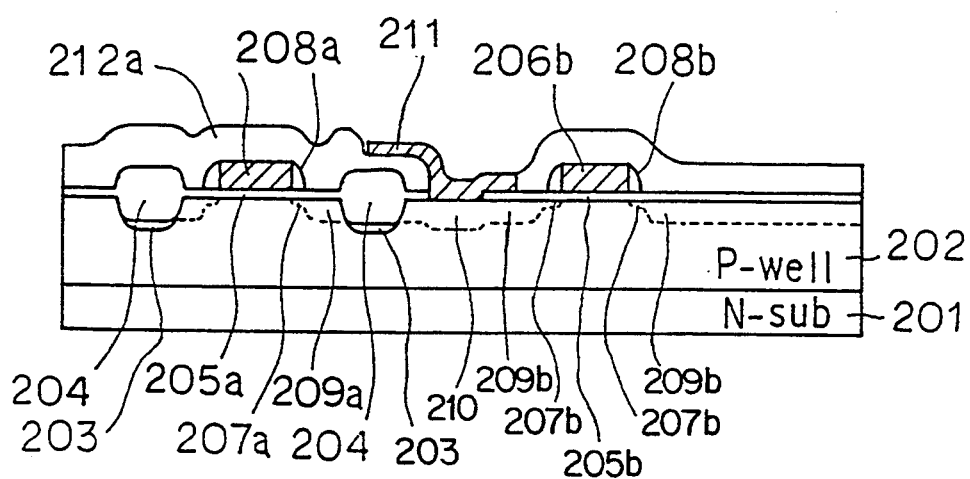
FIG. 66 is a sectional view for describing a fifth step of the manufacturing process of the semiconductor device illustrated in FIG. 61.
Figure 67:
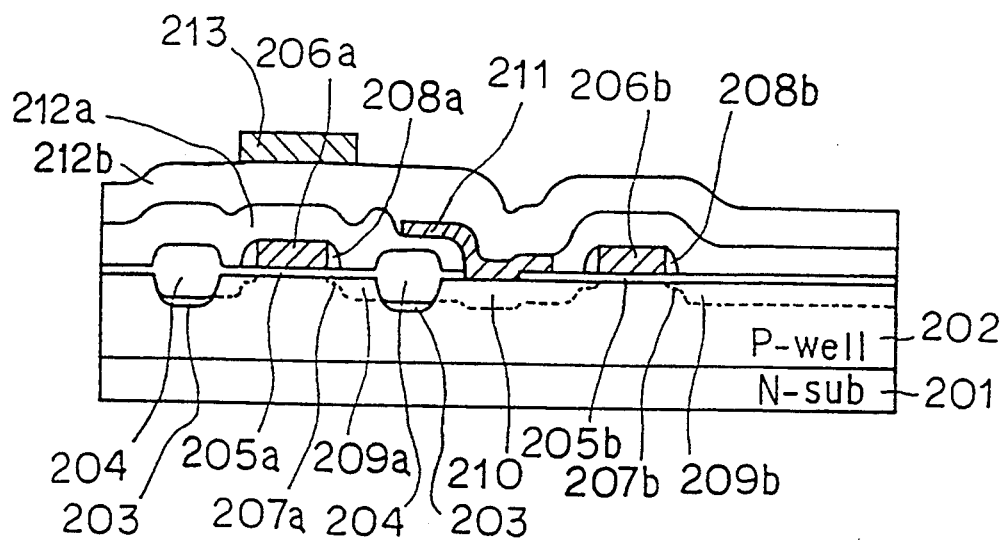
FIG. 67 is a sectional view for describing a sixth step of the manufacturing process of the semiconductor device illustrated in FIG. 61.
Figure 68:
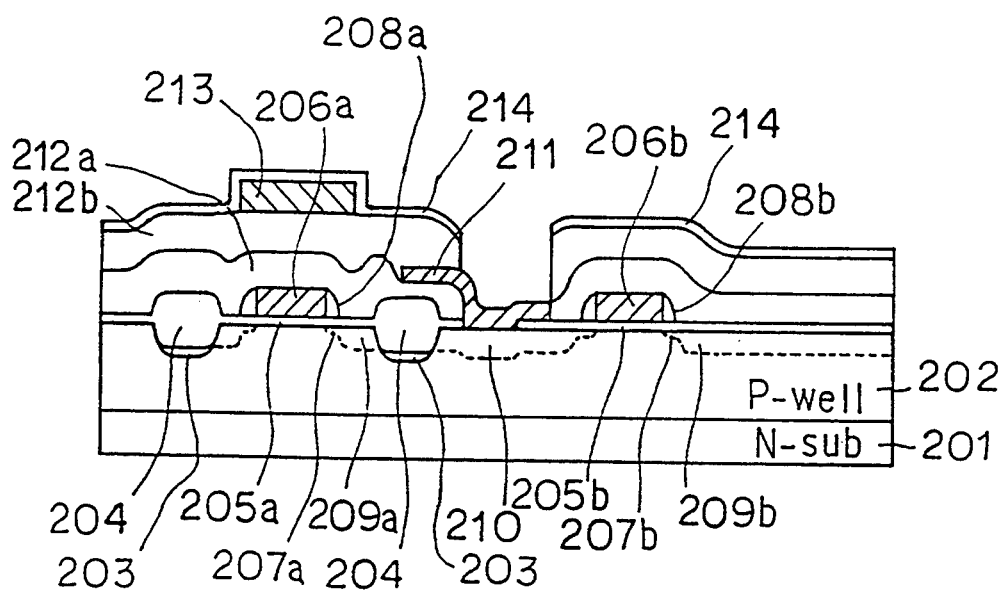
FIG. 68 is a sectional view for describing a seventh step of the manufacturing process of the semiconductor device illustrated in FIG. 61.
Figure 69:
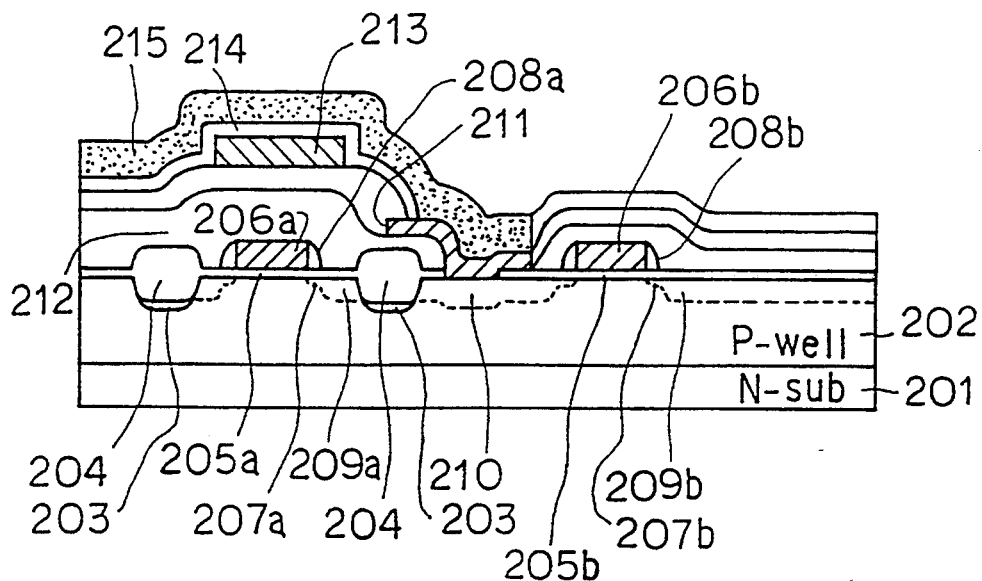
FIG. 69 is a sectional view for describing an eighth step of the manufacturing process of the semiconductor device illustrated in FIG. 61.
Figure 70:
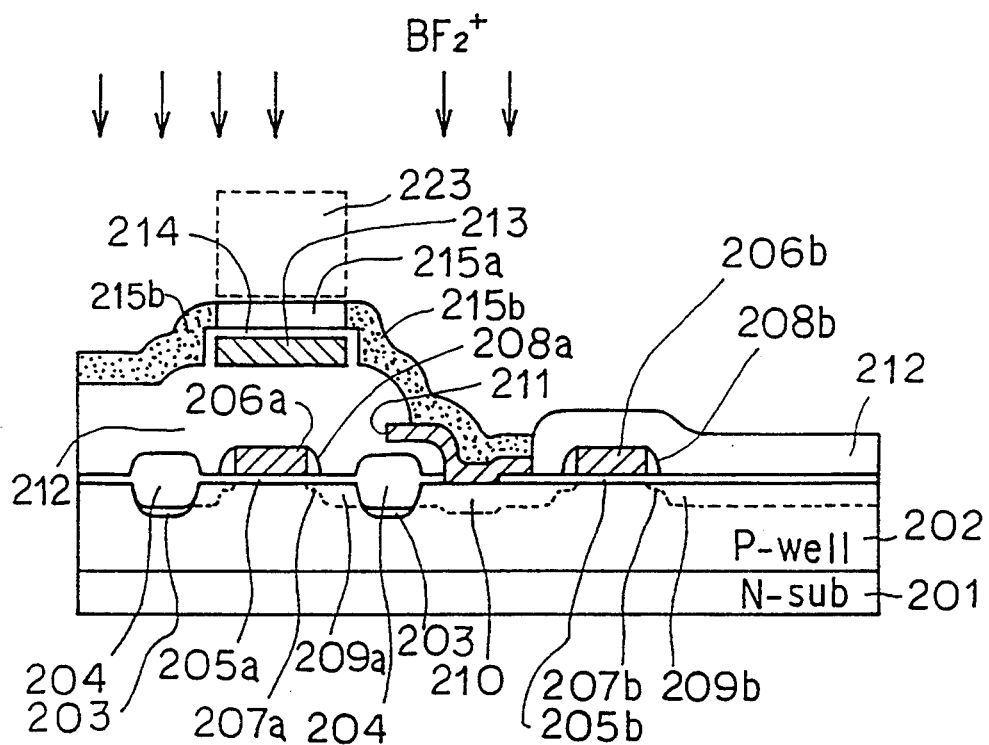
FIG. 70 is a sectional view for describing a ninth step of the manufacturing process of the semiconductor device illustrated in FIG. 61.
Figure 71:
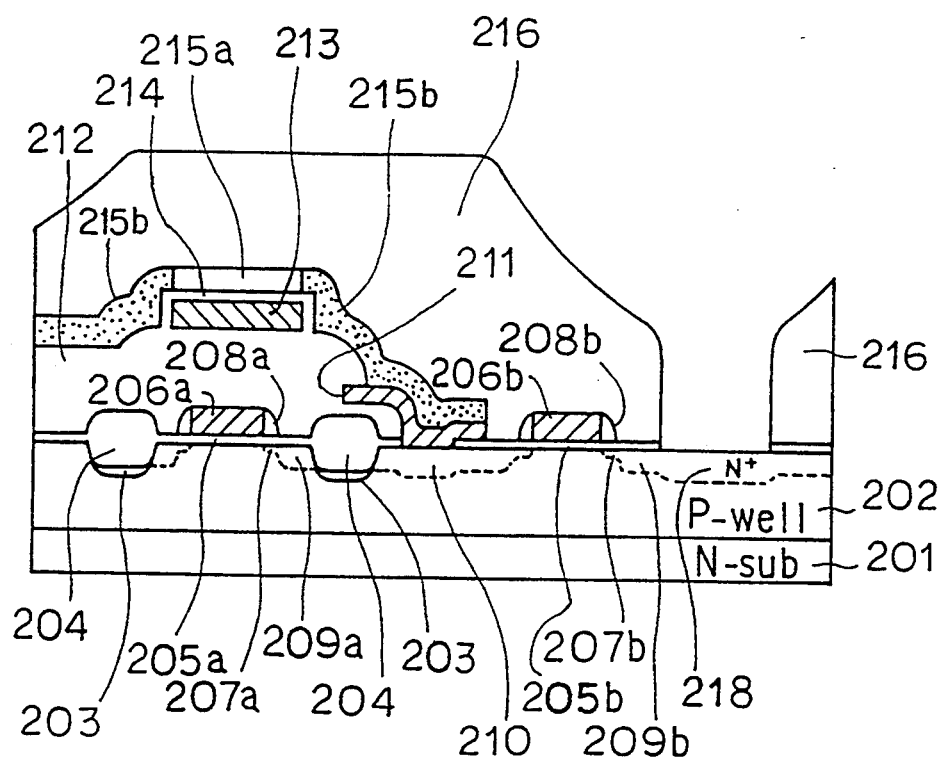
FIG. 71 is a sectional view for describing a tenth step of the manufacturing process of the semiconductor device illustrated in FIG. 61.
Figure 72:
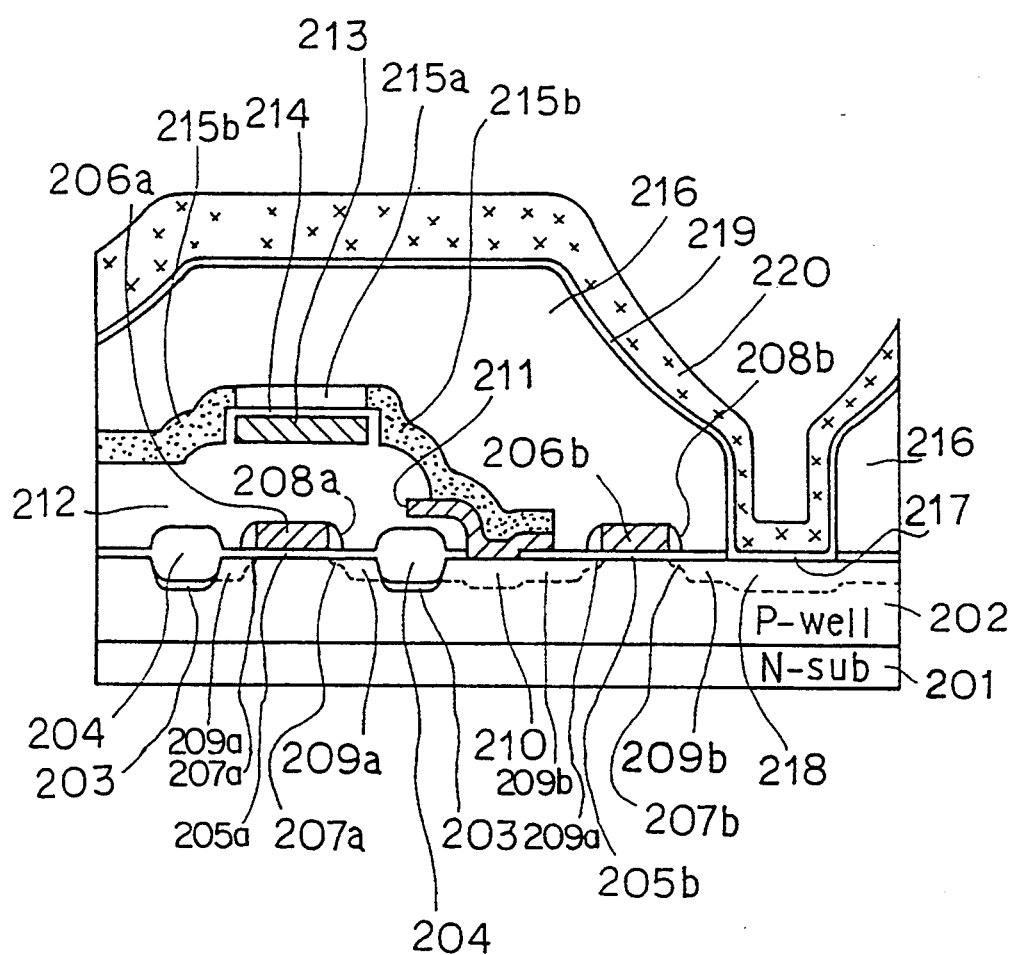
FIG. 72 is a sectional view for describing an eleventh step of the manufacturing process of the semiconductor device illustrated in FIG. 61.
Figure 73:
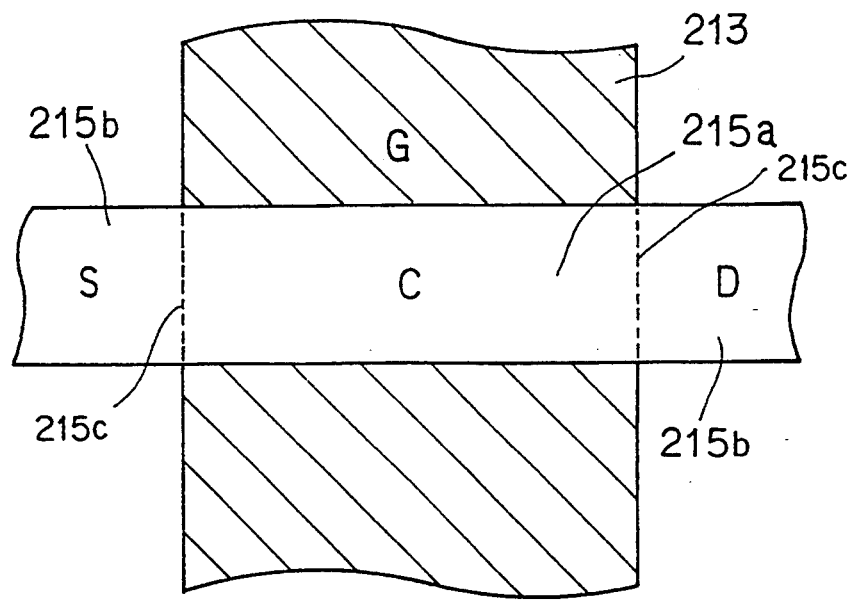
FIG. 73 is an enlarged plan view of the TFT part illustrated in FIG. 61.
Figure 74:
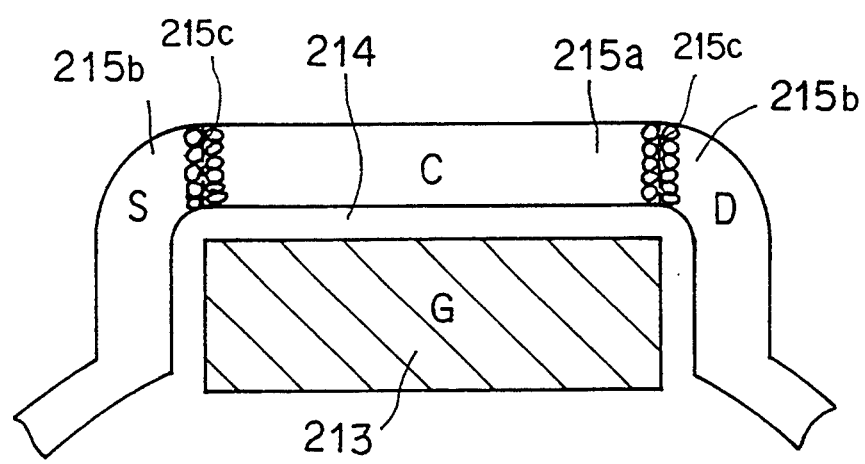
FIG. 74 is an enlarged sectional view of the TFT part illustrated in FIG. 73.

According to the tenth embodiment, channel region 95a and source/drain regions 95b of the TFT are the same as channel region 215a and source/drain regions 215b of the conventional TFT illustrated in FIG. 61.

Specifically, according to the tenth embodiment, it is possible to reduce the leakage current on the occasion when the TFT is OFF and to lower the resistance of an interconnection layer connected to source/drain regions 95b without changing the thickness and the length in the channel width direction of channel region 95a. Specifically, as described in the following, it is possible to achieve the above-described effects by reaction in the grain boundary of polycrystalline silicon included in channel region 95a and source/drain regions 95b caused on the occasion of formation of plasma nitride film 97.

Referring to FIGS. 42 to 48, a manufacturing process according to the tenth embodiment will be described.

First, the process up to the step of forming a channel region 95a and source/drain regions 95b is the same as the manufacturing process of the conventional semiconductor device having a TFT illustrated in FIGS. 62 to 70.

Figure 43:
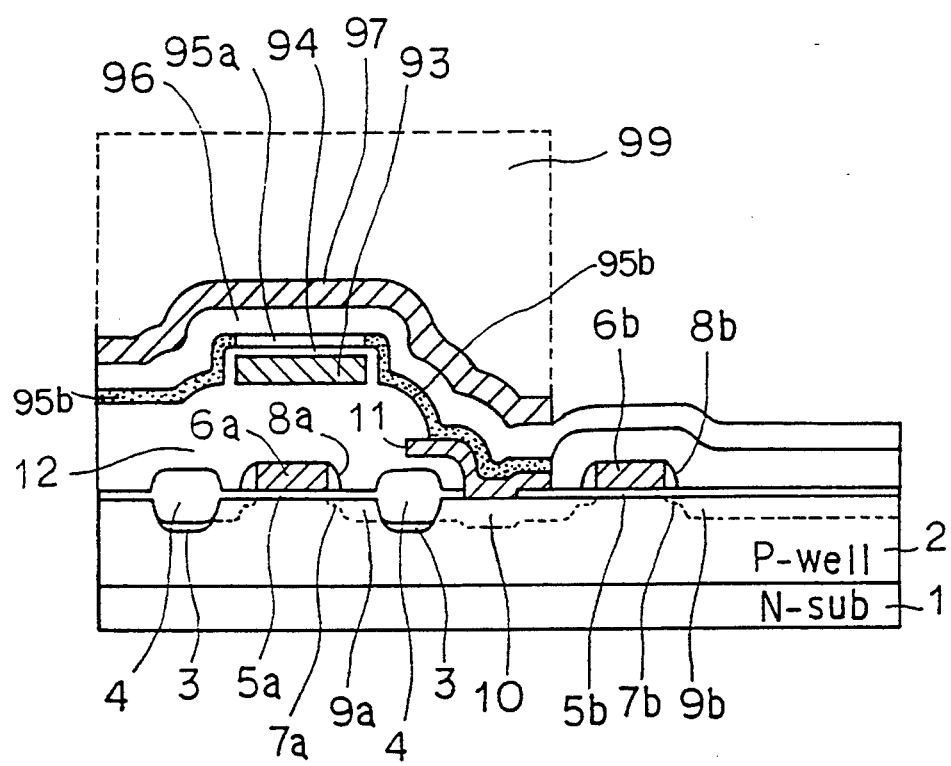
FIG. 43 is a sectional view for describing a manufacturing process of the semiconductor device illustrated in FIG. 42.

Next, as illustrated in FIG. 43, an interlayer insulating film 96 is formed to cover the whole surface. Then, a plasma insulating film (a plasma nitride film, a plasma oxide film, or the like) 97 is formed to cover the whole surface using a plasma CVD process. A resist 99 is formed on plasma insulating film 97 in a part positioned above a region where a TFT is formed. Plasma insulating film 97 is etched using resist 99 as a mask to remove plasma insulating film 97 except the part corresponding to the TFT.

Figure 44:
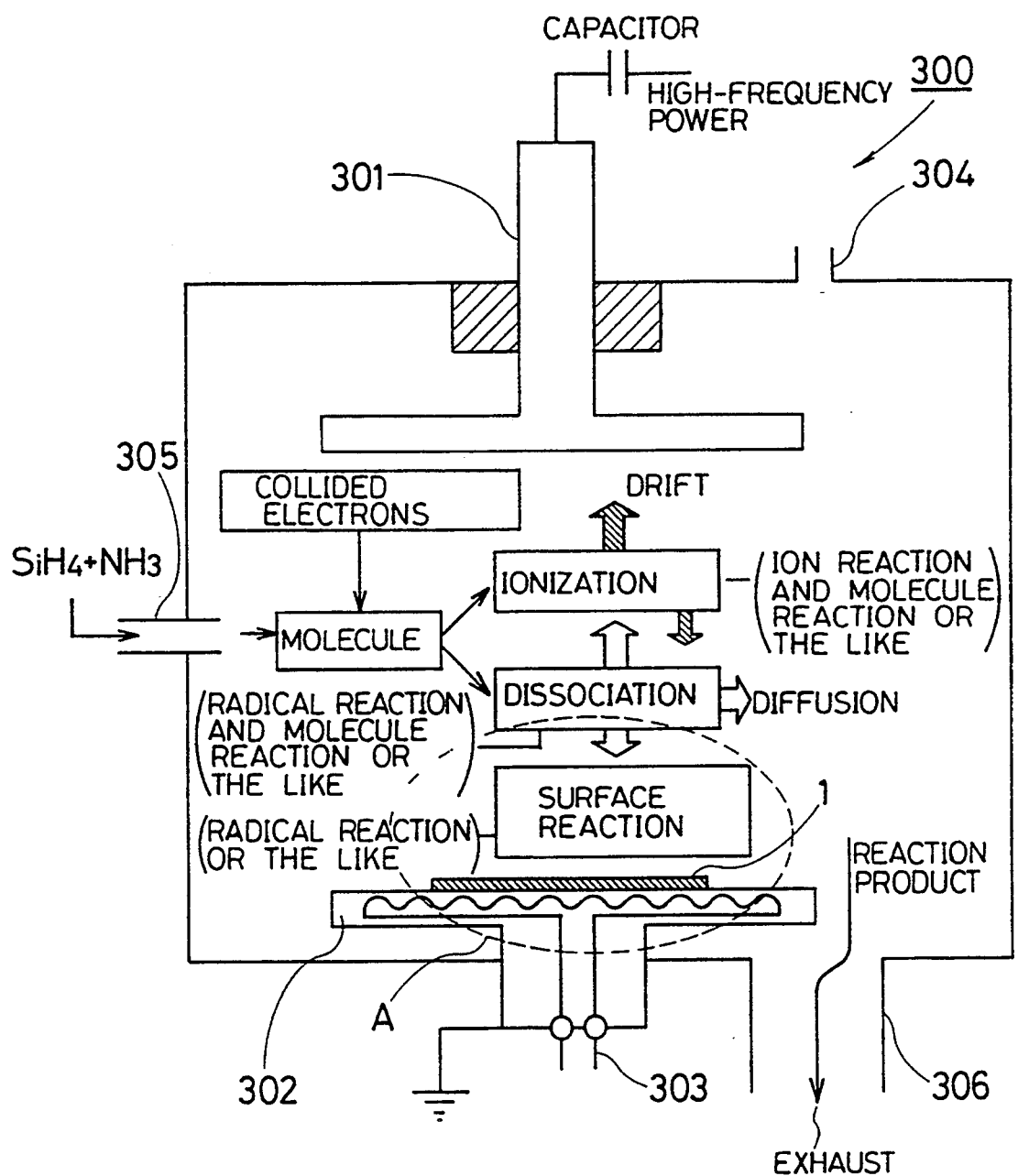
FIG. 44 is a schematic diagram illustrating a plasma CVD apparatus for forming the plasma insulating film (a nitride film) illustrated in FIG. 42.
Figure 45:
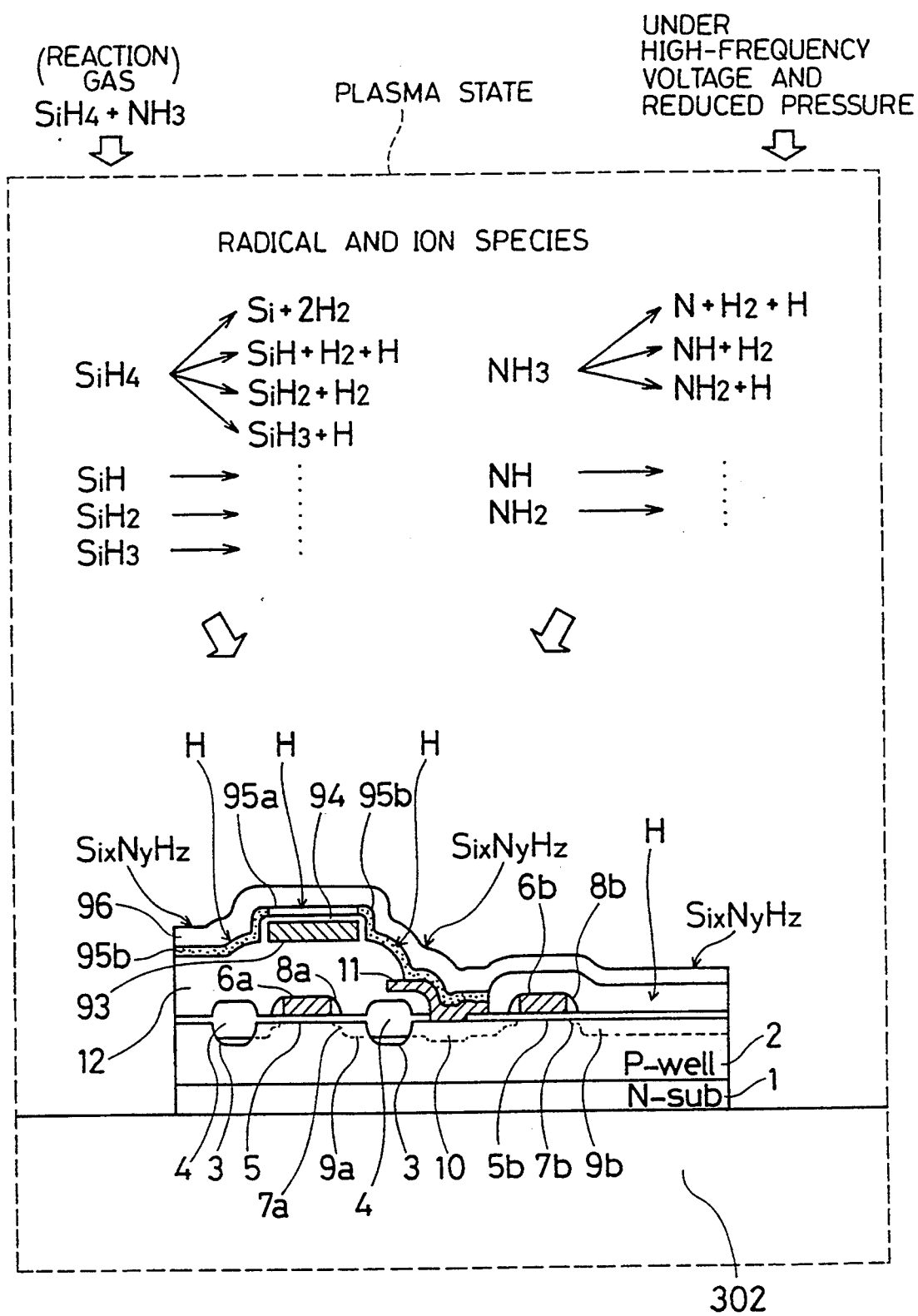
FIG. 45 is a cross sectional view illustrating the part A in the plasma apparatus illustrated in FIG. 44 enlarged for explaining introduction of hydrogen radicals H in formation of a plasma insulating film.

Now, referring to FIGS. 44 and 45, details of a plasma CVD apparatus and a method of forming plasma nitride film 97 by using the apparatus will be described. First, referring to FIG. 44, a plasma CVD apparatus 300 used in this embodiment includes an electrode 301 to which high-frequency power is applied through a capacitor, a substrate holder 302 for holding a semiconductor-substrate 1 on which a plasma insulating film is to be formed, a heater 303 buried in substrate holder 302 for heating substrate holder 302, a pressure gage 304 for detecting the pressure in plasma CVD apparatus 300, a reaction gas port 305 through which a reaction gas is introduced, and an exhaust port 306 through which a reaction product is exhausted. The principle of formation of a plasma insulating film using such plasma CVD apparatus 300 mainly utilizes a chemical reaction in a plasma state. Specially, excited species produced by discharge are reacted to deposit a thin film. More specifically, a reaction gas (in the case of a plasma nitride film, $SiH_4 + NH_3$) introduced through reaction gas port 305 is ionized or dissociated by the impact of collision of electrons. This causes particles such as atoms, radicals, various molecules, and atomic ions to be produced. These particles reach the surface of semiconductor substrate 1 mainly by diffusion. Specifically, the reaction gas ($SiH_4$, $NH_3$) causes a reaction as illustrated in FIG. 45. Then, particles produced by that reaction are diffused to deposit a plasma nitride film having composition of $Si_xN_yH_z$ on interlayer insulating film 96. At the same time, hydrogen radicals H in the above generated particles pass through interlayer insulating film 96 to invade the polycrystalline film constituting channel region 95a and source/drain regions 95b.

Conditions of plasma CVD in formation of plasma insulating film (plasma nitride film) 97 are as follows: the temperature is about 300° C., the pressure is about 2.5 Torr, the RF power is in the range of 250 W to 500 W, and the reaction gas is $SiH_4/NH_3$ (in the case of a plasma nitride film).

Figure 48:
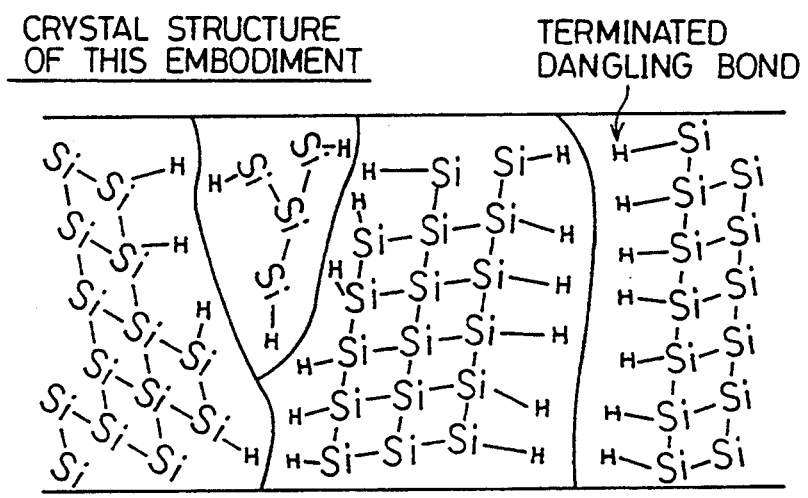
FIG. 48 is a typical view illustrating a crystal state of a polycrystalline silicon film constituting the TFT illustrated in FIG. 42.

If plasma insulating film 97 is formed under the conditions as described above, the polycrystalline silicon film constituting channel region 95a and source/drain regions 95b comes to have crystal structure as illustrated in FIG. 48. Specifically, hydrogen radicals H generated in plasma apparatus 300 during formation of plasma insulating film 97 fill dangling bonds positioned in the vicinity of the grain boundary of the polycrystalline silicon. It is possible to reduce the leakage current flowing in the grain boundary by combination of the hydrogen radicals (H) and silicon (Si).

Figure 46:
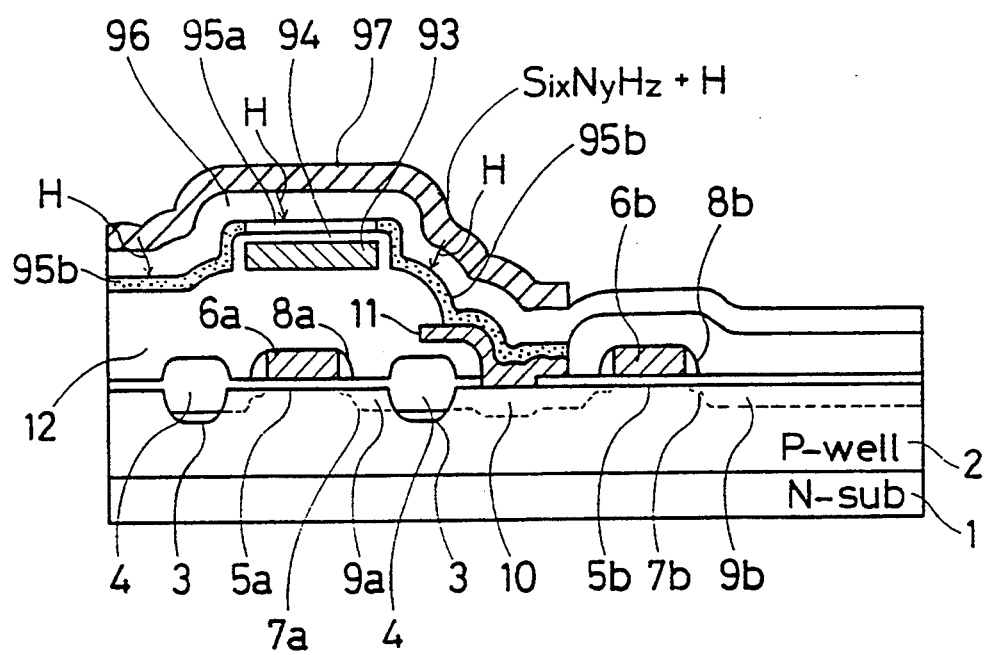
FIG. 46 is a cross sectional view for explaining introduction of hydrogen radicals H after formation of a plasma insulating film.
Figure 47:
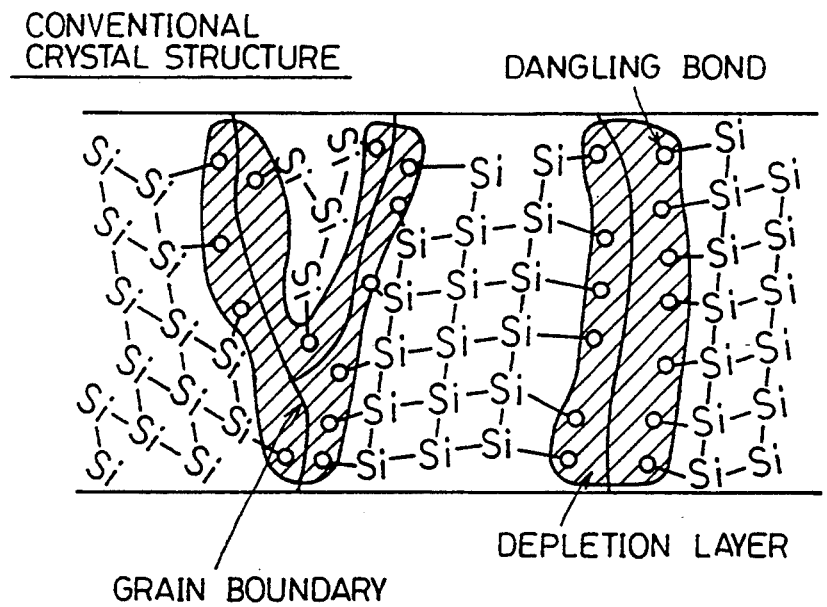
FIG. 47 is a typical view illustrating a crystal state of a polycrystalline silicon film constituting a conventional TFT.

As the pressure is higher in the condition of plasma CVD, hydrogen radicals are more liable to be generated. In addition, as the flow rate of $SiH_4$ is larger, hydrogen radicals are more liable to be generated. Furthermore, Si—H is more liable to be dissociated than N—H. The crystal structure of channel region 95a and source/drain regions 95b becomes more approximate to the silicon substrate because of combination of hydrogen radicals and Si (silicon) as illustrated in FIG. 48. As a result, it is possible to increase the current on the occasion when the TFT is ON as compared to the one in the conventional crystal structure illustrated in FIG. 47. It is possible to enhance the current driving capability of the TFT by this. In a case where passivation film (PSG film) 21 formed on aluminum interconnection 20 is formed by a plasma CVD, the quality of the polycrystalline silicon film constituting channel region 105a and source/drain regions 105b is further improved by the function of hydrogen radicals. In addition, as illustrated in FIG. 46, there are hydrogen radicals H in nitride film 97 formed by the plasma CVD apparatus, so that hydrogen radicals H in plasma nitride film 97 also pass through interlayer insulating film 96 to invade the polycrystalline silicon film constituting channel region 95a and source/drain regions 95b after formation of plasma nitride film 97. Thus, hydrogen radicals H are introduced into the polycrystalline silicon film constituting the TFT during and after formation of plasma nitride film 97.

Figure 49:
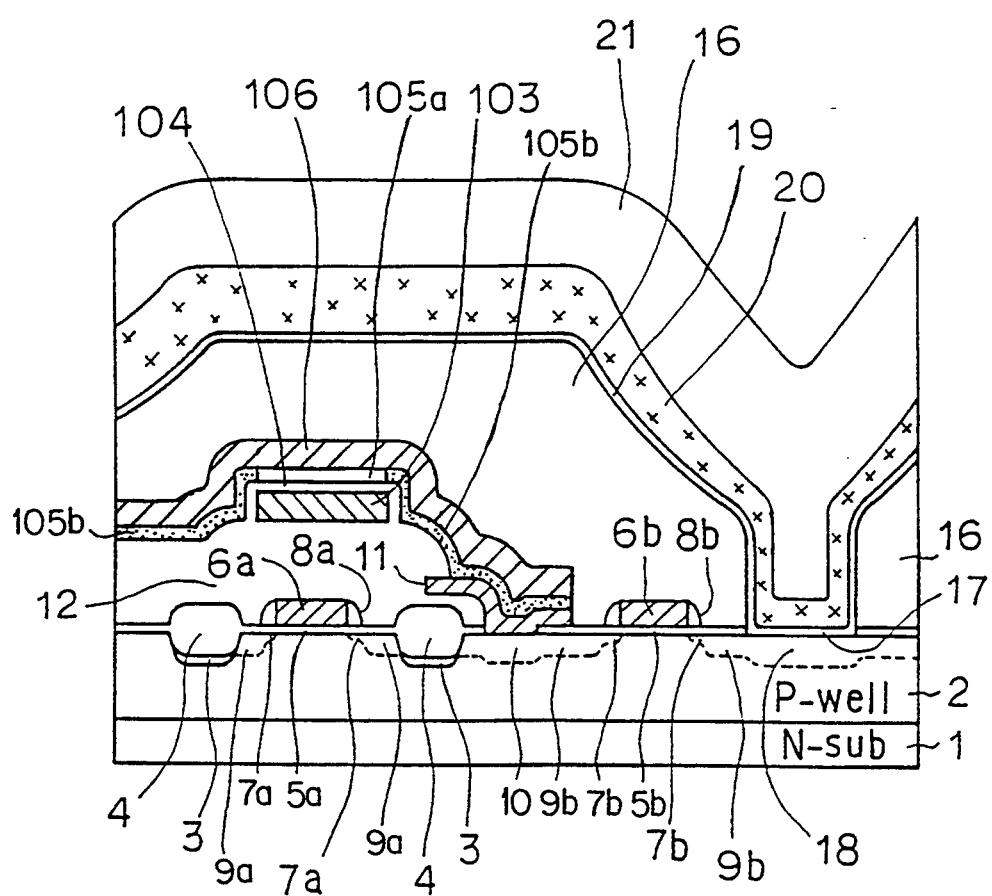
FIG. 49 is a sectional view of a semiconductor device having a TFT according to an eleventh embodiment of the present invention.

Referring to FIG. 49, according to an eleventh embodiment, a channel region 105a is formed on a gate electrode 103 included in a TFT with a gate oxide film 104 interposed therebetween. A pair of source/drain regions 105b are formed with channel region 105a interposed therebetween.

Now, channel region 105a and source/drain regions 105b according to the eleventh embodiment are the same as channel region 215a and source/drain regions 215b in the conventional TFT part illustrated in FIG. 61.

A plasma insulating film 106 is formed to adhere onto channel region 105a and source/drain regions 105b. In a case where plasma insulating film 106 is thus formed to adhere onto channel region 105a and source/drain regions 105b, it is possible to achieve the same or higher effects as compared to the tenth embodiment illustrated in FIG. 42. In the eleventh embodiment, in a case where passivation film (PSG film) 21 formed on aluminum interconnection 20 is formed by a plasma CVD process, the quality of the polycrystalline silicon film constituting channel region 105a and source/drain regions 105b is further improved by the function of hydrogen radicals as in the tenth embodiment.

Figure 50:
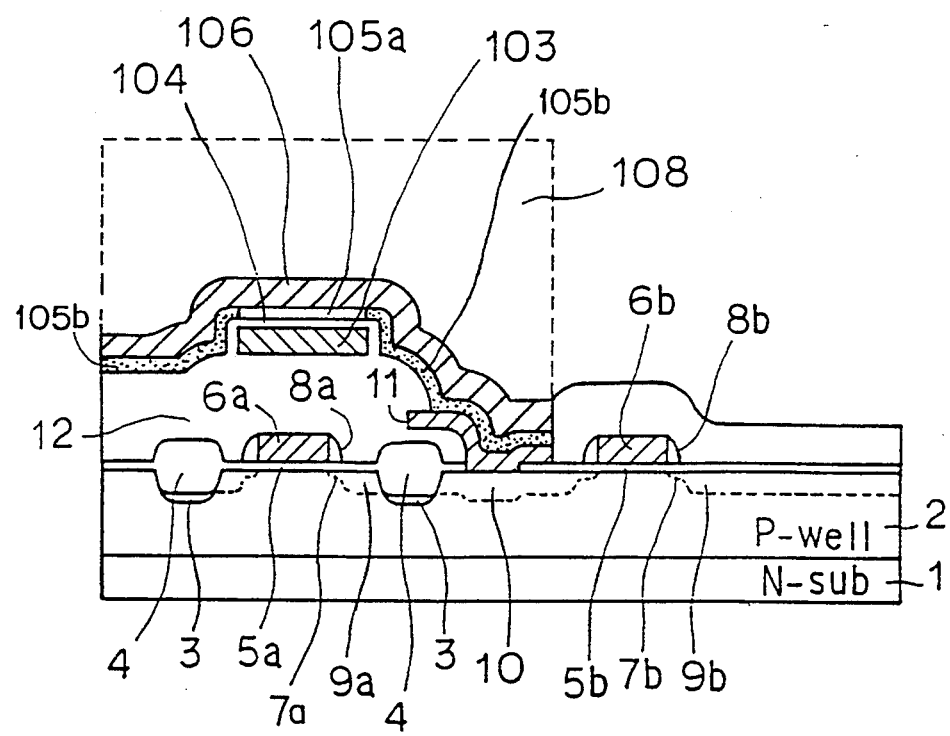
FIG. 50 is a sectional view for describing a manufacturing process of the semiconductor device illustrated in FIG. 49.

Referring to FIG. 50, the condition and method of forming plasma insulating film 106 according to the eleventh embodiment are the same as the condition and method described with reference to FIG. 43. Specifically, plasma insulating film 106 is formed on channel region 105a and source/drain regions 105b under the condition of plasma CVD described with reference to FIG. 43. A resist 108 is formed on a part of plasma insulating film 106 corresponding to the TFT. Plasma insulating film 106 is etched using resist 108 as a mask to remove plasma insulating film 106 except for the part corresponding to the TFT. The TFT part according to the eleventh embodiment is thus formed.

Figure 51:
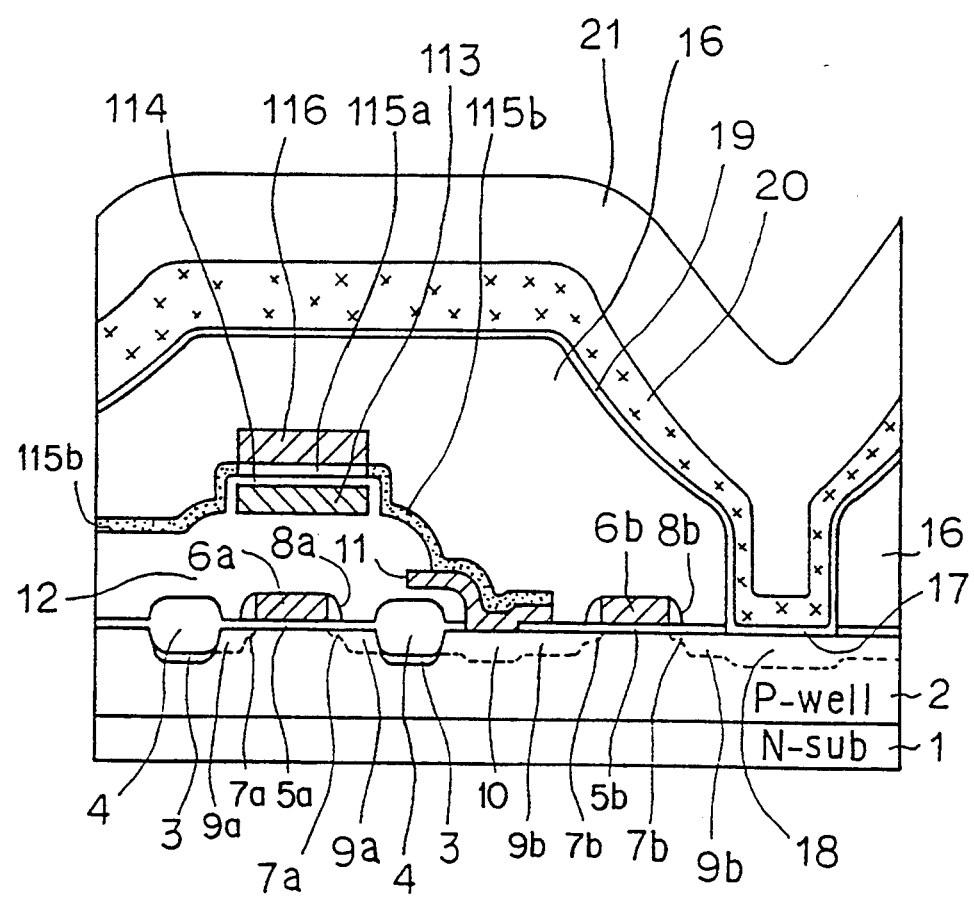
FIG. 51 is a sectional view of a semiconductor device having a TFT according to a twelfth embodiment of the present invention.

Referring to FIG. 51, according to a twelfth embodiment, a channel region 115a is formed on a gate electrode 113 included in a TFT with a gate oxide film 114 interposed therebetween. Source/drain regions 115b are formed with channel region 115a interposed therebetween. A plasma insulating film 116 is formed on channel region 115a.

Channel region 115a and source/drain regions 115b according to the twelfth embodiment are the same as channel region 215a and source/drain regions 215b in the conventional TFT part illustrated in FIG. 61.

It is also possible to achieve the same effects as in the tenth embodiment illustrated in FIG. 42 and the eleventh embodiment illustrated in FIG. 49 by forming plasma insulating film 116 only on channel region 115a.

Figure 52:
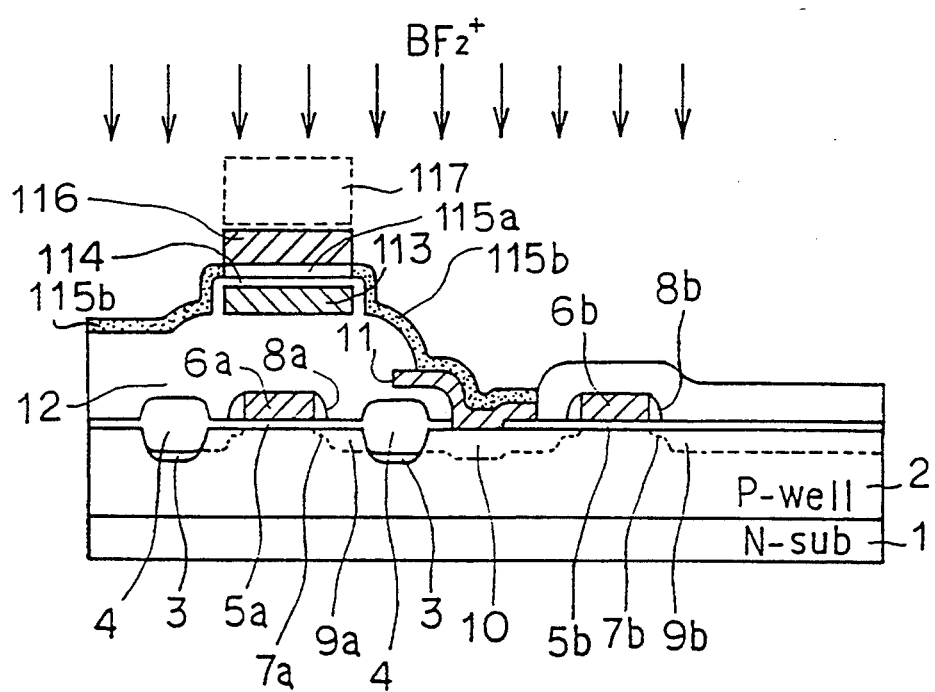
FIG. 52 is a sectional view for describing a manufacturing process of the semiconductor device illustrated in FIG. 51.

Referring to FIG. 52, in a manufacturing process according to the twelfth embodiment, a channel region 115a and source/drain regions 115b are formed first by the same process as the conventional one. Then, a plasma insulating film (plasma nitride film) 116 is formed by a plasma CVD process. A resist 117 is formed on a part of plasma insulating film 116 corresponding to channel region 115a. Plasma insulating film 116 is etched using resist 117 and a mask to remove plasma insulating film 116 except for the part formed on channel region 115a. Then, impurities (BF$_2$+) are ion-implanted into source/drain regions 115b using resist 117 as a mask. The TFT part of the semiconductor device according to the twelfth embodiment is thus formed.

Figure 53:
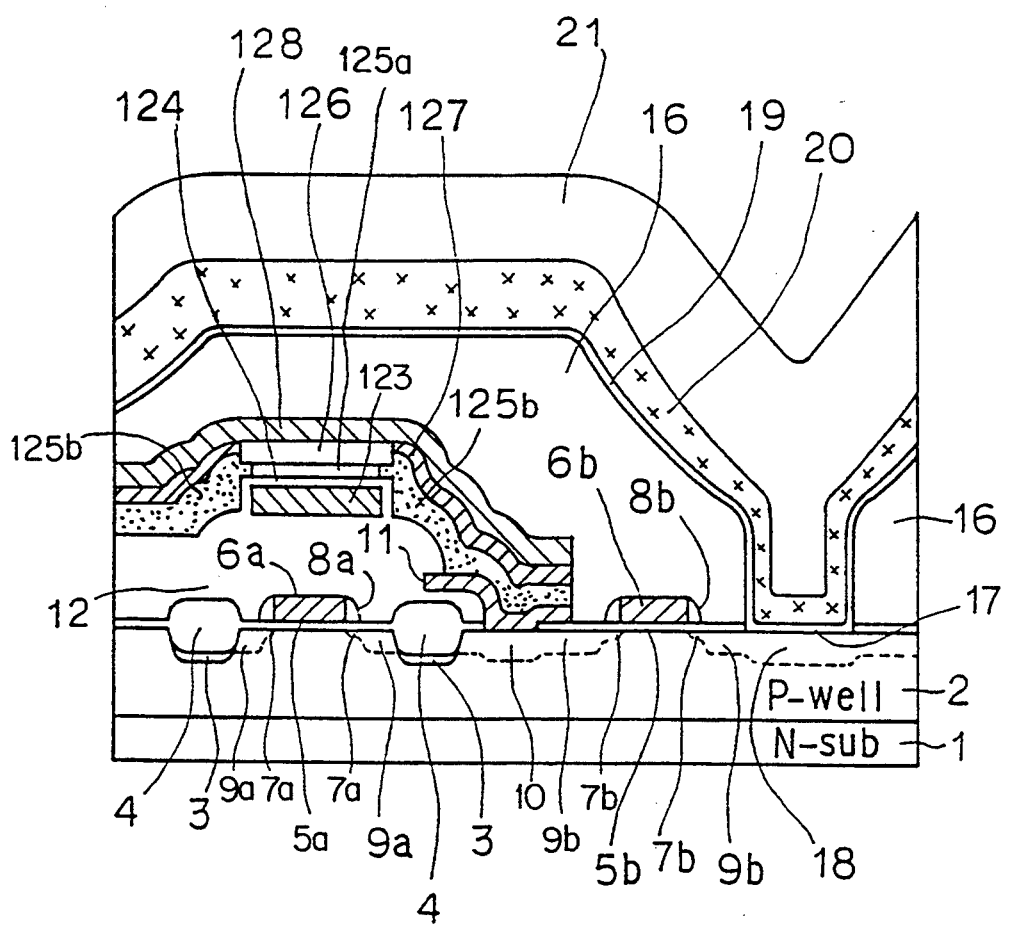
FIG. 53 is a sectional view of a semiconductor device having a TFT according to a thirteenth embodiment of the present invention.

Referring to FIG. 53, according to a thirteenth embodiment, a channel region 125a is formed on a gate electrode 123 included in a TFT with a gate oxide film 124 interposed therebetween. A pair of source/drain regions 125b are formed with channel region 125a interposed therebetween. A thermally oxidized film 126 is formed on channel region 125a. Silicon nitride films 127 are formed on source/drain regions 125b. A plasma nitride film 128 is formed on silicon nitride films 127 and thermally oxidized film 126.

The semiconductor device according to the thirteenth embodiment has a structure such as a combination of the third embodiment illustrated in FIG. 19 and the eleventh embodiment illustrated in FIG. 49. Specifically, the thickness and the length in the channel width direction of channel region 125a are made to be smaller than the thickness and the length in the channel width direction of source/drain region 125b. In addition, plasma nitride film 128 is formed on channel region 125a and source/drain regions 125b. Thus, in the thirteenth embodiment, the sectional area in the channel width direction of channel regions 125a is made smaller than the sectional area in the channel width direction of source/drain region 125b, and plasma nitride film 128 is formed, so that the effect that the leakage current is reduced on the occasion when the TFT is OFF is further enhanced.

Figure 54:
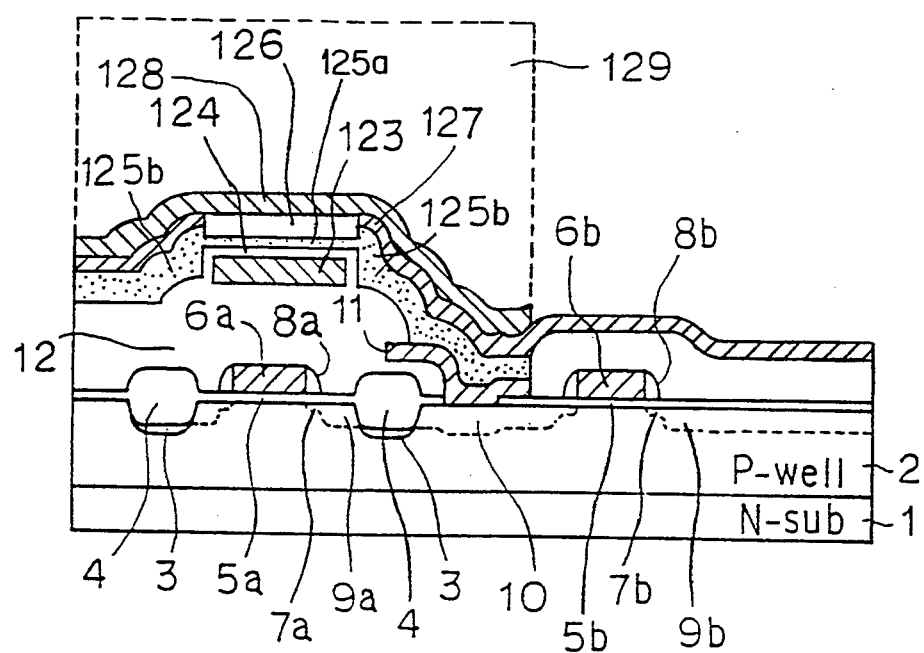
FIG. 54 is a sectional view for describing a manufacturing process of the semiconductor device illustrated in FIG. 53.

Referring to FIG. 54, in a manufacturing process according to the thirteenth embodiment, the process up to the step of forming a thermally oxidized film 126 using a silicon nitride film 127 as a mask is the same as the manufacturing process according to the third embodiment illustrated in FIGS. 20 to 22. Then, a plasma insulating film 121 is formed by a plasma CVD process. A resist 129 is formed in a region on the plasma insulating film above the region where a TFT is formed. Plasma insulating film 128 is etched using resist 129 as a mask to remove plasma insulating film 128 except for the region where the TFT is formed. The condition of forming plasma insulating film 128 is the same as the condition of plasma CVD described with reference to FIG. 43.

Figure 55:
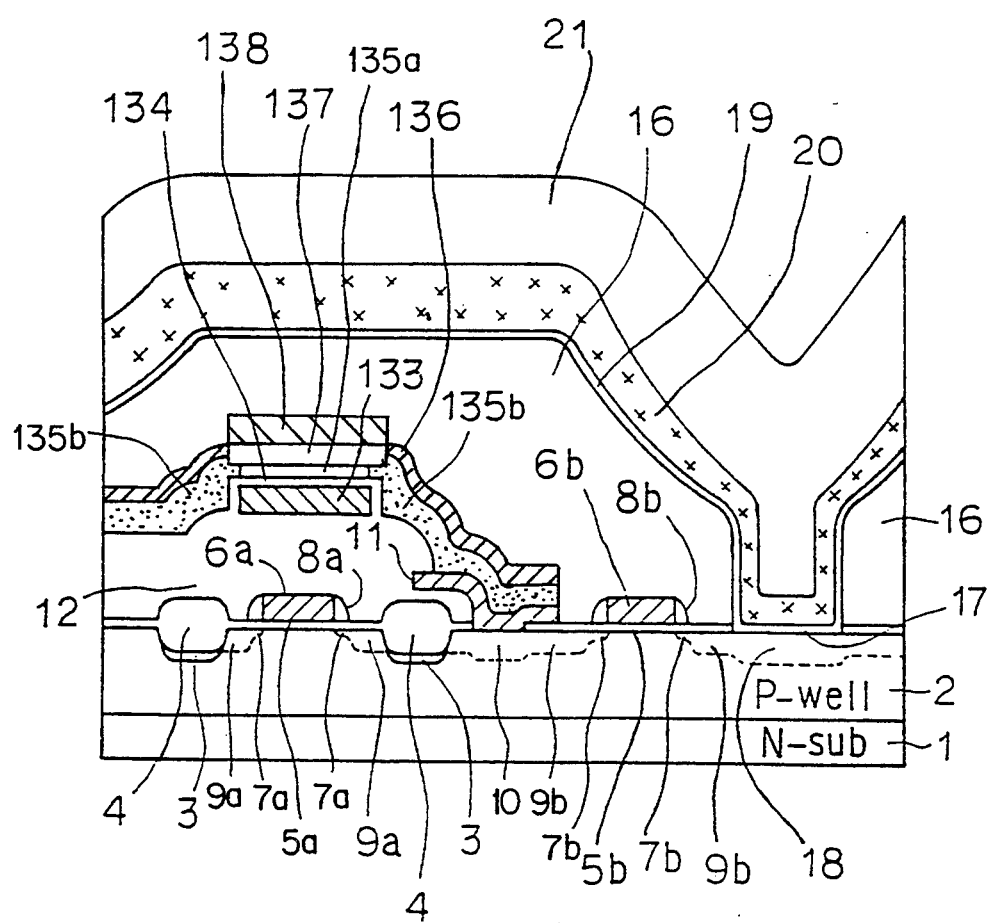
FIG. 55 is a sectional view of a semiconductor device having a TFT according to a fourteenth embodiment of the present invention.

Referring to FIG. 55, according to a fourteenth embodiment, a channel region 135a is formed on a gate electrode 133 with a gate oxide film 134 interposed therebetween. Source/drain regions 135b are formed with channel region 135a interposed therebetween. A thermally oxidized film 137 is formed on channel region 135a. A plasma insulating film (plasma nitride film) 138 is formed on thermally oxidized film 137. Silicon nitride films 136 are formed on source/drain regions 135b.

As described above, the semiconductor device according to the fourteenth embodiment has a structure such as a combination of the third embodiment illustrated in FIG. 19 and the twelfth embodiment illustrated in FIG. 51. It is possible to achieve further reduction of the leakage current on the occasion when the TFT is OFF by reducing the thickness and the length in the channel width direction of channel region 135a and combining it with plasma insulating film 138.

Figure 56:
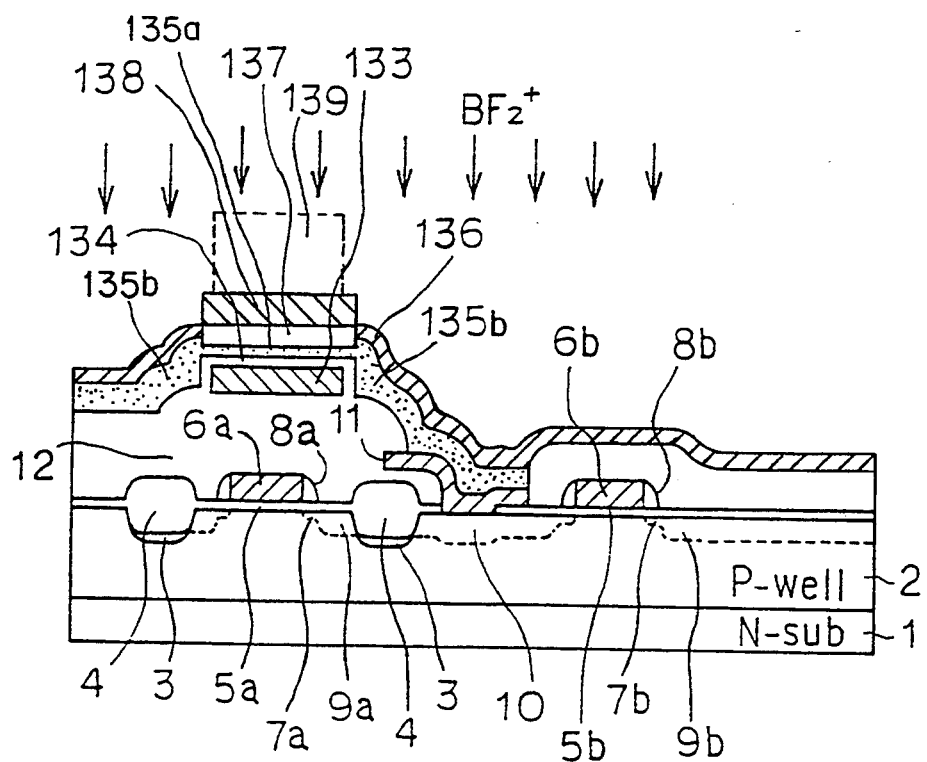
FIG. 56 is a sectional view for describing a manufacturing process of the semiconductor device illustrated in FIG. 55.

Referring to FIG. 56, the process up to the step of forming a thermally oxidized film 137 using a silicon nitride films 136 as a mask is the same as the manufacturing process according to the third embodiment illustrated in FIGS. 20 to 22. Then, a plasma insulating film 138 is formed under the condition of plasma CVD described with reference to FIG. 43. A resist 139 is formed in a region on plasma insulating film 138 on thermally oxidized film 137. Plasma insulating film 138 is etched using resist 139 as a mask to leave plasma insulating film 138 only on thermally oxidized film 137. Then, impurities (BF$_2$) are ion-implanted into source/drain regions 135b using resist 139 as a mask. At this time, silicon nitride film 136 lessens the implantation energy, so that it is possible to increase the implantation energy into source/drain regions 135b. It is possible to reduce the time required for ion implantation by this. The semiconductor device having TFT according to the fourteenth embodiment is thus formed.

Figure 57:
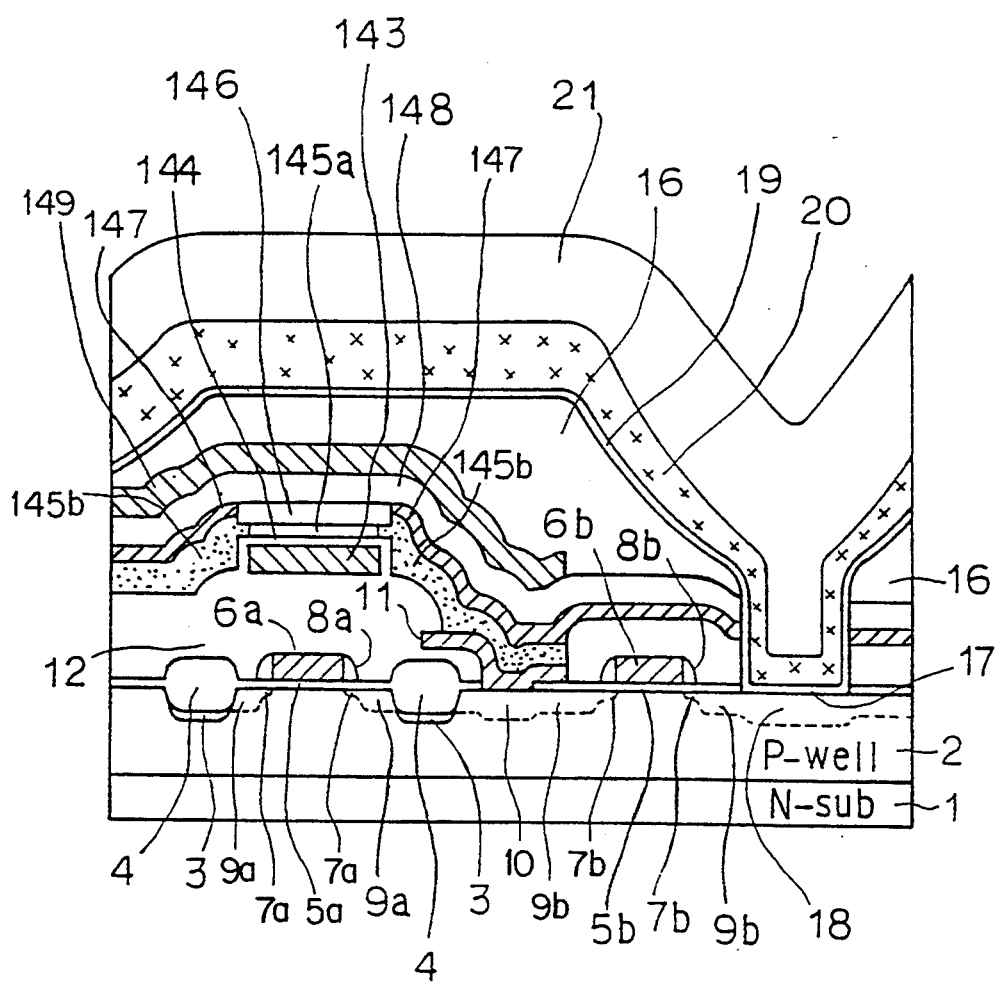
FIG. 57 is a sectional view of a semiconductor device having a TFT according to a fifteenth embodiment of the present invention.

Referring to FIG. 57, according to a fifteenth embodiment, a channel region 145a is formed on a gate electrode 143 included in a TFT with a gate oxide film 144 interposed therebetween. A pair of source/drain regions 145b are formed with channel region 145a interposed therebetween. A thermally oxidized film 146 is formed on channel region 145a. Silicon nitride films 147 are formed on source/drain regions 145b. An interlayer insulating film 148 is formed to cover thermally oxidized film 146 and silicon nitride films 147. A plasma insulating film 149 is formed on interlayer insulating film 148.

The semiconductor device according to the fifteen embodiment has a structure such as a combination of the third embodiment illustrated in FIG. 19 and the tenth embodiment illustrated in FIG. 42. Accordingly, it is possible to reduce the leakage current on the occasion when the TFT is OFF and to reduce the resistance of an interconnection layer connected to source/drain regions 145b more effectively.

Figure 58:
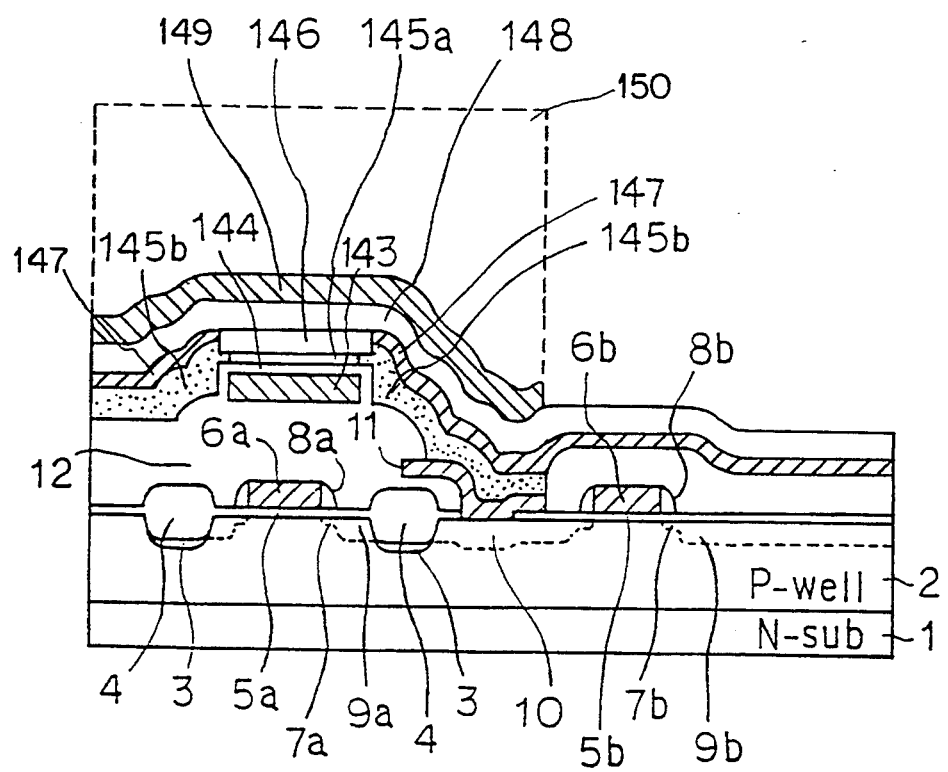
FIG. 58 is a sectional view for describing a manufacturing process of the semiconductor device illustrated in FIG. 57.
Figure 59:
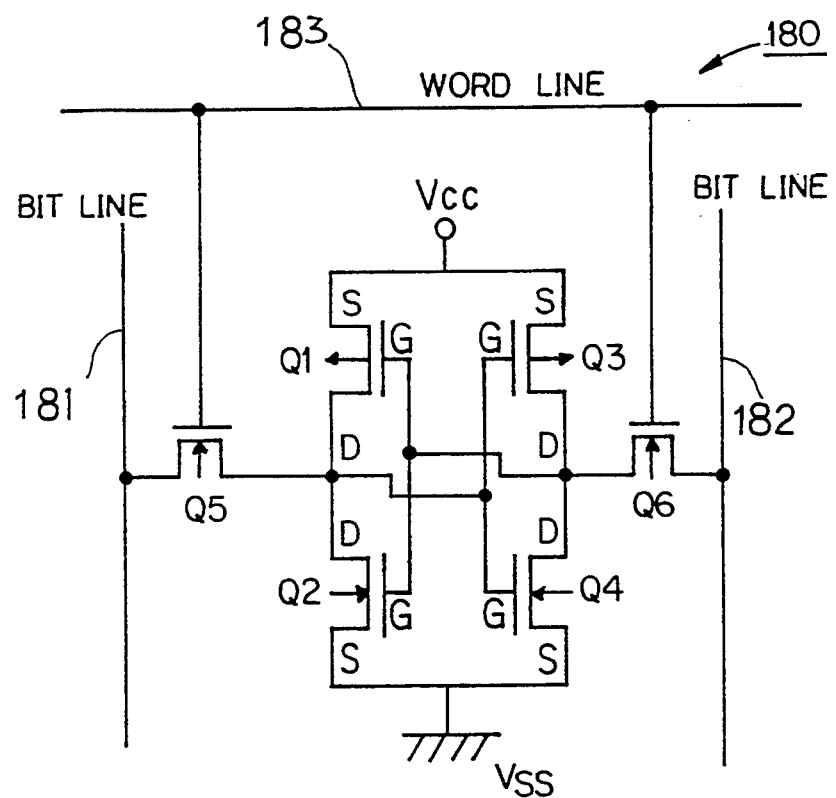
FIG. 59 is a circuit diagram illustrating an example of a memory cell in a conventional SRAM.
Figure 60:
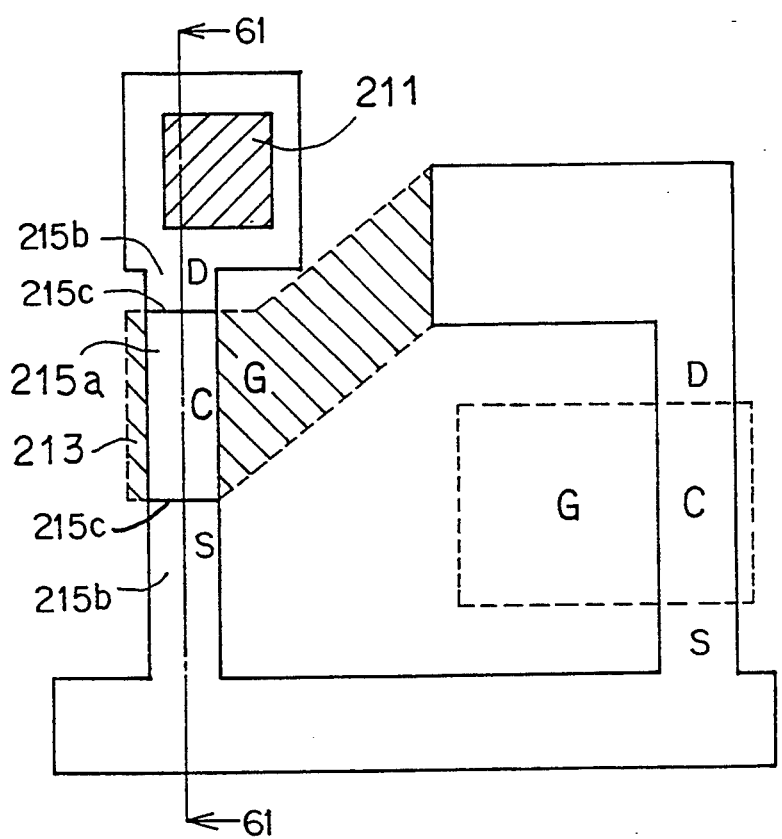
FIG. 60 is a plan view of a conventional semiconductor device (SRAM) having a TFT.

Referring to FIG. 58, in a manufacturing process according to the fifteenth embodiment, the process up to the step of forming a thermally oxidized film 146 using silicon nitride films 147 as a mask is the same as the manufacturing process according to the third embodiment illustrated in FIGS. 20 to 22. Then, an interlayer insulating film 148 is formed on the whole surface. A plasma insulating film (plasma nitride film) 149 is formed on interlayer insulating film 148 by a plasma CVD process. The condition of plasma CVD is the same as the condition described with reference to FIG. 42. A resist 150 is formed in a region on plasma insulating film 149 above a region where a TFT is formed. The plasma insulating film is etched using resist 150 as a mask. This causes plasma insulating film 149 to be formed only above the region where the TFT is formed. The TFT part according to the fifteenth embodiment is thus formed.

As described above, in a thin film transistor according to a feature of the present invention, the length in the channel width direction of the semiconductor layer in the junction parts of a pair of source/drain regions and a channel region is made smaller than the length in the channel width direction of the semiconductor layer in the source/drain regions, so that it is possible to reduce the leakage current in the junction parts of the source/drain regions and the channel region on the occasion when the TFT is OFF as compared to the conventional one. In addition, it is unnecessary to reduce the length in the channel width direction of the semiconductor layer in the source/drain regions, so that it is possible to lower the resistance of an interconnection layer connected to the source/drain regions as compared to the conventional one.

In a thin film transistor according to another concept of the present invention, a semiconductor layer formed of polycrystalline silicon is constituted to include hydrogen introduced from the outside into the vicinity of the grain boundary and combined with silicon in the semiconductor layer, so that dangling bonds in the vicinity of the grain boundary are filled with hydrogen. It is possible to effectively reduce the leakage current generated in the grain boundary by this. In addition, the thin semiconductor layer of polycrystalline silicon comes to have a crystal structure approximate to the semiconductor silicon substrate because of combination of hydrogen and silicon in the vicinity of the grain boundary. As a result, it is possible to increase the current on the occasion where the TFT transistor is ON and to enhance the current driving capability.

In a manufacturing method of a thin film transistor according to a still another feature of the present invention, it is possible to reduce the thickness of a semiconductor layer in a channel region by forming a second insulating film on a semiconductor layer except for a part corresponding to the channel region and thermally oxidizing the surface of the exposed semiconductor layer using the second insulating layer as a mask, so that it is possible to make the thickness of the semiconductor layer in the channel region smaller than the thickness of the semiconductor layer in source/drain regions easily. In addition, ion implantation into the source/drain regions is carried out through the second insulating layer so that it is possible to increase the implantation energy and to reduce the time for the implantation process.

In a manufacturing process of a thin film transistor according to a further feature of the present invention, the thickness of a semiconductor layer to be a channel region is reduced by ion-implanting nitrogen ions into a part of the semiconductor layer corresponding to the channel region and making silicon in the semiconductor layer and the introduced nitrogen ions react with each other by heat treatment to form a silicon nitride film, so that it is possible to make the thickness of the semiconductor layer in the channel region smaller than the thickness of the semiconductor layer in source/drain regions easily.

In a manufacturing method of a thin film transistor according to a still further feature of the present invention, the thickness of a semiconductor layer to be a channel region is reduced by ion-implanting oxygen ions into a part of the semiconductor layer corresponding to the channel region and making silicon in the semiconductor layer and the introduced oxygen ions react to each other by heat treatment to form a silicon oxide film, so that it is possible to make the thickness of the semiconductor layer in the channel region smaller than the thickness of the semiconductor layer in the source/drain regions easily.

In a manufacturing method of a thin film transistor according to a still a further feature of the present invention, a semiconductor layer of polycrystalline silicon constituting a source region, a channel region, and a drain region of a thin film transistor is formed, and hydrogen is introduced from the outside into the vicinity of the grain boundary of the polycrystalline silicon to form combination of silicon and hydrogen, so that dangling bonds in the vicinity of the grain boundary are filled with hydrogen. Accordingly, it is possible to effectively prevent electrons from moving in the grain boundary and to reduce the leakage current of the TFT addition, the semiconductor layer of polycrystalline silicon comes to have a crystal structure approximate to a semiconductor silicon substrate because of combination of silicon and hydrogen in the grain boundary of the semiconductor layer of polycrystalline silicon. As a result, the current is increased on the occasion when the TFT is ON, and it is possible to enhance the current driving capability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a thin film transistor, comprising the steps of:
   forming a gate electrode on a semiconductor substrate with a first insulating layer interposed therebetween;
   forming a gate insulating film on said gate electrode;
   forming a semiconductor layer on said gate insulating film and said first insulating layer;
   forming a second insulating layer on said semiconductor layer except for a part corresponding to a channel region in said semiconductor layer; and
   thermally oxidizing the exposed surface of said semiconductor layer using said second insulating layer as a mask to reduce the thickness of the semiconductor layer in said channel region.

2. The method of manufacturing a thin film transistor according to claim 1, further comprising the steps of:

forming a resist pattern in a predetermined region on said thermally oxidized film; and ion-implanting impurities into parts corresponding to source/drain regions in said semiconductor layer using said resist pattern as a mask.

3. The method of manufacturing a thin film transistor according to claim 1, wherein said step of forming a second insulation layer includes forming a silicon nitride film.

4. A method of manufacturing a thin film transistor, comprising the steps of:

forming a first semiconductor layer extending across a source region, a channel region, and a drain region of a thin film transistor;

forming a second semiconductor layer extending across the source region and drain region of the thin film transistor except for the channel region; and forming a gate electrode opposite the channel region in said first semiconductor layer with a gate insulating film interposed therebetween.

5. A method of manufacturing a thin film transistor, comprising the steps of:

forming a semiconductor layer of polycrystalline silicon constituting a source region, a channel region, and a drain region of a thin film transistor; and introducing hydrogen combining with silicon in the vicinity of the grain boundary of said polycrystalline silicon, including the steps of forming an oxide film insulating layer on said semiconductor layer by a plasma CVD process and introducing hydrogen from the outside into the vicinity of the grain boundary of said polycrystalline silicon to form a combination of silicon and hydrogen.

* * * * *